(12) United States Patent
Li et al.

(10) Patent No.: US 11,978,834 B2
(45) Date of Patent: May 7, 2024

(54) DISPLAY DEVICE AND METHOD FOR MANUFACTURING SAME

(71) Applicant: SAMSUNG DISPLAY CO., LTD., Yongin-si (KR)

(72) Inventors: Xinxing Li, Yongin-si (KR); Bek Hyun Lim, Yongin-si (KR); Veidhes Basrur, Yongin-si (KR); Dae Hyun Kim, Yongin-si (KR); Myeong Hee Kim, Yongin-si (KR); Je Won Yoo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 454 days.

(21) Appl. No.: 17/415,893

(22) PCT Filed: Jun. 20, 2019

(86) PCT No.: PCT/KR2019/007467
§ 371 (c)(1),
(2) Date: Jun. 18, 2021

(87) PCT Pub. No.: WO2020/130249
PCT Pub. Date: Jun. 25, 2020

(65) Prior Publication Data
US 2022/0059739 A1 Feb. 24, 2022

(30) Foreign Application Priority Data
Dec. 20, 2018 (KR) .......................... 10-2018-0166401

(51) Int. Cl.
*H01L 33/54* (2010.01)
*H01L 25/16* (2023.01)
(Continued)

(52) U.S. Cl.
CPC ............ *H01L 33/54* (2013.01); *H01L 25/167* (2013.01); *H01L 33/62* (2013.01); *H01L 24/24* (2013.01);
(Continued)

(58) Field of Classification Search
CPC ... H01L 33/54; H01L 2933/005; H01L 33/44; H01L 27/153–156; H01L 25/167; H01L 2924/12041; H01L 25/0753
See application file for complete search history.

(56) References Cited

U.S. PATENT DOCUMENTS 8,872,214 B2  10/2014  Negishi et al.
9,229,236 B2  1/2016  Hino et al.
(Continued)

FOREIGN PATENT DOCUMENTS

CN  104300068  1/2015
CN  106328673  1/2017
(Continued)

OTHER PUBLICATIONS

International Search Report, with English translation, corresponding to International Application No. PCT/KR2019/007467 dated Oct. 7, 2019.
(Continued)

*Primary Examiner* — Wasiul Haider
(74) *Attorney, Agent, or Firm* — KILE PARK REED & HOUTTEMAN PLLC

(57) ABSTRACT

A display device may include a pixel disposed in a display area. The pixel may include first and second electrodes; a light emitting element disposed between the first and second electrodes; a first insulating pattern disposed on the light emitting element such that first and second ends of the light emitting element are exposed; a second insulating pattern disposed on the first insulating pattern such that ends of the
(Continued)

first insulating pattern are exposed; a third insulating pattern disposed on the second insulating pattern and overlapping ends of the second insulating pattern; a first contact electrode disposed on the first end of the light emitting element, and electrically connecting the first end of the light emitting element to the first electrode; and a second contact electrode disposed on the second end of the light emitting element and electrically connecting the second end to the second electrode.

20 Claims, 32 Drawing Sheets

(51) Int. Cl.
*H01L 33/62* (2010.01)
*H01L 23/00* (2006.01)
(52) U.S. Cl.
CPC .............. *H01L 2224/24147* (2013.01); *H01L 2924/12041* (2013.01); *H01L 2933/005* (2013.01); *H01L 2933/0066* (2013.01)

(56) References Cited

U.S. PATENT DOCUMENTS

| | | | |
|---|---|---|---|
| 9,287,242 B2 | 3/2016 | Shibata et al. | |
| 9,570,425 B2 | 2/2017 | Do | |
| 9,673,364 B2 | 6/2017 | Nakabayashi | |
| 9,773,761 B2 | 9/2017 | Do | |
| 10,020,205 B2 | 7/2018 | You et al. | |
| 10,026,777 B2 | 7/2018 | Kang et al. | |
| 10,210,798 B2 | 2/2019 | Kim et al. | |
| 10,249,603 B2 | 4/2019 | Cho et al. | |
| 10,340,419 B2 | 7/2019 | Kim et al. | |
| 10,461,123 B2 | 10/2019 | Kim et al. | |
| 10,672,946 B2 | 6/2020 | Cho et al. | |
| 10,818,647 B2 | 10/2020 | Kim et al. | |
| 2011/0089850 A1 | 4/2011 | Shibata et al. | |
| 2013/0027623 A1* | 1/2013 | Negishi | H01L 25/0753 438/30 |
| 2013/0062632 A1* | 3/2013 | Lee | H01L 33/62 257/E33.056 |
| 2017/0256521 A1 | 9/2017 | Cok et al. | |
| 2018/0012876 A1 | 1/2018 | Kim et al. | |
| 2020/0091384 A1 | 3/2020 | Nakabayashi | |

FOREIGN PATENT DOCUMENTS

| | | |
|---|---|---|
| CN | 107579094 | 1/2018 |
| CN | 107610602 | 1/2018 |
| JP | 4814394 | 11/2011 |
| JP | 4914929 | 4/2012 |
| KR | 10-2014-0085331 | 7/2014 |
| KR | 10-1436123 | 11/2014 |
| KR | 10-1490758 | 2/2015 |
| KR | 10-2015-0032926 | 3/2015 |
| KR | 10-2018-0007025 | 1/2018 |
| KR | 10-2018-0007376 | 1/2018 |
| KR | 10-2018-0009014 | 1/2018 |
| KR | 10-2018-0071465 | 6/2018 |
| KR | 10-2018-0072909 | 7/2018 |
| KR | 10-1987196 | 6/2019 |
| KR | 10-2020-0013190 | 2/2020 |

OTHER PUBLICATIONS

Written Opinion, with English translation, corresponding to International Application No. PCT/KR2019/007467, dated Oct. 7, 2019.

* cited by examiner

DISPLAY DEVICE AND METHOD FOR MANUFACTURING SAME

CROSS-REFERENCE TO RELATED APPLICATION(S)

This application is a national entry of International Application No. PCT/KR2019/007467, filed on Jun. 20, 2019, which claims under 35 U.S.C. §§ 119(a) and 365(b) priority to and benefits of Korean Patent Application No. 10-2018-0166401, filed on Dec. 20, 2018 in the Korean Intellectual Property Office (KIPO), the entire contents of which are incorporated herein by reference.

BACKGROUND

1. Technical Field

Embodiments of the disclosure relate to a display device and a method of fabricating the same.

2. Description of Related Art

Recently, a technique of manufacturing a subminiature light emitting element using a material having a reliable inorganic crystal structure and manufacturing a light emitting device using the light emitting element has been developed. For example, a technique of fabricating a plurality of subminiature light emitting elements having a small size corresponding to a range from the nanometer scale to the micrometer scale, and forming light sources of various light emitting devices, e.g., pixels of display devices using the subminiature light emitting elements, has been developed.

SUMMARY

Embodiments of the disclosure are directed to a display device including a light emitting element and a method of fabricating the same.

A display device in accordance with an embodiment of the disclosure may include a pixel disposed in a display area. The pixel may include a first electrode and a second electrode spaced apart from each other; a light emitting element disposed between the first electrode and the second electrode; a first insulating pattern disposed on the light emitting element such that a first end and a second end of the light emitting element are exposed; a second insulating pattern having a width less than a width of the first insulating pattern, and disposed on the first insulating pattern such that ends of the first insulating pattern are exposed; a third insulating pattern having a width greater than the width of the second insulating pattern, disposed on the second insulating pattern, and overlapping ends of the second insulating pattern in a plan view; a first contact electrode disposed on the first end of the light emitting element, and electrically connecting the first end of the light emitting element to the first electrode; and a second contact electrode disposed on the second end of the light emitting element, and electrically connecting the second end of the light emitting element to the second electrode.

In an embodiment, the pixel may include a first conductive pattern disposed on the third insulating pattern and separated from the first and the second contact electrodes.

In an embodiment, the first conductive pattern may include a material identical to a material included in the first and the second contact electrodes.

In an embodiment, the first and the second contact electrodes may include ends, respectively, that are respectively disposed on different ends of the first insulating pattern, the second insulating pattern may be disposed between the first ends of the first and the second contact electrodes, and the ends of the first and the second contact electrodes have thicknesses that gradually increase toward the first and the second electrodes, respectively, on the first insulating pattern.

In an embodiment, the first contact electrode may be disposed on the first end of the light emitting element and at least a portion of the first electrode. The second contact electrode may be disposed on the second end of the light emitting element and at least a portion of the second electrode. The first and the second contact electrodes may be disposed on a same layer.

In an embodiment, each of the first and the third insulating patterns may include at least one inorganic insulating layer. The second insulating pattern may include at least one organic insulating layer.

In an embodiment, the second insulating pattern may have a thickness greater than a thickness of each of the first and the third insulating patterns.

In an embodiment, in a plan view, the ends of the second insulating pattern may be respectively spaced apart from the ends of the first insulating pattern by a distance greater than two times a thickness of the first contact electrode or a thickness of the second contact electrode.

In an embodiment, the light emitting element may have a length greater than a width of each of the first to the third insulating patterns, the light emitting element may be horizontally disposed between the first and the second electrodes, and the first and the second ends of the light emitting element may be respectively disposed on ends of the light emitting element in a longitudinal direction of the light emitting element.

In an embodiment, the pixel may include a second conductive pattern disposed between the light emitting element and the first insulating pattern. In a plan view, the second conductive pattern may have a width less than a width of the first insulating pattern, be disposed inside the first insulating pattern, and is separated from the first and the second contact electrodes.

In an embodiment, the second conductive pattern may include a conductive material which is removed by a wet etching process.

In an embodiment, the second conductive pattern may include a transparent conductive material.

A display device in accordance with an embodiment of the disclosure may include a pixel disposed in a display area. The pixel may include: a first electrode and a second electrode spaced apart from each other; a light emitting element disposed between the first electrode and the second electrode; a first insulating pattern disposed on the light emitting element such that a first end and a second end of the light emitting element are exposed; a first contact electrode disposed on the first end of the light emitting element, and electrically connecting the first end of the light emitting element to the first electrode; and a second contact electrode disposed on the second end of the light emitting element, and electrically connecting the second end of the light emitting element to the second electrode. The first and the second contact electrodes may include ends, respectively, that are respectively disposed on different ends of the first insulating pattern and spaced apart from each other, and the ends of the first and the second contact electrodes have thicknesses that gradually increase toward the first and the second electrodes, respectively, on the first insulating pattern.

In an embodiment, the first and the second contact electrodes may be disposed on a same layer and face each other, and the light emitting element may be disposed between the first and the second contact electrodes.

In an embodiment, the pixel may include a conductive pattern disposed between the light emitting element and the first insulating pattern. In a plan view, the conductive pattern may have a width less than a width of the first insulating pattern, be disposed inside the first insulating pattern, and be separated from the first and the second contact electrodes.

In an embodiment, the conductive pattern may include a conductive material which is removed by a wet etching process.

In an embodiment, the conductive pattern may include a transparent conductive material.

A method of fabricating a display device in accordance with an embodiment of the disclosure may include forming first and second electrodes spaced apart from each other on a base layer; supplying a light emitting element onto the base layer; aligning the light emitting element between the first and the second electrodes; forming a plurality of insulating material layers on the base layer on which the first and the second electrodes and the light emitting element are disposed; forming a third insulating pattern on the plurality of insulating material layers such that the third insulating pattern overlaps the light emitting element other than first and second ends of the light emitting element; forming first and second insulating patterns between the light emitting element and the third insulating pattern by etching the plurality of insulating material layers using the third insulating pattern as a mask; etching a portion of the second insulating pattern such that the second insulating pattern has a width less than a width of each of the first and third insulating patterns; and forming a first contact electrode and a second contact electrode by applying conductive material onto the base layer on which the first and the second electrodes, the light emitting element, and the first to the third insulating patterns are disposed, the first and second contact electrodes electrically connecting the first and the second ends of the light emitting element to the first and the second electrodes, respectively.

In an embodiment, the method may further include before the forming of the plurality of insulating material layers, forming a conductive material layer on the base layer on which the first and the second electrodes and the light emitting element are disposed; and after the forming of the first to the third insulating patterns, forming a conductive pattern having a width less than a width of the first insulating pattern by wet-etching the conductive material layer using the first to the third insulating patterns as a mask.

In an embodiment, the method may further include after the forming of the first and the second contact electrodes, removing the second and the third insulating patterns.

In a display device and a method of fabricating the display device in accordance with embodiments of the disclosure, each light emitting element may be reliably connected between first and second electrodes through first and second contact electrodes, and the number of mask processes to be used to fabricate the display device may be reduced.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
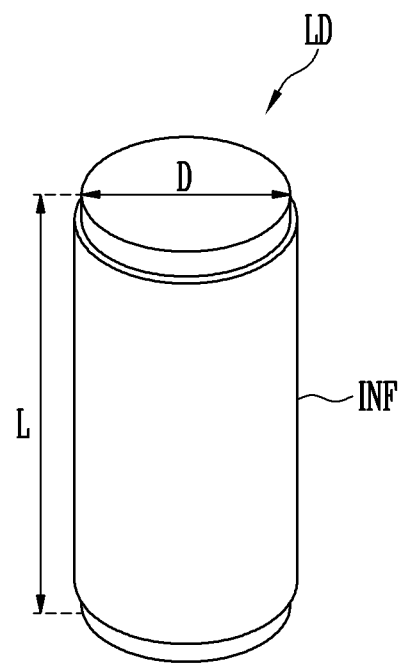
FIGS. 1A and 1B are respectively a perspective view and a cross-sectional view schematically illustrating a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to denote the same or similar elements throughout the drawings, and repetitive explanation will be omitted.

It will be understood that, although the terms "first," "second," or the like may be used herein to describe various elements, these elements should not be limited by these terms. It will be further understood that the terms "comprise," "include," "have," or the like, when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the term "position," "direction," or the like used in the following description are defined in relative terms, and it should be noted that they may be changed to a reverse position or direction depending on a view angle or direction.

Embodiments and required details of the disclosure are described with reference to the accompanying drawings in order to describe the disclosure in detail so that those having ordinary knowledge in the technical field to which the disclosure pertains can easily practice the disclosure. Furthermore, a singular form may include a plural form as long as it is not specifically mentioned in a sentence.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIGS. 1A, 1B, 2A, 2B, 3A, and 3B are perspective views and cross-sectional views schematically illustrating light emitting elements LD in accordance with embodiments. Although FIGS. 1A to 3B illustrate cylindrical rod-type light emitting elements LD, the type and/or shape of the light emitting elements LD in accordance with the disclosure is not limited thereto.

Figure 1B:
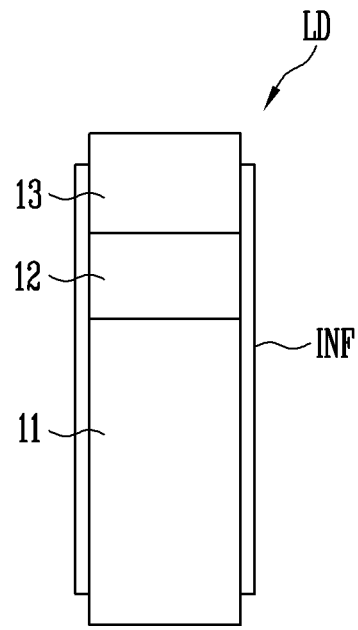

Referring to FIGS. 1A and 1B, a light emitting element (or light emitting diode) LD in accordance with an embodiment may include a first conductivity type semiconductor layer 11, a second conductivity type semiconductor layer 13, and an active layer 12 interposed between the first and second conductivity type semiconductor layers 11 and 13. For example, the light emitting element LD may be configured of (or formed of) a stacked body formed by successively stacking the first conductivity type semiconductor layer 11, the active layer 12, and the second conductivity type semiconductor layer 13.

In an embodiment, the light emitting element LD may be provided in the form of a rod extending in a direction. If the direction in which the light emitting element LD extends is defined as a longitudinal direction, the light emitting element LD may have a first end and a second end in the longitudinal direction.

In an embodiment, one of the first and second conductivity type semiconductor layers 11 and 13 may be disposed on the first end of the light emitting element LD. The other of the first and second conductivity type semiconductor layers 11 and 13 may be disposed on the second end of the light emitting element LD.

In an embodiment, the light emitting element LD may be a rod-type light emitting diode manufactured in the form of a rod. In this specification, the term "rod-type" embraces a rod-like shape and a bar-like shape such as a cylindrical shape and a prismatic shape extending in a longitudinal direction (for example, having an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size in a range of a nanometer to micrometer scale. For example, each light emitting element LD may have a diameter D and/or a length L in a range of a nanometer to micrometer scale. However, in the disclosure, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductivity type semiconductor layer 11 may include, for example, at least one n-type semiconductor layer. For instance, the first conductivity type semiconductor layer 11 may include an n-type semiconductor layer which includes a semiconductor material of InAlGaN, GaN, AlGaN, InGaN, AlN, and InN and is doped with a first conductive dopant such as Si, Ge, or Sn. However, the material for forming the first conductivity type semiconductor layer 11 is not limited to this, and the first conductivity type semiconductor layer 11 may be formed of (or include) various other materials.

The active layer 12 may be disposed on the first conductivity type semiconductor layer 11 and have a single or multiple quantum well structure. In an embodiment, a cladding layer (not shown) doped with a conductive dopant may be formed over and/or under the active layer 12. For example, the cladding layer may be formed of (or include) an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied to each of the ends of the light emitting element LD, the light emitting element LD may emit light by recombination of electron-hole pairs in the active layer 12. Since light emission of the light emitting element LD may be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes a semiconductor material of InAlGaN, GaN, AlGaN, InGaN, AlN, and InN and is doped with a second conductive dopant such as Mg. However, the material for forming the second conductivity type semiconductor layer 13 is not limited to this, and the second conductivity type semiconductor layer 13 may be formed of various other materials.

In an embodiment, the light emitting element LD may further include an insulating film INF provided on the surface of the light emitting element LD. The insulating film INF may be formed on the surface of the light emitting element LD to at least enclose an outer circumferential surface of the active layer 12 and may further enclose an area of each of the first and second conductivity type semiconductor layers 11 and 13. Here, the insulating film INF may expose ends of the light emitting element LD that have different polarities to the outside. For example, the insulating film INF may expose an end of each of the first and second conductivity type semiconductor layers 11 and 13 that are disposed on the respective ends of the light emitting element LD in the longitudinal direction, and, e.g., may expose two base sides of the cylinder (the top and bottom surfaces of the light emitting element LD in FIGS. 1A and 1B) rather than covering the two base sides.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but the disclosure is not limited thereto. In other words, the material that forms the insulating film INF is not limited to a particular material, and the insulating film INF may be formed of various insulating materials.

In an embodiment, the light emitting element LD may further include additional components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on an end of the first conductivity type semiconductor layer 11, the active layer 12, and/or the second conductivity type semiconductor layer 13.

Figure 2A:
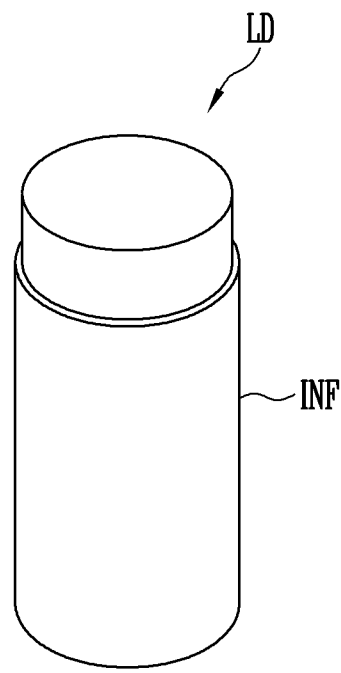
FIGS. 2A and 2B are respectively a perspective view and a cross-sectional view schematically illustrating a light emitting element in accordance with an embodiment of the disclosure.
Figure 2B:
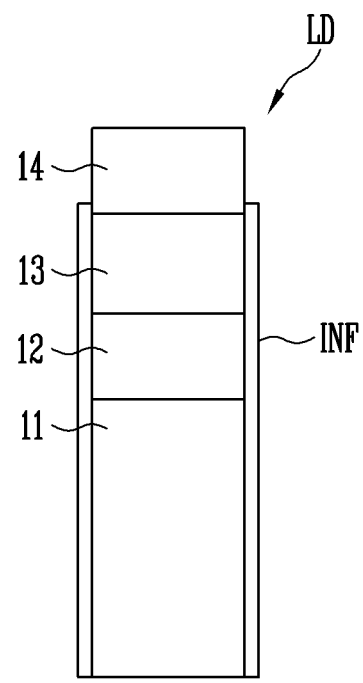
Figure 3A:
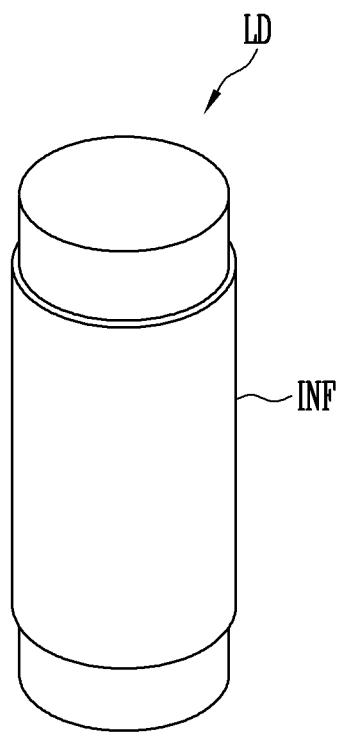
FIGS. 3A and 3B are respectively a perspective view and a cross-sectional view schematically illustrating a light emitting element in accordance with an embodiment of the disclosure.
Figure 3B:
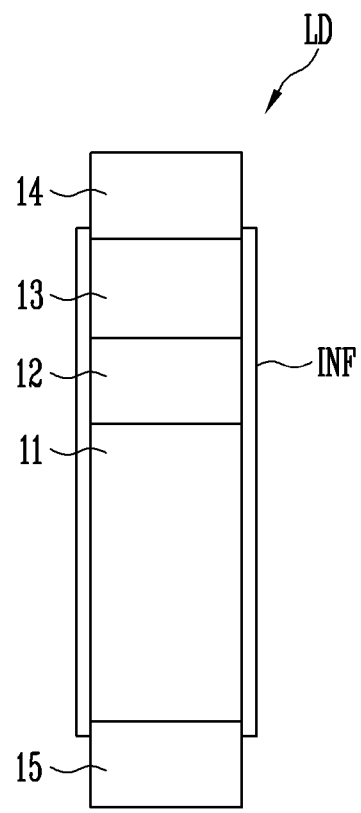

For example, as illustrated in FIGS. 2A and 2B, the light emitting element LD may further include at least one electrode layer 14 disposed on an end of the second conductivity type semiconductor layer 13. In an embodiment, as illustrated in FIGS. 3A and 3B, the light emitting element LD may further include at least one electrode layer 15 disposed on an end of the first conductivity type semiconductor layer 11.

Each of the electrode layers 14 and 15 may be an ohmic contact electrode, but the disclosure is not limited thereto. Each of the electrode layers 14 and 15 may include metal or metal oxide. For example, each of the electrode layers 14 and 15 may be formed of one or more transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Therefore, light generated from the light emitting element LD may be emitted to the outside after passing through the electrode layers 14 and 15.

In an embodiment, the insulating film INF may at least partially enclose the outer surfaces of the electrode layers 14 and 15 or may not enclose them. In other words, the insulating film INF may be selectively formed on the surfaces of the electrode layers 14 and 15. Furthermore, the insulating film INF may be formed to expose the ends of the light emitting element LD that have different polarities, and for example, may expose at least an area of each of the electrode layers 14 and 15. As another example, in an embodiment, the insulating film INF may not be provided.

If the insulating film INF is provided on the surface of the light emitting element LD, particularly, on the surface of the active layer 12, the active layer 12 may be prevented from short-circuiting with at least one electrode which is not shown (e.g., at least one contact electrode electrically connected to the ends of the light emitting element LD), or the like. Therefore, the electrical stability of the light emitting element LD may be secured.

Furthermore, thanks to the insulating film INF formed on the surface of the light emitting element LD, occurrence of a defect in the surface of the light emitting element LD may be reduced or minimized, and thus the lifetime and efficiency of the light emitting element LD may be improved. If the insulating film INF is formed on each light emitting element LD, in case that light emitting elements LD are disposed adjacent to each other, the light emitting elements LD may be prevented from undesirably short-circuiting with each other.

In an embodiment, a surface treatment process may be performed to fabricate the light emitting element LD. For example, each light emitting element LD may be surface-treated so that, in case that light emitting elements LD are mixed with a fluidic solution (or solvent) and then supplied to each emission area (or light emission area) (e.g., an emission area of each pixel), the light emitting elements LD may be evenly dispersed in the fluidic solution rather than unevenly aggregating therein.

In a non-limiting embodiment pertaining to this, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, or the like. Furthermore, the hydrophobic material may be a commercially available fluorine containing material such as Teflon® or Cytop®, or a material corresponding thereto.

A light emitting device including the light emitting element LD described above may be used not only in a display device but also in various devices which include a light source. For instance, at least one subminiature light emitting element LD, e.g., subminiature light emitting elements LD each having a size in a range of a nanometer to micrometer scale, may be disposed in each pixel area of the display panel, to form a light source (or a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 4:
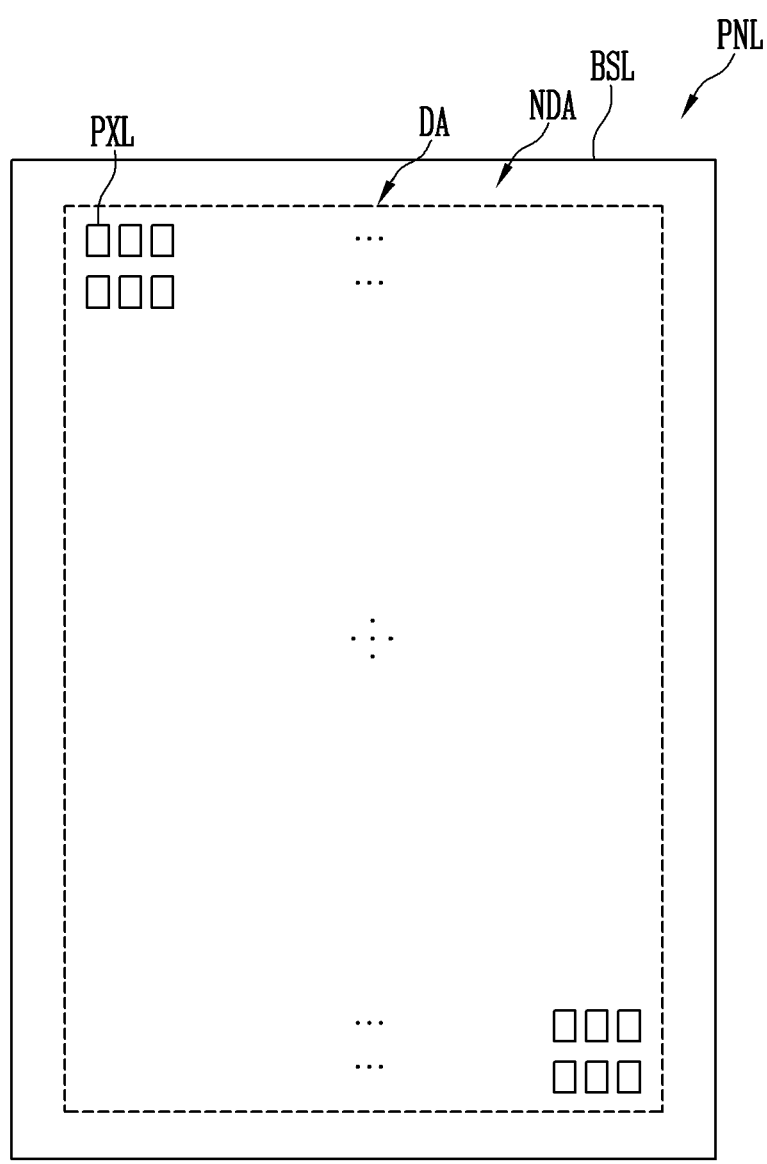
FIG. 4 is a plan view schematically illustrating a display device in accordance with an embodiment of the disclosure.

FIG. 4 is a schematic plan view illustrating a display device in accordance with an embodiment. In an embodiment, FIG. 4 illustrates a display device, particularly, a display panel PNL provided in the display device, as an example of a device which may use, as a light source, the light emitting element LD described with reference to FIGS. 1A to 3B. For example, each of the pixels PXL of the display panel PNL may have at least one light emitting element LD.

For the sake of explanation, FIG. 4 simply illustrates the structure of the display panel PNL in accordance with an embodiment, focusing on a display area DA. In some embodiments, although not illustrated, at least one driving circuit (e.g., at least one of a scan driver and a data driver) and/or lines may be further provided in the display panel PNL.

Referring to FIG. 4, the display panel PNL in accordance with an embodiment may include a base layer BSL, and pixels PXL disposed on the base layer BSL. In detail, the display panel PNL and the base layer BSL for forming the display panel PNL may include a display area DA for displaying an image and a non-display area NDA formed in a predetermined area other than the display area DA. The pixels PXL may be disposed in the display area DA of the base layer BSL.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited to this, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

An area of the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed around the display area DA. Various lines and/or internal circuits which are electrically connected to the pixels PXL of the display area DA may be disposed in the non-display area NDA.

In an embodiment, the pixels PXL may be distributed and arranged in the display area DA. In an embodiment, the pixels PXL may be arranged in the display area DA in a stripe or PenTile® arrangement. However, the disclosure is not limited thereto. For example, the pixels PXL may be arranged in the display area DA in various arrangements.

Each pixel PXL may include at least one light source, which is driven by a control signal (e.g., a scan signal and a data signal) and/or a power voltage (e.g., first and second power voltages), for example, a light emitting element LD according to one of the embodiments of FIGS. 1A to 3B. For example, each pixel PXL may include at least one subminiature light emitting element LD having a small size in a range of a nanometer to micrometer scale. For example, each pixel PXL may include subminiature light emitting elements LD which are electrically connected in parallel to each other between pixel electrodes and/or power lines and form a light source or a light source part of the corresponding pixel PXL, and each of which has a rod-like shape.

In an embodiment, each pixel PXL may be formed of an active pixel. However, the types, structures, and/or driving methods of the pixels PXL applicable to the display device according to the disclosure are not particularly limited. For example, each pixel PXL may have the same structure as that of a pixel for passive or active light emitting display devices which have various structures and/or may be operated by various driving methods.

Figure 5A:
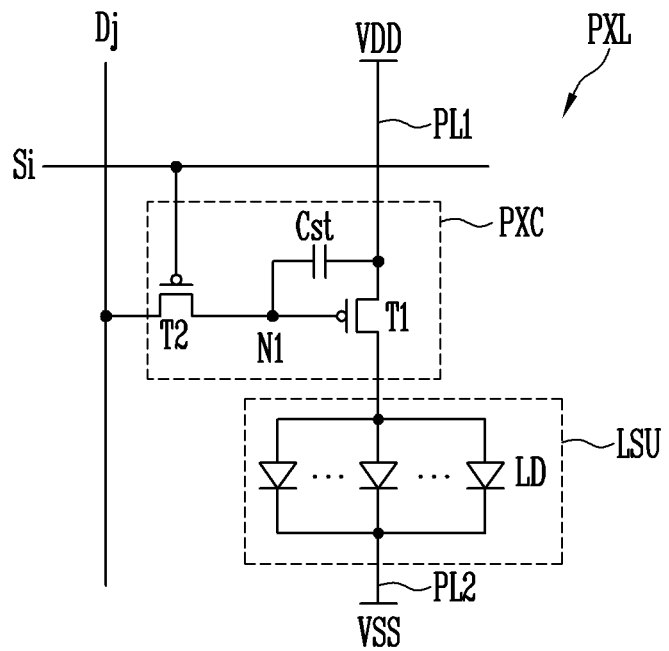
FIGS. 5A to 5C are circuit diagrams each schematically illustrating a pixel in accordance with an embodiment of the disclosure.
Figure 5B:
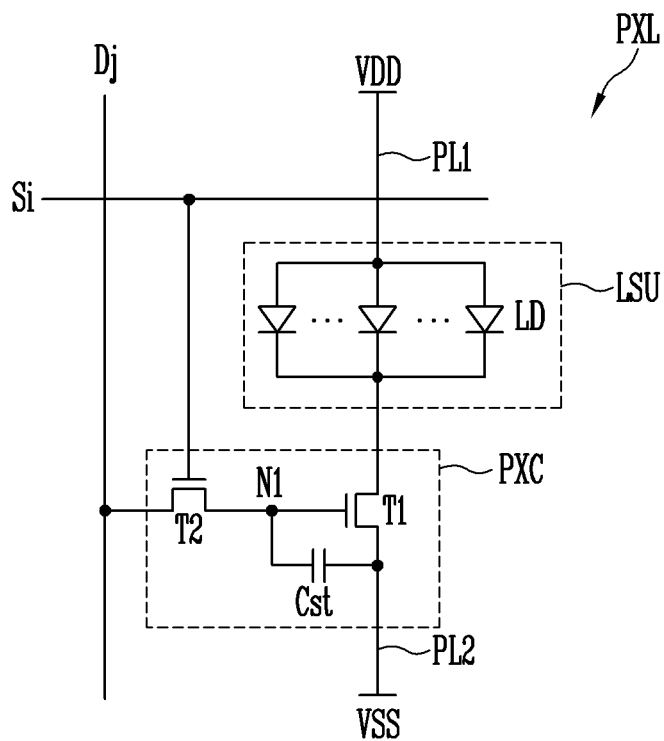
Figure 5C:
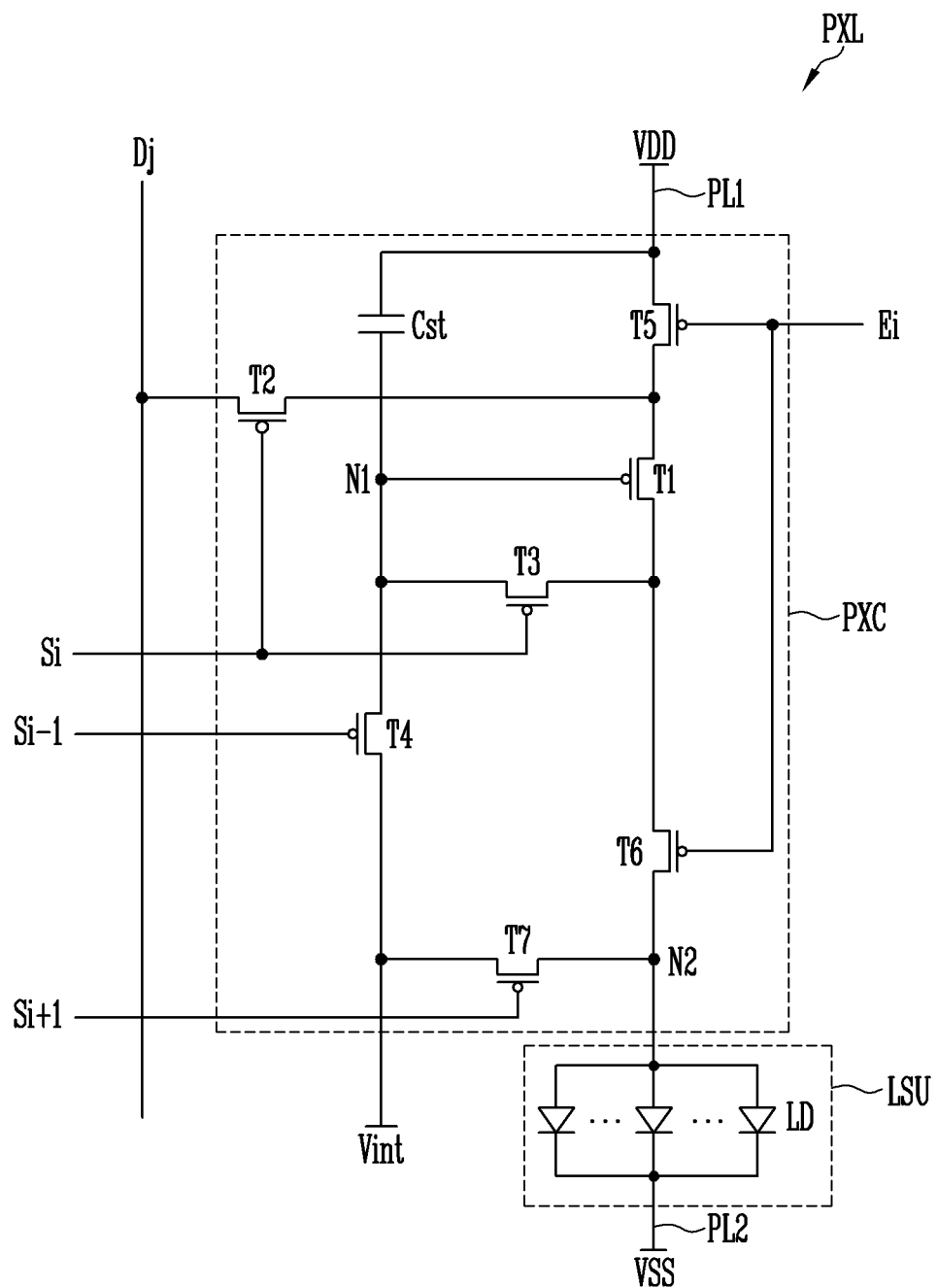

FIGS. 5A to 5C are circuit diagrams each schematically illustrating a pixel PXL in accordance with an embodiment. For example, FIGS. 5A to 5C illustrate different embodiments of the pixel PXL which may be applied to an active display device. However, the types of pixels PXL and display devices to which embodiments may be applied are not limited thereto. In an embodiment, each pixel PXL illustrated in FIGS. 5A to 5C may be one of the pixels PXL provided on the display panel PNL of FIG. 4. The pixels PXL may have substantially the same or similar structure.

Referring to FIG. 5A, the pixel PXL in accordance with an embodiment may include a light source unit LSU configured to generate light having a luminance corresponding to a data signal. The pixel PXL may further include a pixel circuit PXC configured to drive the light source unit LSU.

In an embodiment, the light source unit LSU may include light emitting elements LD that are electrically connected to each other between a first power supply VDD and a second power supply VSS. In an embodiment, the light emitting elements LD may be electrically connected in parallel to each other, but the disclosure is not limited thereto. For example, in an embodiment, light emitting elements LD may be electrically connected in a serial/parallel structure between the first power supply VDD and the second power supply VSS.

In an embodiment, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage or more of the light emitting elements LD during at least an emission period of the pixel PXL.

Although FIG. 5A illustrates an embodiment in which the light emitting elements LD forming the light source unit LSU of each pixel PXL are electrically connected in parallel to each other in the same direction (e.g., in a forward direction) between the first power supply VDD and the second power supply VSS, the disclosure is not limited to this. For example, in an embodiment, some of the light emitting elements LD may be electrically connected to each other in a first direction (e.g., the forward direction) between the first and second power supplies VDD and VSS, and other light emitting elements LD may be electrically connected to each other in a second direction (e.g., a reverse direction). As another example, in an embodiment, at least one pixel PXL may include only a single light emitting element LD (e.g., a single valid light emitting element electrically connected in the forward direction between the first and second power supplies VDD and VSS).

In an embodiment, first ends of the light emitting elements LD forming each light source unit LSU may be electrically connected in common to the pixel circuit PXC through an electrode of the light source unit LSU (e.g., a first electrode (also referred to as "first alignment electrode" or "first pixel electrode") and/or a first contact electrode of each pixel PXL) and may be electrically connected to the first power supply VDD through the pixel circuit PXC and a first power line PL1. Second ends of the light emitting elements LD may be electrically connected in common to the second power supply VSS through another electrode of the light source unit LSU (e.g., a second electrode (also referred to as "second alignment electrode" or "second pixel electrode") and/or a second contact electrode of each pixel PXL) and a second power line PL2.

Each light source unit LSU may emit light having a luminance corresponding to a driving current supplied thereto through the corresponding pixel circuit PXC. Therefore, an image may be displayed in the display area DA.

The pixel circuit PXC may be electrically connected to a scan line Si and a data line Dj of the corresponding pixel PXL. For example, if the pixel PXL is disposed on an i-th row (where i is a natural number) and a j-th column (where j is a natural number) of the display area DA, the pixel circuit PXC of the pixel PXL may be electrically connected to an i-th scan line Si and a j-th data line Dj of the display area DA. In an embodiment, the pixel circuit PXC may include first and second transistors T1 and T2 and a storage capacitor Cst.

The first transistor T1 (also referred to as "driving transistor") may be electrically connected between the first power supply VDD and the light source unit LSU. A gate electrode of the first transistor T1 may be electrically connected to a first node N1. The first transistor T1 may control driving current to be supplied to the light source unit LSU in response to the voltage of the first node N1.

The second transistor T2 (also referred to as "switching transistor") may be electrically connected between the data line Dj and the first node N1. A gate electrode of the second transistor T2 may be electrically connected to the scan line Si. In case that a scan signal having a gate-on voltage (e.g., a low-level voltage) is supplied to the second transistor T2 from the scan line Si, the second transistor T2 may be turned on to electrically connect the first node N1 to the data line Dj.

During each frame period, a data signal of a corresponding frame may be supplied to the data line Dj. The data signal may be transmitted to the first node N1 via the second transistor T2. Therefore, the storage capacitor Cst may be charged with a voltage corresponding to the data signal.

An electrode of the storage capacitor Cst may be electrically connected to the first power supply VDD, and another electrode thereof may be electrically connected to the first node N1. The storage capacitor Cst may be charged with a voltage corresponding to a data signal to be supplied to the first node N1 during each frame period.

Although FIG. 5A illustrates that the transistors, e.g., the first and second transistors T1 and T2, included in the pixel circuit PXC are P-type transistors, the disclosure is not limited to this. In other words, at least one of the first and second transistors T1 and T2 may be changed to an N-type transistor.

For example, as shown in FIG. 5B, both the first and second transistors T1 and T2 may be N-type transistors. The gate-on voltage of the scan signal for writing the data signal supplied to the data line Dj in each frame period to the pixel PXL may be a high-level voltage. Likewise, the voltage of the data signal for turning on the first transistor T1 may be a voltage having a level opposite to that of the embodiment of FIG. 5A. For example, in the embodiment of FIG. 5B, as a gray scale value to be expressed (or displayed) increases, a data signal having a higher voltage may be supplied.

The pixel PXL shown in FIG. 5B may be substantially similar in configuration and operation to the pixel PXL of FIG. 5A, except that the connection positions of some circuit elements and the voltage levels of control signals (e.g., a scan signal and a data signal) are changed depending on a change in type of the transistor. Therefore, detailed descriptions of the pixel PXL of FIG. 5B will be omitted.

The structure of the pixel circuit PXC is not limited to the embodiments shown in FIGS. 5A and 5B. In other words, the pixel circuit PXC may be formed of a pixel circuit which may have various structures and/or be operated by various driving methods. For example, the pixel circuit PXC may be configured in the same manner as that of an embodiment illustrated in FIG. 5C.

Referring to FIG. 5C, the pixel circuit PXC may be electrically connected not only to a scan line Si of a corresponding horizontal line but also to at least one another scan line (or a control line). For example, the pixel circuit PXC of the pixel PXL disposed on the i-th row of the display area DA may be further electrically connected to an i−1-th scan line Si−1 and/or an i+1-th scan line Si+1. In an embodiment, the pixel circuit PXC may be electrically connected not only to the first and second power supplies VDD and VSS but also to a third power supply. For instance, the pixel circuit PXC may be electrically connected to an initialization power supply Vint. In an embodiment, the pixel circuit PXC may include first to seventh transistors T1 to T7 and a storage capacitor Cst.

The first transistor T1 may be electrically connected between the first power supply VDD and the light source unit LSU. For example, a first electrode (e.g., a source electrode) of the first transistor T1 may be electrically connected to the first power supply VDD through the fifth transistor T5 and the first power line PL1, and a second electrode (e.g., a drain electrode) of the first transistor T1 may be electrically connected via the sixth transistor T6 to the first electrode of the light source unit LSU (e.g., the first contact electrode and/or the first alignment electrode of the corresponding pixel PXL). A gate electrode of the first transistor T1 may be electrically connected to a first node N1. The first transistor T1 may control driving current to be supplied to the light source unit LSU in response to the voltage of the first node N1.

The second transistor T2 may be electrically connected between the data line Dj and the first electrode of the first transistor T1. A gate electrode of the second transistor T2 may be electrically connected to the corresponding scan line Si. In case that a scan signal having a gate-on voltage is supplied from the scan line Si to the second transistor T2, the second transistor T2 may be turned on to electrically connect the data line Dj to the first electrode of the first transistor T1. Therefore, if the second transistor T2 is turned on, a data signal supplied from the data line Dj may be transmitted to the first transistor T1.

The third transistor T3 may be electrically connected between another electrode of the first transistor T1 and the first node N1. A gate electrode of the third transistor T3 may be electrically connected to the corresponding scan line Si. In case that a scan signal having a gate-on voltage is supplied to the third transistor T3 from the scan line Si, the third transistor T3 may be turned on to electrically connect the first transistor T1 in the form of a diode.

The fourth transistor T4 may be electrically connected between the first node N1 and an initialization power supply Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. In an embodiment, in case that the first transistor T1 is a P-type transistor, the voltage of the initialization power supply Vint for initializing the gate voltage of the first transistor T1 may be the lowest voltage or less of the data signal.

The fifth transistor T5 may be electrically connected between the first power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage (e.g., a high-level voltage) is supplied to the emission control line Ei and may be turned on in other cases.

The sixth transistor T6 may be electrically connected between the first transistor T1 and the light source unit LSU. A gate electrode of the sixth transistor T6 may be electrically connected to a corresponding emission control line, e.g., the i-th emission control line Ei. The sixth transistor T6 may be turned off in case that an emission control signal having a gate-off voltage is supplied to the emission control line Ei and may be turned on in other cases.

The seventh transistor T7 may be electrically connected between a second node N2, to which the first electrode of the light source unit LSU (e.g., the first electrode and/or the first contact electrode of the corresponding pixel PXL) is connected, and the initialization power supply Vint. A gate electrode of the seventh transistor T7 may be electrically connected to one of scan lines of a subsequent stage, e.g., to the i+1-th scan line Si+1. In case that a scan signal having a gate-on voltage is supplied to the i+1-th scan line Si+1, the seventh transistor T7 may be turned on to supply the voltage of the initialization power supply Vint to the first electrode of the light source unit LSU. Therefore, during each initialization period in which the voltage of the initialization power supply Vint is transmitted to the light source unit LSU, the voltage of the first electrode of the light source unit LSU may be initialized. The control signal for controlling the operation of the seventh transistor T7 may be changed in various ways. For example, in an embodiment, the gate electrode of the seventh transistor T7 may be electrically connected to a scan line of a corresponding horizontal line, for example, an i-th scan line Si. In case that a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be electrically connected between the first power supply VDD and the first node N1. The storage capacitor Cst may store a voltage corresponding to the data signal applied to the first node N1 during each frame period and/or to the threshold voltage of the first transistor T1.

Although FIG. 5C illustrates that the transistors, e.g., the first to seventh transistors T1 to T7, included in the pixel circuit PXC are P-type transistors, the disclosure is not limited thereto. For example, at least one of the first to seventh transistors T1 to T7 may be changed to an N-type transistor.

The structure of the pixel PXL which may be applied to the disclosure is not limited to the embodiments illustrated in FIGS. 5A to 5C, and each pixel PXL may have various structures. For example, the pixel circuit PXC included in each pixel PXL may be formed of a pixel circuit which may have various structures and/or be operated by various driving methods. In an embodiment, each pixel PXL may be configured in a passive light emitting display device, or the like. The pixel circuit PXC may be omitted, and the ends of the light emitting elements LD that form the light source unit LSU may be directly connected to the scan line Si, the data line Dj, a power line, and/or the control line.

FIGS. 6 to 9 are plan views each schematically illustrating a pixel PXL in accordance with an embodiment. In an embodiment, each pixel PXL illustrated in FIGS. 6 to 9 may be one of the pixels PXL illustrated in FIGS. 4 to 5C. The pixels PXL disposed in the display area DA may have a substantially identical or similar structure, but the disclosure is not limited thereto.

FIGS. 6 to 9 illustrate the structure of each pixel PXL, focusing on the light source unit LSU. Here, the pixel PXL may further include a circuit element (e.g., at least one circuit element that forms the pixel circuit PXC of FIGS. 5A to 5C) for controlling each light source unit LSU. In an embodiment, the circuit element may be disposed on a layer different from that of the light source unit LSU. For example, the circuit element may be disposed on a pixel circuit layer located on a surface of the base layer BSL, and the light source unit LSU may be disposed on a display element layer disposed on the pixel circuit layer.

Furthermore, in an embodiment, FIGS. 6 to 9 illustrate an embodiment in which each light source unit LSU is electrically connected, through first and second contact holes CH1 and CH2, to a power line (e.g., first and/or second power lines PL1 and/or PL2), a circuit element (e.g., at least one circuit element that forms the pixel circuit PXC), and/or a signal line (e.g., a scan line Si and/or a data line Dj), but the disclosure is not limited thereto. For example, in an embodiment, at least one of first and second electrodes ELT1 and ELT2 of each pixel PXL may be directly connected to a power line and/or a signal line without using a contact hole and/or an intermediate line.

Figure 6:
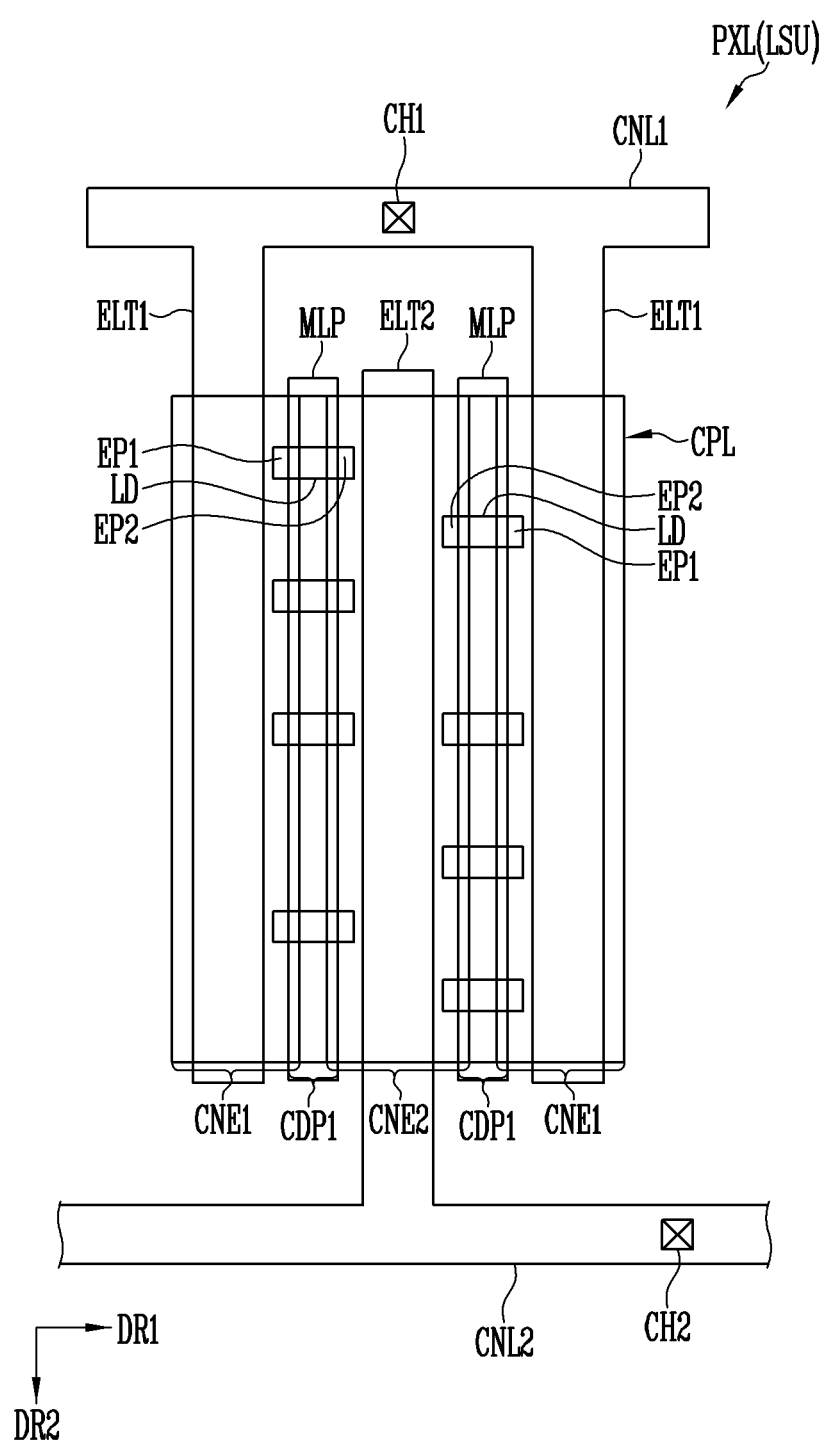
FIGS. 6 to 9 are plan views each schematically illustrating a pixel in accordance with an embodiment of the disclosure.
Figure 7:
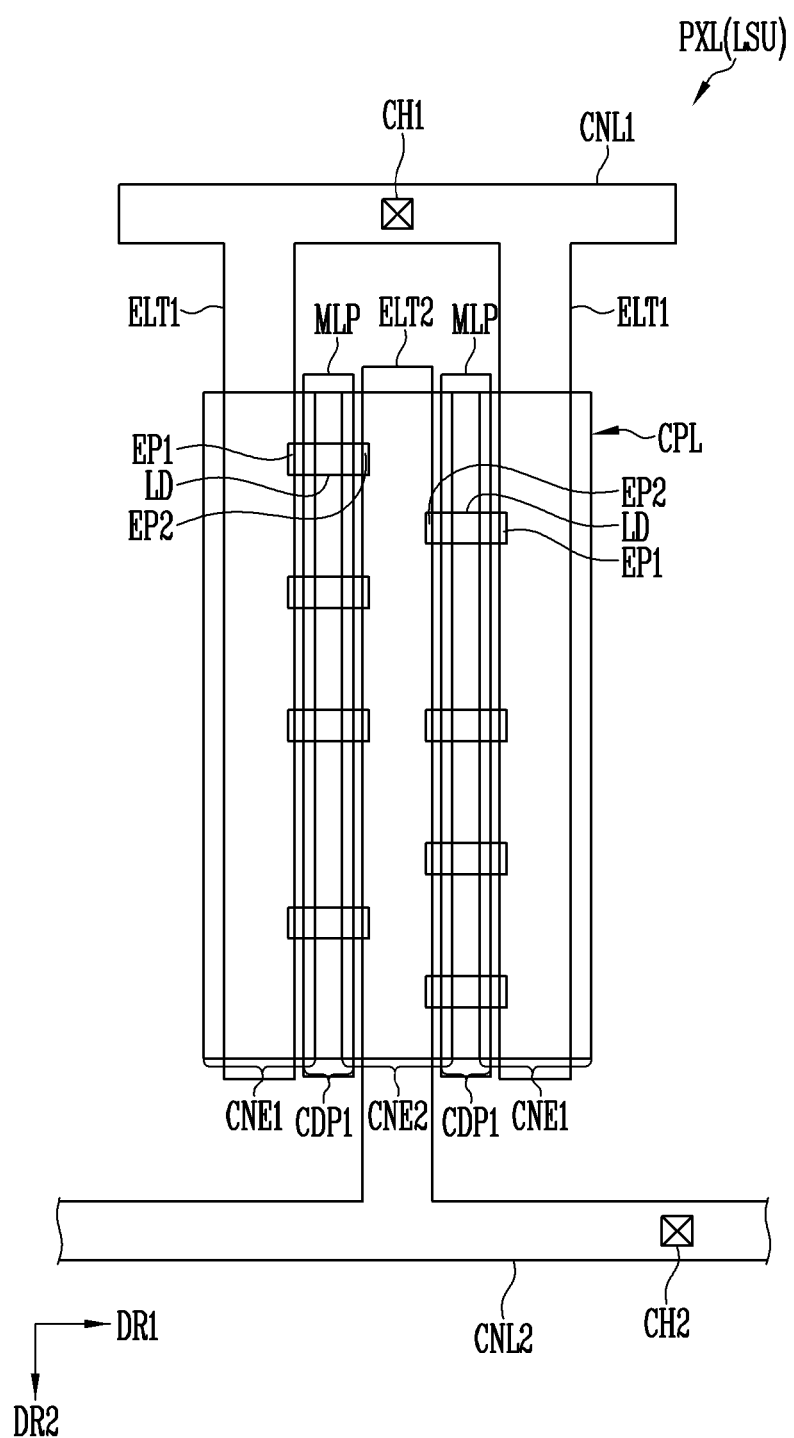

Referring to FIGS. 6 and 7, the pixel PXL in accordance with an embodiment may include at least one light emitting element LD, e.g., light emitting elements LD, to form each light source unit LSU, and electrodes electrically connected to the light emitting elements LD. For example, the pixel PXL may include a first electrode ELT1 and a second electrode ELT2 which are disposed in each pixel area at positions spaced apart from each other, light emitting elements LD arranged between the first and second electrodes ELT1 and ELT2, and a first contact electrode CNE1 and a second contact electrode CNE2 which are respectively disposed on the first electrode ELT1 and the second electrode ELT2. The first and second contact electrodes CNE1 and CNE2 may be disposed in each pixel area at positions spaced apart from each other, in the same manner as that of the first and second electrodes ELT1 and ELT2, and may electrically connect the first ends EP1 and the second ends EP2 of the light emitting elements LD to the first electrode ELT1 and the second electrode ELT2, respectively. In a plan view, a first conductive pattern CDP1 may be disposed between the first and second contact electrodes CNE1 and CNE2. For example, the first conductive pattern CDP1 may be disposed between the first and second contact electrodes CNE1 and CNE2 such that each of ends of the first conductive pattern CDP1 overlaps an end of a corresponding one of the first and second contact electrodes CNE1 and CNE2. The first conductive pattern CDP1, along with the first and second contact electrodes CNE1 and CNE2, may form a conductive pattern layer CPL disposed over the light emitting elements LD. In an embodiment, the first conductive pattern CDP1 may be regarded as a component of a multilayer pattern MLP disposed in an area of the light emitting elements LD. In some embodiments, the first conductive pattern CDP1 may be removed.

Furthermore, the pixel PXL in accordance with an embodiment may further include at least one multilayer pattern MLP disposed in an area of the light emitting elements LD such that the first and second ends EP1 and EP2 of the light emitting elements LD are exposed. In an embodiment, each multilayer pattern MLP may have a multilayer structure including insulating patterns that overlap each other. At least some of the insulating patterns may have different surface areas and/or widths. In an embodiment, the first conductive pattern CDP1 may be regarded as a component of the multilayer pattern MLP. For example, the first conductive pattern CDP1 may be disposed on the uppermost portion of the multilayer pattern MLP.

The first electrode ELT1 and the second electrode ELT2 may be disposed, at positions spaced apart from each other, in each pixel area in which the corresponding pixel PXL is provided and/or formed, and particularly, may be disposed in the emission area of the corresponding pixel PXL. For example, the first and second electrodes ELT1 and ELT2 may be disposed in parallel in the emission area of each pixel PXL at positions spaced apart from each other by a predetermined distance in a first direction DR1.

In an embodiment, each pixel area may embrace an area in which the light source unit LSU and/or circuit elements for forming the corresponding pixel PXL are disposed. The emission area may be an area where the light emitting elements LD (particularly, valid light sources validly connected between the first and second electrodes ELT1 and ELT2) for forming the light source unit LSU of each pixel PXL are disposed, and may be an area where, along with the light emitting elements LD, electrodes electrically connected thereto (e.g., the first and second electrodes ELT1 and ELT2 and the first and second contact electrodes CNE1 and CNE2) or areas of the electrodes are disposed. The emission area may be enclosed by a light shielding and/or reflective bank structure (also referred to as "pixel defining layer"), which is formed between the pixels PXL.

In an embodiment, each of the first and second electrodes ELT1 and ELT2 may have a bar shape extending in a direction. For example, each of the first and second electrodes ELT1 and ELT2 may have a bar shape extending in the second direction DR2 intersecting the first direction DR1. The first direction DR1 and the second direction DR2 may be perpendicular to each other. However, the disclosure is not limited to this. For example, the shapes, the orientations, and/or the relative disposition relationship of the first and second electrodes ELT1 and ELT2 may be changed in various ways.

Furthermore, one or more first and second electrodes ELT1 and ELT2 may be disposed in each pixel area, and the numbers of first and second electrodes ELT1 and ELT2 disposed in the pixel area are not particularly limited. For example, first electrodes ELT1 which extend in the second direction DR2 and are arranged in parallel to each other may be disposed in each pixel area. At least one second electrode ELT2 facing each first electrode ELT1 may be disposed in each pixel area. For example, in each pixel area, a second electrode ELT2 may be disposed between two first electrodes ELT1, and second electrodes ELT2 may be disposed to respectively correspond to the first electrodes ELT1.

In an embodiment, the first electrode ELT1 may be electrically connected to a circuit element (e.g., at least one transistor that forms the pixel circuit PXC), a power line (e.g., the first power line PL1), and/or a signal line (e.g., a scan line Si, a data line Dj, or a control line) through a first connection electrode CNL1 and/or a first contact hole CH1. In an embodiment, the first electrode ELT1 may be electrically connected to a circuit element disposed therebelow through the first connection electrode CNL1 and the first contact hole CH1 and may be electrically connected to a first line through the circuit element. In an embodiment, the first line may be the first power line PL1 for supply of the first power supply VDD, but the disclosure is not limited thereto. For example, in an embodiment, the first line may be a signal line through which a first driving signal (e.g., a scan signal, a data signal, or a control signal) may be supplied.

As another example, the first electrode ELT1 may be directly and electrically connected to a power line or a signal line without using the first connection electrode CNL1, the first contact hole CH1, and/or the circuit element. The first electrode ELT1 may be integral or not integral with the power line or the signal line.

In an embodiment, the first electrode ELT1 and the first connection electrode CNL1 may extend in different directions in the corresponding pixel area. For example, in case that the first connection electrode CNL1 extends in the first direction DR1, the first electrode ELT1 may extend in the second direction DR2 intersecting the first direction DR1.

In an embodiment, the first electrode ELT1 and the first connection electrode CNL1 may be integral with each other. For instance, the first electrode ELT1 may diverge in at least one way from the first connection electrode CNL1. In case that the first electrode ELT1 and the first connection electrode CNL1 are integral with each other, the first connection electrode CNL1 may be regarded as an area of the first electrode ELT1. However, the disclosure is not limited thereto. For example, in an embodiment, the first electrode ELT1 and the first connection electrode CNL1 may be individually formed and electrically connected to each other through at least one contact hole, at least one via hole, or the like.

In an embodiment, the second electrode ELT2 may be electrically connected to a circuit element (e.g., at least one transistor that forms the pixel circuit PXC), a power line (e.g., the second power line PL2), and/or a signal line (e.g., a scan line Si, a data line Dj, or a control line) through a second connection electrode CNL2 and/or a second contact hole CH2. For example, the second electrode ELT2 may be electrically connected to a second line, through the second connection electrode CNL2 and the second contact hole CH2. In an embodiment, the second line may be the second power line PL2 for supply of the second power supply VSS, but the disclosure is not limited thereto. For example, in an embodiment, the second line may be a signal line through which a second driving signal (e.g., a scan signal, a data signal, or a control signal) may be supplied.

In an embodiment, the second electrode ELT2 may be directly connected to a power line or a signal line without using the second connection electrode CNL2 and/or the second contact hole CH2. The second electrode ELT2 may be integral or not integral with the power line or the signal line.

In an embodiment, the second electrode ELT2 and the second connection electrode CNL2 may extend in different directions. For example, in case that the second connection electrode CNL2 extends in the first direction DR1, the second electrode ELT2 may extend in the second direction DR2 intersecting the first direction DR1.

In an embodiment, the second electrode ELT2 may be integral with the second connection electrode CNL2. For instance, the second electrode ELT2 may diverge in at least one way from the second connection electrode CNL2. In case that the second electrode ELT2 and the second connection electrode CNL2 are integral with each other, the second connection electrode CNL2 may be regarded as an area of the second electrode ELT2. However, the disclosure is not limited thereto. For example, in an embodiment, the second electrode ELT2 and the second connection electrode CNL2 may be individually formed and electrically connected to each other through at least one contact hole, at least one via hole, or the like.

Here, during a process of forming the pixel PXL, particularly, before the alignment of the light emitting elements LD is completed, the respective first electrodes ELT1 of the pixels PXL disposed in the display area DA may be electrically connected to each other, and the respective second electrodes ELT2 of the pixels PXL may be electrically connected to each other. The first and second electrodes ELT1 and ELT2 may be respectively supplied with a first alignment signal (or a first alignment voltage) and a second alignment signal (or a second alignment voltage) at the step of aligning the light emitting elements LD. For example, one of the first and second electrodes ELT1 and ELT2 may be supplied with an AC alignment signal, and the other of the first and second electrodes ELT1 and ELT2 may be supplied with an alignment voltage having a constant voltage level.

In other words, in aligning the light emitting elements LD, a predetermined alignment signal may be applied between the first and second electrodes ELT1 and ELT2, so that an electric field may be formed between the first and second electrodes ELT1 and ELT2. The light emitting elements LD supplied to each pixel area, particularly, the emission area of each pixel PXL, may be aligned between the first and second electrodes ELT1 and ELT2 by the electric field. After the alignment of the light emitting elements LD has been completed, the first electrodes ELT1 may be electrically disconnected from each other, and/or the second electrodes ELT2 may be electrically disconnected from each other, between the pixel PXL, so that the pixels PXL may be individually driven.

Each of the first and second electrodes ELT1 and ELT2 may have a single-layer or multi-layer structure. For example, each first electrode ELT1 may include at least one reflective electrode layer and selectively further include at least one transparent electrode layer and/or at least one conductive capping layer. Likewise, each second electrode ELT2 may include at least one reflective electrode layer and selectively further include at least one transparent electrode layer and/or at least one conductive capping layer.

At least one light emitting element LD may be arranged between the first and second electrodes ELT1 and ELT2. For example, multiple light emitting elements LD may be arranged between the first and second electrodes ELT1 and ELT2. Each light emitting element LD may be electrically connected between the first and second electrodes ELT1 and ELT2 corresponding to each other.

In an embodiment, at least one light emitting element that is not validly connected between the first and second electrodes ELT1 and ELT2 (hereinafter referred to as "invalid light source") may be further disposed in each pixel PXL. Hereinafter, embodiments will be described, focusing on light emitting elements LD each having the ends electrically connected to the first and second electrodes ELT1 and ELT2 (also referred to as "valid light sources"). The valid light sources may collectively form the light source unit LSU of the corresponding pixel PXL.

In an embodiment, each light emitting element LD may be a rod-type light emitting diode extending in a longitudinal direction, but the disclosure is not limited thereto. For example, in an embodiment, at least some light emitting elements LD each may be a light emitting diode having a core-shell structure formed by a growth method or the like.

In an embodiment, each of the light emitting elements LD may be a light emitting element which is made of material having an inorganic crystal structure and has a subminiature size, e.g., in a range of a nanometer scale to micrometer scale. For example, each light emitting element LD may be a subminiature light emitting element having a size in a range of a nanometer to micrometer scale, as illustrated in FIGS. 1A to 3B. However, the size of the light emitting element LD may be changed in various ways depending on design conditions, or the like of each light emitting device, e.g., the pixel PXL, using the light emitting element LD as a light source.

In an embodiment, each light emitting element LD may include a first end EP1 which is disposed on an end thereof in the longitudinal direction and electrically connected to the first electrode ELT1 through the first contact electrode CNE1, and a second end EP2 which is disposed on another end thereof in the longitudinal direction and electrically connected to the second electrode ELT2 through the second contact electrode CNE2. For example, each light emitting element LD may be horizontally arranged in the first direction DR1 between the first and second electrodes ELT1 and ELT2, in an area in which the first and second electrodes ELT1 and ELT2 corresponding to each other are disposed to face each other.

Each light emitting element LD may or may not overlap the first electrode ELT1 and/or the second electrode ELT2 that is adjacent thereto. For example, in an embodiment, as illustrated in FIG. 6, the first and second electrodes ELT1 and ELT2 that correspond to each other may be spaced apart from each other by a length of the light emitting elements LD or more, and the light emitting elements LD may be disposed between the first and second electrodes ELT1 and ELT2 without overlapping the first and second electrodes ELT1 and ELT2. In an embodiment, as illustrated in FIG. 7, the first and second electrodes ELT1 and ELT2 may be spaced apart from each other by the length of the light emitting elements LD or less, and the first and second ends EP1 and EP2 of each of the light emitting elements LD may respectively overlap the first and second electrodes ELT1 and ELT2. In an embodiment, at least one light emitting element LD may overlap one of the first and second electrodes ELT1 and ELT2. In other words, relative disposition relationship between the light emitting elements LD and the first and second electrodes ELT1 and ELT2 may be changed in various ways.

Although FIGS. 6 and 7 illustrate that the light emitting elements LD are uniformly oriented in any one direction, e.g., in the first direction DR1, the disclosure is not limited thereto. For example, at least one of the light emitting elements LD may be oriented in a diagonal direction between the first and second electrodes ELT1 and ELT2. As another example, although not illustrated in FIGS. 6 and 7, at least one light emitting element (for example, an invalid light source) that is not validly connected between the first and second electrodes ELT1 and ELT2 may be further disposed in each pixel area and/or an area around the pixel area.

In an embodiment, the light emitting elements LD may be diffused or dispersed in a solution and be supplied to each pixel area (particularly, the emission area of each pixel PXL) by an inkjet printing method or the like. For example, the light emitting elements LD may be mixed with a volatile solvent and be supplied to each pixel area. Here, if predetermined alignment voltages (or alignment signals) are applied to the first and second electrodes ELT1 and ELT2, an electric field may be formed between the first and second electrodes ELT1 and ELT2, and thus the light emitting elements LD may be aligned between the first and second electrodes ELT1 and ELT2. After the light emitting elements LD have been aligned, the solvent may be removed by a volatilization method or other methods. In this way, the light emitting elements LD may be reliably disposed between the first and second electrodes ELT1 and ELT2. After the light emitting elements LD have been arranged between the first and second electrodes ELT1 and ELT2, the first contact electrode CNE1 and the second contact electrode CNE2 may be respectively formed on the ends of the light emitting elements LD, e.g., the first and second ends EP1 and EP2. Therefore, the light emitting elements LD may be more reliably connected between the first and second electrodes ELT1 and ELT2.

The first ends EP1 of the light emitting elements LD may be electrically connected to the first power supply VDD via the first contact electrode CNE1, the first electrode ELT1, the pixel circuit PXC, and/or the first power line PL1. The second ends EP2 of the light emitting elements LD may be electrically connected to the second power supply VSS via the second contact electrode CNE2, the second electrode ELT2, and/or the second power line PL2. Therefore, at least one light emitting element LD that is electrically connected in a forward direction between the first and second electrodes ELT1 and ELT2 may emit light at a luminance corresponding to driving current supplied from the pixel circuit PXC or the like. Therefore, the pixel PXL may emit light corresponding to the driving current.

In an embodiment, at least one multilayer pattern MLP may be disposed over areas of the light emitting elements LD. In an embodiment, each multilayer pattern MLP may be disposed on an area of at least one light emitting element LD. For example, between the first and second electrodes ELT1 and ELT2 adjacent to each other, each multilayer pattern MLP may be formed in common over light emitting elements LD arranged between the first and second electrodes ELT1 and ELT2. The multilayer pattern MLP may be disposed on only the areas of the light emitting elements LD including central areas of the light emitting elements LD such that the first and second ends EP1 and EP2 of the light emitting elements LD are exposed.

In an embodiment, the multilayer pattern MLP may include insulating patterns which have different surface areas and/or widths and overlap each other. The multilayer pattern MLP along with the first and second contact electrodes CNE1 and CNE2 may form the conductive pattern layer CPL and may further include a first conductive pattern CDP1 separated or electrically disconnected from the first and second contact electrodes CNE1 and CNE2. The structure of the multi-layer pattern MLP will be described in detail below.

In an embodiment, the conductive pattern layer CPL may be disposed on at least areas of the light emitting elements LD and the first and second electrodes ELT1 and ELT2. In an embodiment, the conductive pattern layer CPL may further include at least one first contact electrode CNE1 overlapping each first electrode ELT1 and/or at least one second contact electrode CNE2 overlapping each second electrode ELT2. The conductive pattern layer CPL may selectively further include at least one first conductive pattern CDP1 disposed over areas of the light emitting elements LD.

The first contact electrode CNE1 may be disposed on at least one area of the first electrode ELT1 and the first end EP1 of at least one light emitting element LD (e.g., light emitting elements LD) that is adjacent to the first electrode ELT1. The first contact electrode CNE1 may electrically connect the first end EP1 to the first electrode ELT1.

The second contact electrode CNE2 may be disposed on at least one area of the second electrode ELT2 and the second end EP2 of at least one light emitting element LD (e.g., light emitting elements LD) that is adjacent to the second electrode ELT2. The second contact electrode CNE2 may electrically connect the second end EP2 to the second electrode ELT2.

The first and second ends EP1 and EP2 of each of the light emitting elements LD may be stably fixed by the first and second contact electrodes CNE1 and CNE2. The light emitting elements LD may be electrically connected between the first and second electrodes ELT1 and ELT2 by the first and second contact electrodes CNE1 and CNE2.

The first conductive pattern CDP1 may form a portion of the conductive pattern layer CPL and/or the multilayer pattern MLP. In an embodiment, each of ends of the first conductive pattern CDP1 may overlap an end of a corresponding one of the first and second contact electrodes CNE1 and CNE2 adjacent thereto. The first conductive pattern CDP1 may be electrically separated from the first and second contact electrodes CNE1 and CNE2, in a cross-sectional view of the pixel PXL. During a process of forming the first and second contact electrodes CNE1 and CNE2, the first conductive pattern CDP1 may be simultaneously formed using a conductive material identical to that of the first and second contact electrodes CNE1 and CNE2. Relative disposition relationship of the first and second contact electrodes CNE1 and CNE2 and the first conductive pattern CDP1 and a forming method thereof will be described below.

Figure 8:
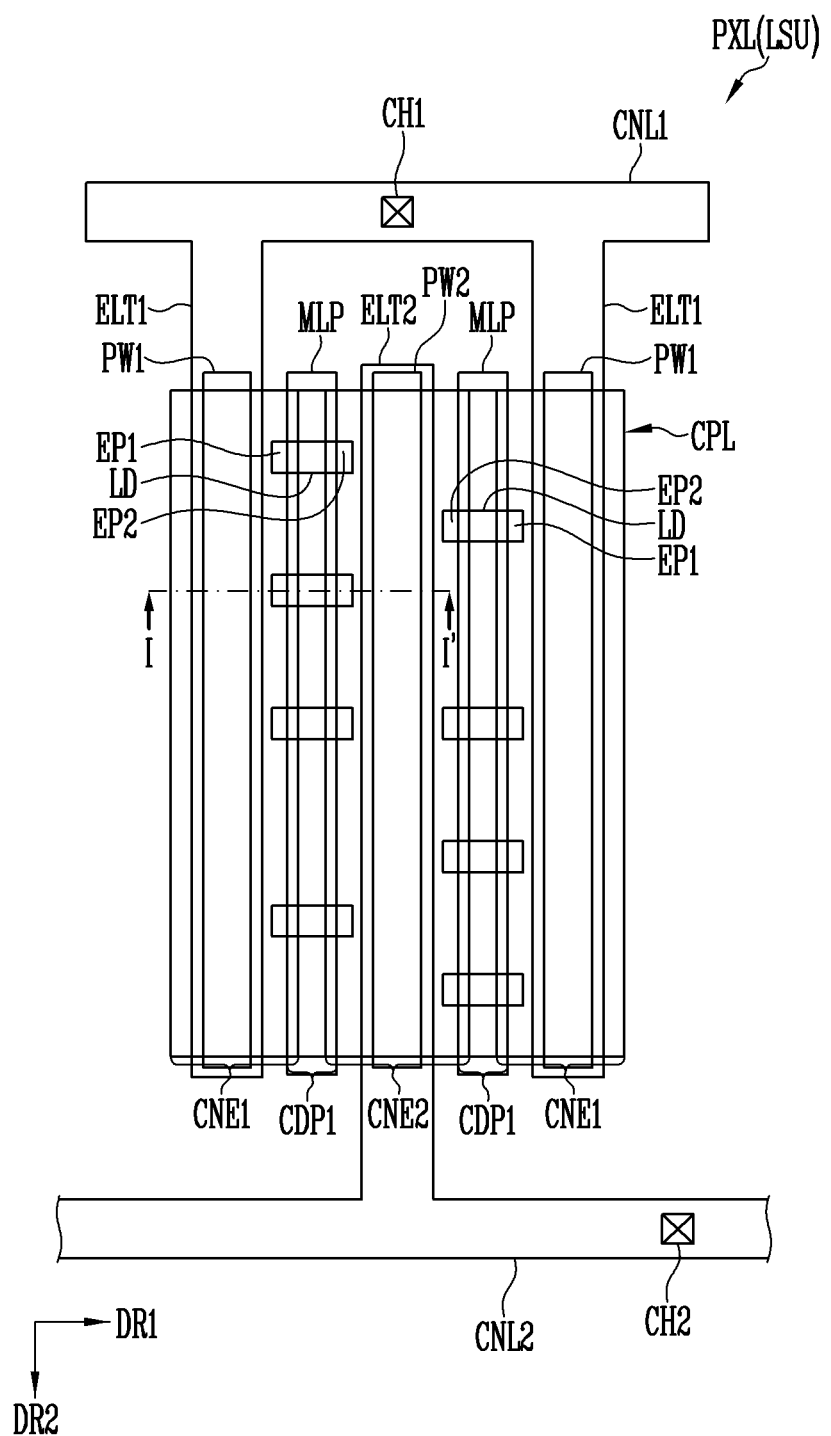
Figure 9:
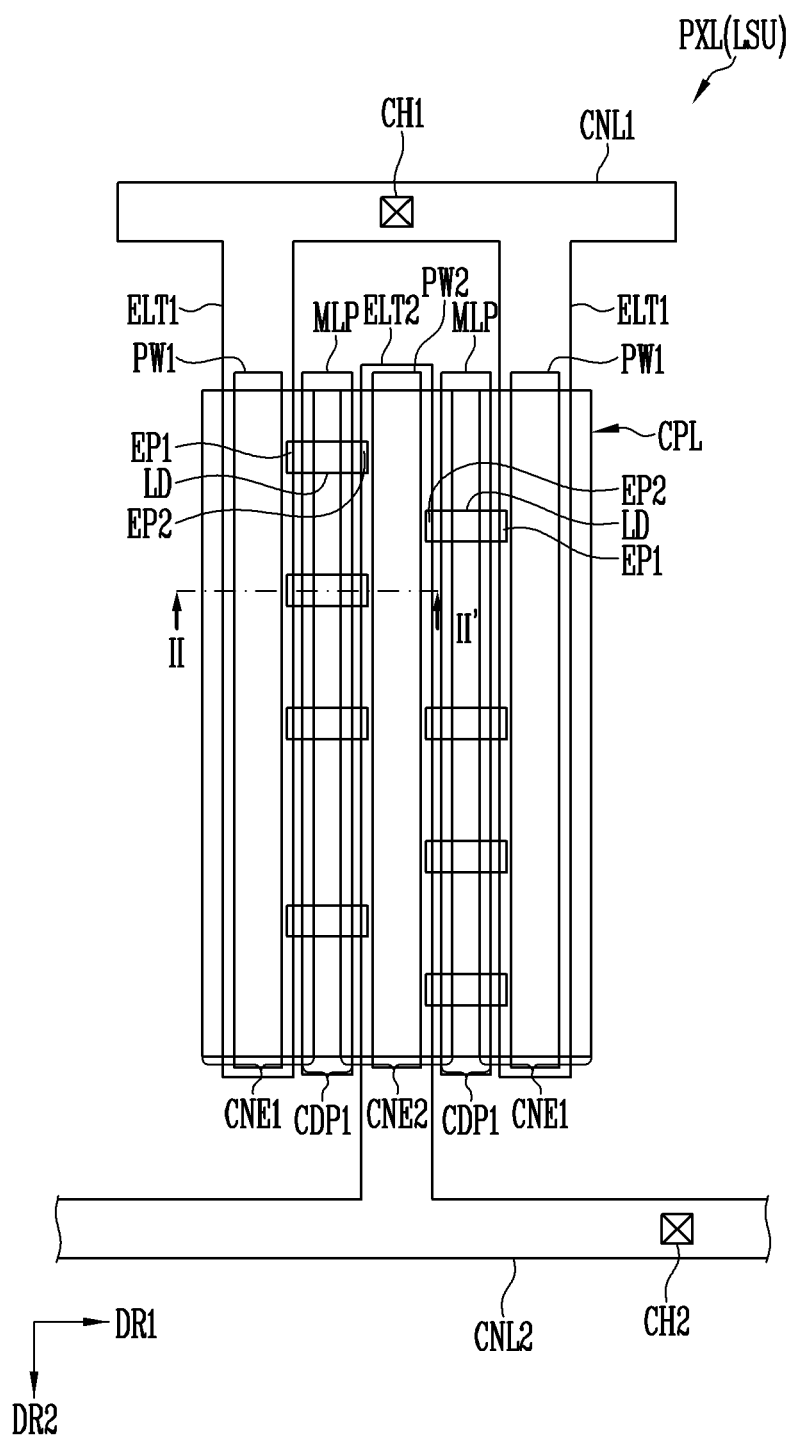

Referring to FIGS. 8 and 9, each pixel PXL may further include at least one wall, e.g., first partition wall PW1 which overlaps each first electrode ELT1 and a second partition wall PW2 which overlaps each second electrode ELT2. In an embodiment, the first partition wall PW1 and the second partition wall PW2 may be respectively disposed under the first electrode ELT1 and the second electrode ELT2. For example, in each emission area, the first and second partition walls PW1 and PW2 may be respectively disposed under the first and second electrodes ELT1 and ELT2. Therefore, the first and second contact electrodes CNE1 and CNE2 may be respectively disposed over the first and second electrodes ELT1 and ELT2.

In an embodiment, the first partition wall PW1 may have a width less than that of each first electrode ELT1 and be disposed under the first electrode ELT1. For example, the first partition wall PW1 may have a shape corresponding to that of the first electrode ELT1 and be disposed inside the first electrode ELT1, in a plan view.

If the first partition wall PW1 is disposed under the first electrode ELT1, the first electrode ELT1 may protrude in an upward direction of the base layer BSL (see FIG. 4) in the area in which the first partition wall PW1 is disposed. Therefore, light emitted from the first ends EP1 of the light emitting elements LD that face the first electrode ELT1 may be controlled to more effectively travel in the frontal direction of the display device.

In an embodiment, the second partition wall PW2 may have a width less than that of each second electrode ELT2 and be disposed under the second electrode ELT2. For example, the second partition wall PW2 may have a shape corresponding to that of the second electrode ELT2 and be disposed inside the second electrode ELT2, in a plan view.

If the second partition wall PW2 is disposed under the second electrode ELT2, the second electrode ELT2 may protrude in an upward direction of the base layer BSL (see FIG. 4) in the area in which the second partition wall PW2 is disposed. Therefore, light emitted from the second ends EP2 of the light emitting elements LD that face the second electrode ELT2 may be controlled to more effectively travel in the frontal direction of the display device.

Figure 10:
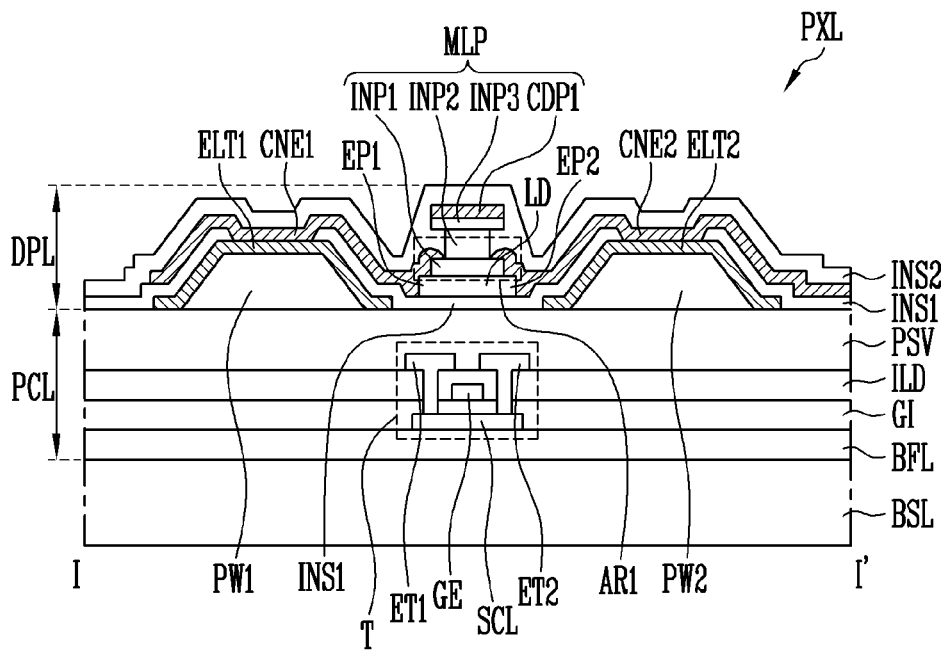
FIG. 10 is a cross-sectional view schematically illustrating a pixel in accordance with an embodiment of the disclosure and for example illustrates an embodiment of a cross-section of the pixel corresponding to line I-I' of FIG. 8.
Figure 11:
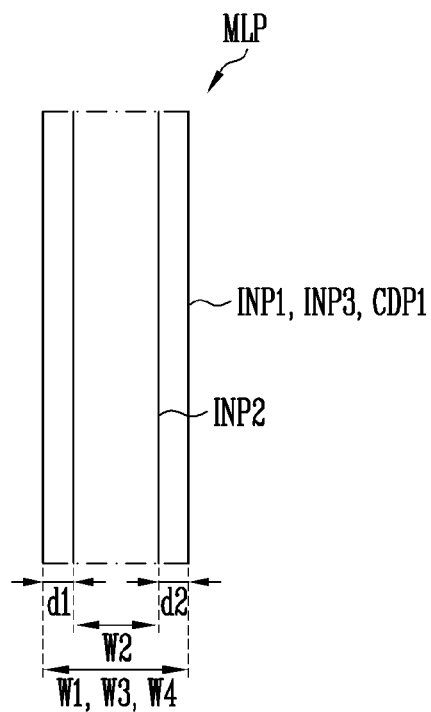
FIG. 11 is a plan view schematically illustrating a multilayer pattern of FIG. 10.
Figure 12:
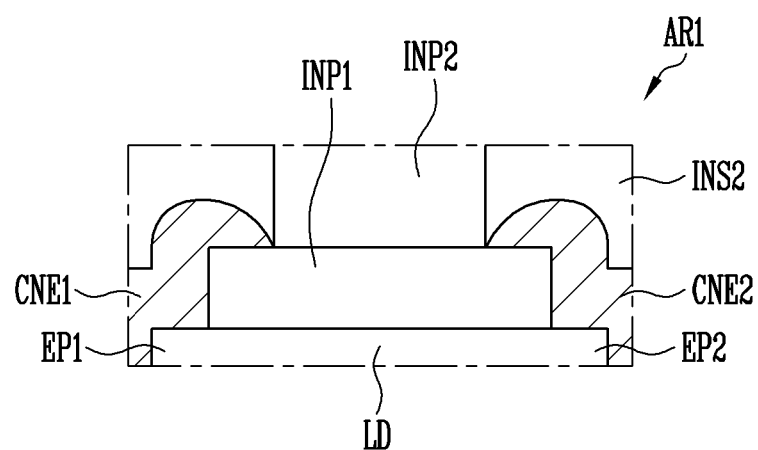
FIG. 12 is a schematic enlarged cross-sectional view of area AR1 of FIG. 10.

FIG. 10 is a schematic cross-sectional view illustrating a pixel PXL in accordance with an embodiment and for example illustrates an embodiment of a cross-section of the pixel PXL corresponding to line I-I' of FIG. 8. FIG. 11 is a plan view schematically illustrating the multi-layer pattern MLP of FIG. 10. FIG. 12 is a schematic enlarged cross-sectional view of area AR1 of FIG. 10. Although FIG. 10 illustrates a cross-section of the pixel PXL focusing on a light emitting element LD, each pixel PXL and a display device including the same may include light emitting elements LD, as described in the embodiments of FIGS. 4 to 9. Therefore, although only a light emitting element LD is illustrated in a cross-sectional view, a light emitting element LD and (multiple) light emitting elements LD may be used interchangeably as needed in the following description of the structure of the pixel PXL.

Referring to FIGS. 4 to 12, the pixel PXL in accordance with an embodiment may include a display element layer DPL disposed on a surface of the base layer BSL and including light emitting elements LD. Furthermore, the pixel PXL may selectively include a pixel circuit layer PCL. For example, the pixel PXL may further include a pixel circuit layer PCL disposed between the base layer BSL and the display element layer DPL.

In an embodiment, the pixel circuit layer PCL may include at least one circuit element electrically connected to the light emitting elements LD. For example, the pixel circuit layer PCL may include at least one circuit element which forms the pixel circuit PXC of each pixel PXL.

For example, the pixel circuit layer PCL may include transistors T and a storage capacitor Cst that are disposed in each pixel area and form the corresponding pixel circuit PXC, and the pixel circuit layer PCL may further include at least one power line and/or at least one signal line that is electrically connected to the pixel circuit PXC and/or the light source unit LSU. Here, in case that the pixel circuit PXC is omitted and each light source unit LSU is directly connected to the first and second power lines PL1 and PL2 (or signal lines), the pixel circuit layer PCL may be omitted. For the sake of explanation, FIG. 10 representatively illustrates only a transistor T among the circuit elements and the lines that are disposed in the pixel circuit layer PCL.

Furthermore, the pixel circuit layer PCL may include insulating layers disposed between respective electrodes and/or lines. In an embodiment, the pixel circuit layer PCL may include a buffer layer BFL, a gate insulating layer GI, an interlayer insulating layer ILD, and a passivation layer PSV which are successively stacked on a surface of the base layer BSL. In some embodiments, the pixel circuit layer PCL may further include at least one light shielding pattern (not shown) disposed under at least some transistors.

The buffer layer BFL may prevent impurities from diffusing into each circuit element. The buffer layer BFL may be formed of a single layer or multiple layers having at least two or more layers. In case that the buffer layer BFL has a multi-layer structure, the respective layers may be formed of the same material or different materials. In an embodiment, the buffer layer BFL may be omitted.

In an embodiment, each transistor T may include a semiconductor layer SCL, a gate electrode GE, and first and second transistor electrodes ET1 and ET2. Although FIG. 10 illustrates an embodiment in which each transistor T includes the first and second transistor electrodes ET1 and ET2 that are formed separately from the semiconductor layer SCL, the disclosure is not limited thereto. For example, in an embodiment, the first and/or second transistor electrode ET1 and/or ET2 provided in at least one transistor T disposed in each pixel area may be integral with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which electrically contacts each first transistor electrode ET1, a second area which electrically contacts each second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, or the like. The channel area of the semiconductor layer SCL may be an intrinsic semiconductor, which is a semiconductor pattern not doped with an impurity. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed on each semiconductor layer SCL with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to respective portions of semiconductor layer SCL. For example, the first and second transistor electrodes ET1 and ET2 may be electrically connected to the first and second areas of the semiconductor layer SCL through corresponding contact holes which pass through the gate insulating layer GI and the interlayer insulating layer ILD.

At least one transistor T provided in the pixel circuit PXC may be electrically connected to a pixel electrode. For example, one of the first and second transistor electrodes ET1 and ET2 of the first transistor T1 illustrated in FIGS. 5A and 5B may be electrically connected to the first electrode ELT1 and/or the first connection electrode CNL1 of the light source unit LSU disposed over the passivation layer PSV, through a contact hole (e.g., the first contact hole CH1 of FIGS. 6 to 9) passing through the passivation layer PSV.

In an embodiment, at least one signal line and/or at least one power line that is electrically connected to each pixel PXL and an electrode of each of the circuit elements that form the pixel circuit PXC may be disposed on a same layer. For example, the second power line PL2 for supplying the second power supply VSS and the gate electrodes GE of the transistors T may be disposed on a same layer, and the second power line PL2 may be electrically connected to the second electrode ELT2 and/or the second connection electrode CNL2 of the light source unit LSU disposed over the passivation layer PSV through at least one bridge pattern (not illustrated) and/or the contact hole (e.g., the second contact hole CH2 of FIGS. 6 to 9). However, the structures and/or positions of the second power line PL2, or the like may be changed in various ways.

In an embodiment, the display element layer DPL may include a light source unit LSU of each of the pixels PXL. For example, the display element layer DPL may include at least one pair of first and second electrodes ELT1 and ELT2 and light emitting elements LD electrically connected between the first and second electrodes ELT1 and ELT2. The display element layer DPL may further include at least one conductive layer and/or at least one insulating layer.

In an embodiment, the display element layer DPL may include first and second partition walls PW1 and PW2, first and second electrodes ELT1 and ELT2, a first insulating layer INS1, light emitting elements LD, a multilayer pattern MLP, first and second contact electrodes CNE1 and CNE2, and a second insulating layer INS2, which are disposed and/or formed over the base layer BSL and/or the pixel circuit layer PCL.

The first and second partition walls PW1 and PW2 may be disposed at positions spaced apart from each other in the emission area of each pixel PXL. The first and second partition walls PW1 and PW2 may protrude from the base layer BSL and/or the pixel circuit layer PCL in a height direction. In an embodiment, the first and second partition walls PW1 and PW2 may have substantially the same height, but the disclosure is not limited thereto.

In an embodiment, the first partition wall PW1 may be disposed between the base layer BSL and/or the pixel circuit layer PCL and the first electrode ELT1. The first partition wall PW1 may be disposed adjacent to the first ends EP1 of the light emitting elements LD. For example, a side surface of the first partition wall PW1 may be positioned adjacent to the first ends EP1 of the light emitting elements LD and face the first ends EP1.

In an embodiment, the second partition wall PW2 may be disposed between the base layer BSL and/or the pixel circuit layer PCL and the second electrode ELT2. The second partition wall PW2 may be disposed adjacent to the second ends EP2 of the light emitting elements LD. For example, a side surface of the second partition wall PW2 may be positioned adjacent to the second ends EP2 of the light emitting elements LD and face the second ends EP2.

In an embodiment, each of the first and second partition walls PW1 and PW2 may have various shapes. By way of example, each of the first and second partition walls PW1 and PW2 may have a trapezoidal cross-section, a width of which reduces from a bottom to a top thereof. Each of the first and second partition walls PW1 and PW2 may have an inclined surface on at least one side. In an embodiment, each of the first and second partition walls PW1 and PW2 may have the cross-section of a semi-circle or a semi-ellipse that is reduced in width from the bottom to the top thereof. Each of the first and second partition walls PW1 and PW2 may have a curved surface on at least one side. In other words, the shape of each of the first and second partition walls PW1 and PW2 may be changed in various ways rather than being particularly limited. In an embodiment, at least one of the first and second partition walls PW1 and PW2 may be omitted or changed in position.

Each of the first and second partition walls PW1 and PW2 may include insulating material having at least one inorganic material and/or organic material. For example, the first and second partition walls PW1 and PW2 may include at least one inorganic layer including various inorganic insulating materials such as silicon nitride ($SiN_x$) or silicon oxide ($SiO_x$). As another example, the first and second partition walls PW1 and PW2 may include at least one organic layer and/or at least one photoresist layer containing various kinds of organic insulating materials or may form a single- or multi-layer insulator containing organic/inorganic materials in combination. In an embodiment, the materials of the first and second partition walls PW1 and PW2 may be changed in various ways.

In an embodiment, each of the first and second partition walls PW1 and PW2 may function as a reflector. For example, the first and second partition walls PW1 and PW2, along with the first and second electrodes ELT1 and ELT2 provided on the first and second partition walls PW1 and PW2, may function as reflectors that guide light emitted from each light emitting element LD in a desired direction, thereby enhancing the light efficiency of the pixel PXL.

The first and second electrodes ELT1 and ELT2 may be respectively disposed over the first and second partition walls PW1 and PW2. The first and second electrodes ELT1 and ELT2 may be disposed at positions spaced apart from each other in each pixel area.

In an embodiment, the first and second electrodes ELT1 and ELT2 that are respectively disposed over the first and second partition walls PW1 and PW2 may have shapes corresponding to the respective shapes of the first and second partition walls PW1 and PW2. For example, the first and second electrodes ELT1 and ELT2 may have inclined surfaces or curved surfaces corresponding to the first and second partition walls PW1 and PW2, respectively, and protrude in the height direction of the base layer BSL.

Each of the first and second electrodes ELT1 and ELT2 may include at least one conductive material. For example, each of the first and second electrodes ELT1 and ELT2 may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or the like, or an alloy thereof, conductive oxide such as indium tin oxide (ITO), indium zinc oxide (IZO), zinc oxide (ZnO), antimony zinc oxide (AZO), indium tin zinc oxide (ITZO), tin oxide ($SnO_2$), and a conductive polymer such as poly(3,4-ethylenedioxythiophene) (PEDOT), but the disclosure is not limited thereto. For example, each of the first and second electrodes ELT1 and ELT2 may include other conductive materials such as a carbon nanotube and a graphene. In other words, each of the first and second electrodes ELT1 and ELT2 may include at least one of various conductive materials to have conductivity, and the material thereof is not particularly limited. Furthermore, each of the first and second electrodes ELT1 and ELT2 may include the same conductive material or at least one different conductive material.

Each of the first and second electrodes ELT1 and ELT2 may have a single-layer or multi-layer structure. For example, each of the first and second electrodes ELT1 and ELT2 may include at least one reflective electrode layer. Each of the first and second electrodes ELT1 and ELT2 may selectively further include at least one of at least one transparent electrode layer disposed over and/or under the reflective electrode layer and at least one conductive capping layer covering an upper portion of the reflective electrode layer and/or the transparent electrode layer.

In an embodiment, the reflective electrode layer of each of the first and second electrodes ELT1 and ELT2 may be formed of (or include) conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or the like, or an alloy thereof, but the disclosure is not limited thereto. In other words, the reflective electrode layer may be formed of various reflective conductive materials. Each of the first and second electrodes ELT1 and ELT2 that includes the reflective electrode layer may enable light emitted from the ends of each of the light emitting elements LD, i.e., the first and second ends EP1 and EP2, to travel in a direction (e.g., in a frontal direction) in which an image is displayed. If the first and second electrodes ELT1 and ELT2 respectively have inclined or curved surfaces corresponding to the shapes of the first and second partition walls PW1 and PW2 and respectively face the first and second ends EP1 and EP2 of the light emitting elements LD, light emitted from the first and second ends EP1 and EP2 of each light emitting element LD may be reflected by the first and second electrodes ELT1 and ELT2 and thus more reliably travel in the frontal direction of the display panel PNL (e.g., in an upward direction of the base layer BSL). Therefore, the efficiency of light emitted from the light emitting elements LD may be enhanced.

Furthermore, the transparent electrode layer of each of the first and second electrodes ELT1 and ELT2 may be formed of various transparent conductive materials. For example, the transparent electrode layer may include ITO, IZO, or ITZO, but the disclosure is not limited thereto. In an embodiment, each of the first and second electrodes ELT1 and ELT2 may have a triple-layer structure having a stacked structure of ITO/Ag/ITO. As described above, if the first and second electrodes ELT1 and ELT2 each have a multilayer structure of at least two or more layers, voltage drops due to signal delay (RC delay) may be reduced or minimized. Therefore, a desired voltage may be effectively transmitted to the light emitting elements LD.

If each of the first and second electrodes ELT1 and ELT2 includes the conductive capping layer covering the reflective electrode layer and/or the transparent electrode layer, it is possible to prevent the reflective electrode layer or the like of the first and second electrodes ELT1 and ELT2 from being damaged by defects occurring during the manufacturing process of the pixel PXL. However, the conductive capping layer may be selectively included in the first and second electrodes ELT1 and ELT2 and may be omitted according to an embodiment. Furthermore, the conductive capping layer may be considered as a component of each of the first and second electrodes ELT1 and ELT2, or as a separate component disposed on the first and second electrodes ELT1 and ELT2.

The first insulating layer INS1 may be disposed on an area of each of the first and second electrode ELT1 and ELT2. For example, the first insulating layer INS1 may cover or overlap areas of the first and second electrodes ELT1 and ELT2 and may include an opening to expose other areas of the first and second electrodes ELT1 and ELT2.

In an embodiment, the first insulating layer INS1 may primarily overlap the overall surfaces of the first and second electrodes ELT1 and ELT2. After the light emitting elements LD are supplied and aligned on the first insulating layer INS1, the first insulating layer INS1 may be partially opened to expose the first and second electrodes ELT1 and ELT2 in respective areas of the first and second partition walls PW1 and PW2. In an embodiment, the first insulating layer INS1 may be patterned in the form of an individual pattern which is sectionally disposed under the light emitting elements LD after the supply and alignment of the light emitting elements LD have been completed.

In other words, the first insulating layer INS1 may be interposed between the first and second electrodes ELT1 and ELT2 and the light emitting elements LD and may expose at least one area of each of the first and second electrodes ELT1 and ELT2. After the first and second electrodes ELT1 and ELT2 are formed, the first insulating layer INS1 may be formed to cover or overlap the first and second electrodes ELT1 and ELT2, so that it is possible to prevent the first and second electrodes ELT1 and ELT2 from being damaged or to prevent metal from being precipitated in a subsequent process. Furthermore, the first insulating layer INS1 may stably support each light emitting element LD.

The first insulating layer INS1 may be formed of a single layer or multiple layers and may include at least one inorganic insulating material and/or organic insulating material. For example, the first insulating layer INS1 may include various kinds of organic/inorganic insulating materials including silicon nitride ($SiN_x$), silicon oxide ($SiO_x$), aluminum oxide ($Al_2O_3$), or the like. The material of the first insulating layer INS1 is not particularly limited.

Light emitting elements LD may be supplied to and aligned in each pixel area, particularly, the emission area of each pixel PXL, in which the first insulating layer INS1 is formed. For example, light emitting elements LD may be supplied to each emission area by an inkjet method or the like, and the light emitting elements LD may be aligned between the first and second electrodes ELT1 and ELT2 by predetermined alignment voltages (or alignment signals) applied to the first and second electrodes ELT) and ELT2.

In an embodiment, each light emitting element LD may have a length greater than a width of the multilayer pattern MLP disposed thereover. Furthermore, each light emitting element LD may be horizontally disposed between the first and second electrodes ELT1 and ELT2 such that the first and second ends EP1 and EP2 are respectively disposed on the ends of the light emitting element LD in a longitudinal direction thereof.

The multilayer pattern MLP may be disposed on areas of the light emitting elements LD. For example, the multilayer pattern MLP may expose the first and second ends EP1 and EP2 of the light emitting elements LD and cover or overlap the areas of the light emitting elements LD including respective central areas of the light emitting elements LD.

In an embodiment, the multilayer pattern MLP may include first to third insulating patterns INP1, INP2, and INP3 that are successively disposed on the areas of the light emitting elements LD. Furthermore, the multilayer pattern MLP may selectively further include a first conductive pattern CDP1 disposed over the first to third insulating patterns INP1, INP2, and INP3.

The first insulating pattern INP1 may be disposed over the light emitting elements LD aligned between the first and second electrodes ELT1 and ELT2 and may expose the first and second ends EP1 and EP2 of the light emitting elements LD. For example, the first insulating pattern INP1 may be partially disposed over only predetermined areas of the light emitting elements LD such that the first and second ends EP1 and EP2 of the light emitting elements LD are exposed. The first insulating pattern INP1 may be formed in an independent pattern in each pixel area, but the disclosure is not limited thereto.

In an embodiment, the first insulating pattern INP1 may be formed of a single layer or multiple layers and include at least one inorganic insulating material and/or organic insulating material. For example, the first insulating pattern INP1 may include at least one inorganic insulating layer including various kinds of inorganic insulating materials including silicon nitride ($SiN_x$), silicon oxide ($SiO_x$), aluminum oxide ($Al_2O_3$), or the like. After the alignment of the light emitting elements LD has been completed, the first insulating pattern INP1 may be formed on the light emitting elements LD so that the light emitting elements LD may be prevented from being displaced from the aligned position.

The second insulating pattern INP2 may have a width less than that of the first insulating pattern INP1. For example, in a plan view, in case that the first insulating pattern INP1 has a first width W1 in a direction in which the first insulating pattern INP1 intersects the first and second electrodes ELT1 and ELT2, e.g., in the first direction DR1 of FIGS. 6 to 9, the second insulating pattern INP2 may have a second width W2 less than the first width W1 in the first direction DR1.

The second insulating pattern INP2 may be disposed in an area of the first insulating pattern INP1 such that the ends of the first insulating pattern INP1 are exposed. For example, the second insulating pattern INP2 may be disposed on the first insulating pattern INP1 such that the ends of the first insulating pattern INP1 that are adjacent to the first and second ends EP1 and EP2 are exposed. The second insulating pattern INP2 may be disposed inside the first insulating pattern INP1, in a plan view.

For example, in a plan view, ends of the second insulating pattern INP2 may be disposed inside the first insulating pattern INP1 such that the ends of the second insulating pattern INP2 are respectively located at positions spaced apart from the ends of the first insulating pattern INP1 by a distance corresponding to more than two times the thickness of the first or second contact electrode CNE1 or CNE2. For example, in case that the thickness of each of the first and second contact electrodes CNE1 and CNE2 is approximately 1,000 Å, the ends of the second insulating pattern INP2 may be respectively located at positions spaced apart from the ends of the first insulating pattern INP1 by a distance in a range of approximately 2,000 Å to approximately 3,000 Å.

For example, in a plan view, the ends of the second insulating pattern INP2 may be located at positions spaced apart from the ends of the first insulating pattern INP1 by a first distance d1 and a second distance d2, respectively. In an embodiment, the first distance d1 may be more than approximately two times the thickness of the first contact electrode CNE1. The second distance d2 may be greater than approximately two times the thickness of the second contact electrode CNE2. In an embodiment, the first contact electrode CNE1 and the second contact electrode CNE2 may have substantially a same thickness, but the disclosure is not limited thereto. Furthermore, the first distance d1 and the second distance d2 may be substantially equal to each other, but the disclosure is not limited thereto.

The second insulating pattern INP2 may have a width less than that of the third insulating pattern INP3 disposed thereover. For example, in case that the third insulating pattern INP3 has a third width W3 in a direction in which the third insulating pattern INP3 intersects the first and second electrodes ELT1 and ELT2, e.g., in the first direction DR1 of FIGS. 6 to 9, the second insulating pattern INP2 may have a second width W2 less than the third width W3 in the first direction DR1. Furthermore, the second insulating pattern INP2 may be disposed inside the third insulating pattern INP3, in a plan view. For example, in a plan view, the ends of the second insulating pattern INP2 that are adjacent to the first and second ends EP1 and EP2 of each light emitting element LD may be covered or overlapped by the third insulating pattern INP3.

In an embodiment, the second insulating pattern INP2 may have a thickness greater than that of the first and/or third insulating patterns INP1 and/or INP3. For example, the second insulating pattern INP2 may have a thickness greater than that of each of the first and third insulating patterns INP1 and INP3.

As such, if the second insulating pattern INP2 has a width less than that of each of the first and third insulating patterns INP1 and INP3 and is disposed inside the first and third insulating patterns INP1 and INP3 in a plan view, the first and second contact electrodes CNE1 and CNE2 may be easily formed in each pixel area in which the first to third insulating patterns INP1, INP2, and INP3 are formed. For example, in case that a conductive layer for forming the first and second contact electrodes CNE1 and CNE2 are deposited by a sputtering process, the conductive layer may be naturally disconnected on the ends of the second insulating pattern INP2. Therefore, even in case that the first and second contact electrodes CNE1 and CNE2 are simultaneously formed on a same layer, a short-circuit defect may be prevented from occurring between the first and second contact electrodes CNE1 and CNE2. If the second insulating pattern INP2 has a thickness greater than that of each of the first and third insulating patterns INP1 and INP3, the first and second contact electrodes CNE1 and CNE2 may be more reliably separated from each other during a process of forming the first and second contact electrodes CNE1 and CNE2.

In an embodiment, the second insulating pattern INP2 may be formed of a single or multiple layers and include at least one inorganic insulating material and/or organic insulating material. For example, the second insulating pattern INP2 may include at least one organic layer and/or at least one photoresist layer including various kinds of organic insulating materials, photoresist materials, or the like.

The third insulating pattern INP3 may have a width greater than the second insulating pattern INP2 and be disposed on the second insulating pattern INP2 such that the ends of the second insulating pattern INP2 are covered or overlapped by the third insulating pattern INP3, in a plan view. In an embodiment, the third insulating pattern INP3 may be formed of a single layer or multiple layers and may include at least one inorganic insulating material and/or organic insulating material. For example, the third insulating pattern INP3 may include at least one inorganic insulating layer including various kinds of inorganic insulating materials including silicon nitride ($SiN_x$), silicon oxide ($SiO_x$), aluminum oxide ($Al_2O_3$), or the like. In an embodiment, the third insulating pattern INP3 and the first insulating layer INS1 and/or the first insulating pattern INP1 may be formed of a same material, but the disclosure is not limited thereto.

The first conductive pattern CDP1 may be disposed over the third insulating pattern INP3. In an embodiment, during a conductive layer deposition process of forming the first and second contact electrodes CNE1 and CNE2, the first conductive pattern CDP1 may be formed along with the first and second contact electrodes CNE1 and CNE2. For example, during a process of forming, by a sputtering process or the like, a conductive layer in each pixel area in which the first to third insulating patterns INP1, INP2, and INP3 are formed, the first conductive pattern CDP1 along with the first and second contact electrodes CNE1 and CNE2 may be formed. The first and second contact electrodes CNE1 and CNE2 and the first conductive pattern CDP1 may include a same conductive material. Furthermore, the first and second contact electrodes CNE1 and CNE2 may be disposed on a same layer and face each other with at least one light emitting element LD interposed therebetween.

In an embodiment, the first conductive pattern CDP1 may have a width substantially equal or similar to that of the third insulating pattern INP3. For example, in case that the third insulating pattern INP3 has a third width W3, the first conductive pattern CDP1 may have a fourth width W4 substantially identical or similar to that of the third width W3. In other words, in the embodiment, the second insulating pattern INP2 may have a width less than that of the first insulating pattern INP1 such that the ends of the first insulating pattern INP1 disposed under the second insulating pattern INP2 are exposed. The third insulating pattern INP3 and the first conductive pattern CDP1 each may have a width greater than that of the second insulating pattern INP2 to overlap the entirety of an upper portion of the second insulating pattern INP2 provided therebelow. In an embodiment, the first insulating pattern INP1, the third insulating pattern INP3, and/or the first conductive pattern CDP1 may have substantially same or similar widths.

Even in case that the first and second contact electrodes CNE1 and CNE2 and the first conductive pattern CDP1 are simultaneously formed, the first conductive pattern CDP1 may be electrically separated from the first and second contact electrodes CNE1 and CNE2. Therefore, the first and second contact electrodes CNE1 and CNE2 may be separated or electrically disconnected from each other. For example, in case that a conductive layer is formed in each pixel area so as to form the first and second contact electrodes CNE1 and CNE2 and the first conductive pattern CDP1, the conductive layer may be electrically disconnected on ends of the multilayer pattern MLP, so that the first and second contact electrodes CNE1 and CNE2 and the first conductive pattern CDP1 may be separated from each other.

The ends of the light emitting elements LD, e.g., the first and second ends EP1 and EP2, which are not overlapped by the multilayer pattern MLP, may be respectively covered or overlapped by the first and second contact electrodes CNE1 and CNE2. Likewise, the ends of the first insulating pattern INP1 that are not overlapped by the second insulating pattern INP2 may be overlapped by the first and second contact electrodes CNE1 and CNE2.

For example, ends of the first and second contact electrodes CNE1 and CNE2 may be respectively disposed on different ends of the first insulating pattern INP1 with the second insulating pattern INP2 interposed therebetween. In an embodiment, the first and second contact electrodes CNE1 and CNE2 may be formed on a same layer on a surface of the base layer BSL by a same process. Therefore, a process of fabricating the pixel PXL and the display device including the pixel PXL may be simplified. For example, compared to forming the first and second contact electrodes CNE1 and CNE2 by respective mask processes, the number of mask processes needed to form the pixel PXL may be reduced, and the first and second contact electrodes CNE1 and CNE2 may be readily formed.

In an embodiment, the first and second contact electrodes CNE1 and CNE2 each may have a thickness which gradually varies on the first insulating pattern INP1. For example, in case that conductive material is applied to form the first and second contact electrodes CNE1 and CNE2 by a sputtering method or the like, the amount of conductive material that reaches a corresponding area may be reduced toward the inside of the first insulation pattern INP1. Therefore, an end of each of the first and second contact electrodes CNE1 and CNE2 may have, on the first insulating pattern INP1, a thickness that gradually increases toward a corresponding one of the first and second electrodes ELT1 and ELT2.

Furthermore, the first and second contact electrodes CNE1 and CNE2 may be disposed over the first and second electrodes ELT1 and ELT2 to cover or overlap exposed areas of the first and second electrodes ELT1 and ELT2. For example, the first and second contact electrodes CNE1 and CNE2 may be respectively disposed on at least areas of the first and second electrodes ELT1 and ELT2 to electrically contact the exposed areas of the first and second electrodes ELT1 and ELT2. Therefore, the first and second contact electrodes CNE1 and CNE2 may be electrically connected to the first and second electrodes ELT1 and ELT2, respectively. The first and second electrodes ELT1 and ELT2 may be electrically connected to the first and second ends EP1 and EP2 of the light emitting elements LD through the first and second contact electrodes CNE1 and CNE2, respectively.

In an embodiment, the first and second contact electrodes CNE1 and CNE2 may be formed of various transparent conductive materials. For example, the first and second contact electrodes CNE1 and CNE2 may include at least one of various transparent conductive materials including ITO, IZO, and ITZO and may be substantially transparent or translucent to satisfy a predetermined transmittancy. Therefore, light emitted from the light emitting elements LD through the first and second ends EP1 and EP2 may be emitted out of the display device through the first and second contact electrodes CNE1 and CNE2. In an embodiment, even in case that the first and second contact electrodes CNE1 and CNE2 are formed along with the first conductive pattern CDP1, the first conductive pattern CDP1 may also include transparent conductive material in an identical manner to that of the first and second contact electrodes CNE1 and CNE2.

The second insulating layer INS2 may be disposed on the first and second contact electrodes CNE1 and CNE2 and the multilayer pattern MLP. For example, the second insulating layer INS2 may be formed and/or disposed on the overall surface of the display area DA of the base layer BSL on which the first and second partition walls PW1 and PW2, the first and second electrodes ELT1 and ELT2, the light emitting elements LD, the multilayer pattern MLP, and the first and second contact electrodes CNE1 and CNE2 are formed, so that the second insulating layer INS3 may cover or overlap the first and second partition walls PW1 and PW2, the first and second electrodes ELT1 and ELT2, the light emitting elements LD, and the first and second contact electrodes CNE1 and CNE2. The second insulating layer INS2 may include at least one inorganic layer and/or organic layer.

In an embodiment, the second insulating layer INS2 may include a thin-film encapsulation layer having a multi-layer structure, but the disclosure is not limited thereto. In some embodiments, at least one overcoat layer and/or an encapsulation substrate, or the like may be further disposed over the second insulating layer INS2.

In an embodiment, the second insulating layer INS2 may be formed of a single layer or multiple layers and may include at least one inorganic insulating material and/or organic insulating material. For example, the second insulating layer INS2 may include various kinds of organic/inorganic insulating materials including silicon nitride ($SiN_x$), silicon oxide ($SiO_x$), or the like. The material of the second insulating layer INS2 is not particularly limited.

Figure 13:
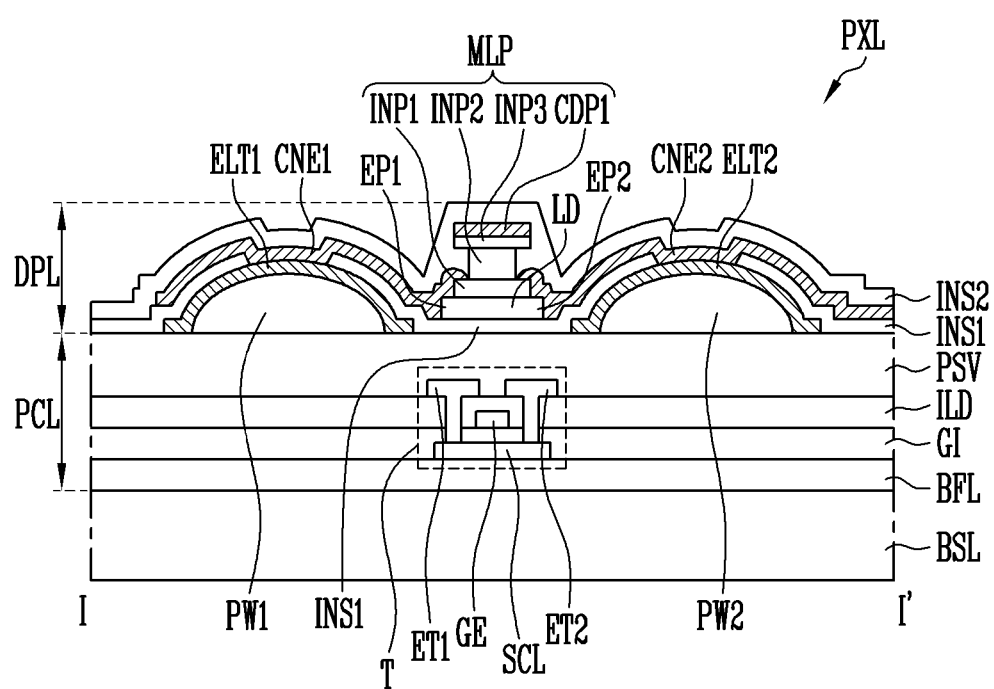
FIGS. 13 to 15 each are a cross-sectional view schematically illustrating a pixel in accordance with an embodiment of the disclosure, and for example illustrate different embodiments of a cross-section of the pixel corresponding to line I-I' of FIG. 8.
Figure 14:
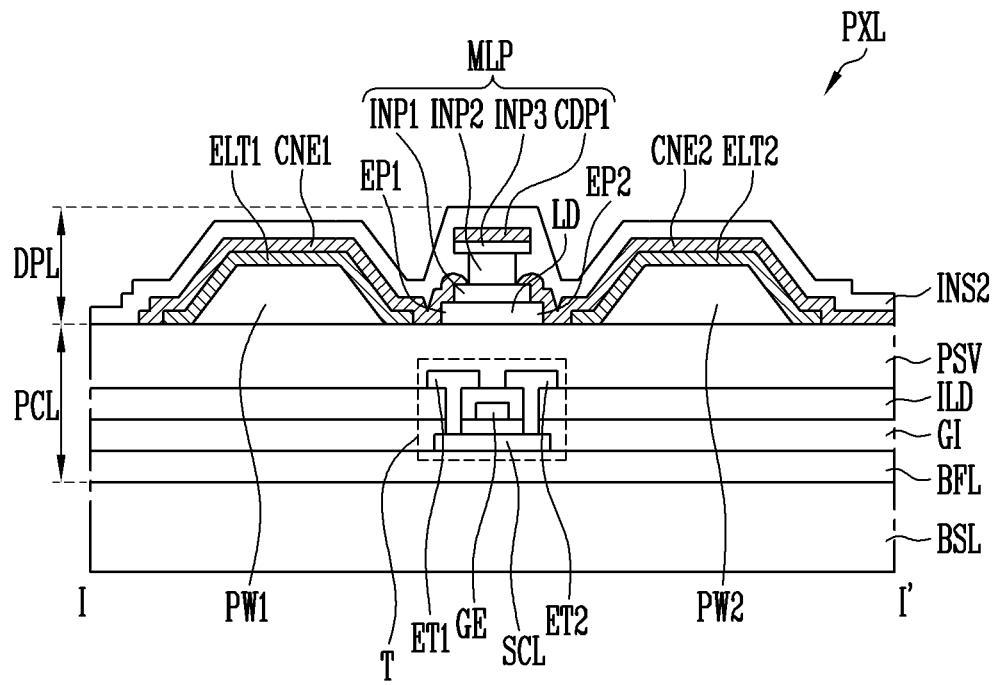
Figure 15:
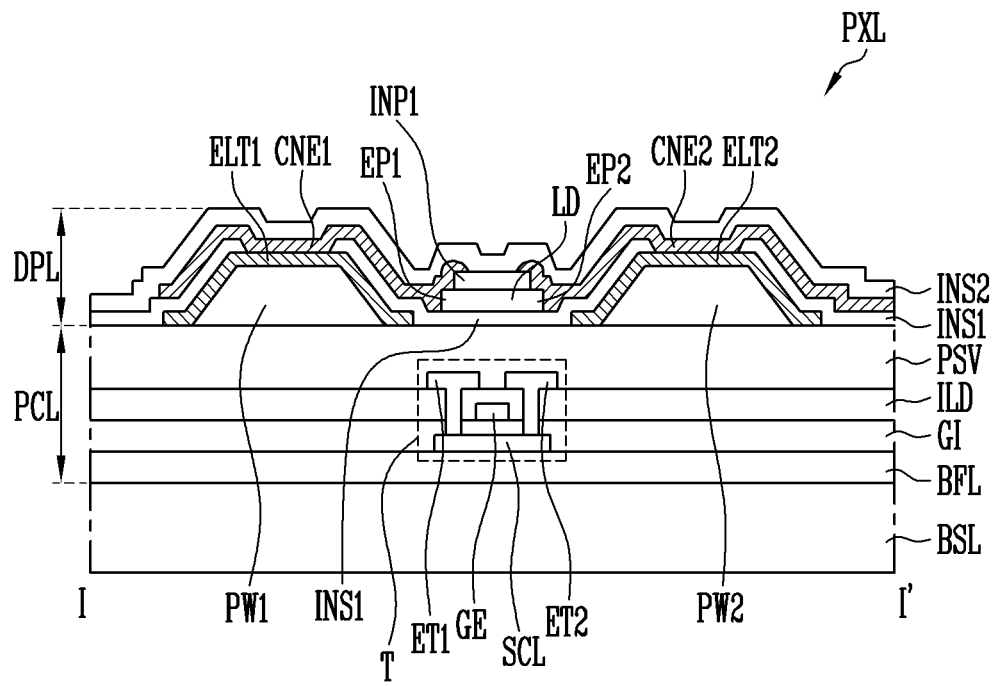

FIGS. 13 to 15 each are a schematic cross-sectional view illustrating a pixel PXL in accordance with an embodiment, and for example, illustrate different embodiments of a cross-section of the pixel PXL corresponding to line I-I' of FIG. 8. In the description of the embodiments of FIGS. 13 to 15, like reference numerals will be used to designate components similar or identical to those of the previous embodiments, and detailed descriptions thereof will be omitted.

Referring to FIG. 13, each of the first and second partition walls PW1 and PW2 may be formed of a curved partition wall. For example, each of the first and second partition walls PW1 and PW2 may have a cross-section of a semi-circle or a semi-ellipse, a width of which reduces from the bottom to the top thereof. The first and second electrodes ELT1 and ELT2 that are respectively disposed over the first and second partition walls PW1 and PW2 may have shapes corresponding to the respective shapes of the first and second partition walls PW1 and PW2. For example, the first and second electrodes ELT1 and ELT2 may have curved surfaces corresponding to the first and second partition walls PW1 and PW2, respectively, and protrude in the height direction of the base layer BSL.

Referring to FIG. 14, the first insulating layer INS1 disclosed in the embodiment of FIG. 10 may be omitted. Each light emitting element LD may be disposed on the passivation layer PSV.

Referring to FIG. 15, part of the multilayer pattern MLP disclosed in the embodiment of FIG. 10 may be removed. For example, the second and third insulating patterns INP2 and INP3 and the first conductive pattern CDP1 may be removed, and only the first insulating pattern INP1 may remain over the light emitting elements LD. In an embodiment, the ends of the first insulating pattern INP1 may be covered or overlapped by the first and second contact electrodes CNE1 and CNE2, and the remaining area of the first insulating pattern INP1 may be covered or overlapped by the second insulating layer INS2, or the like.

Figure 16:
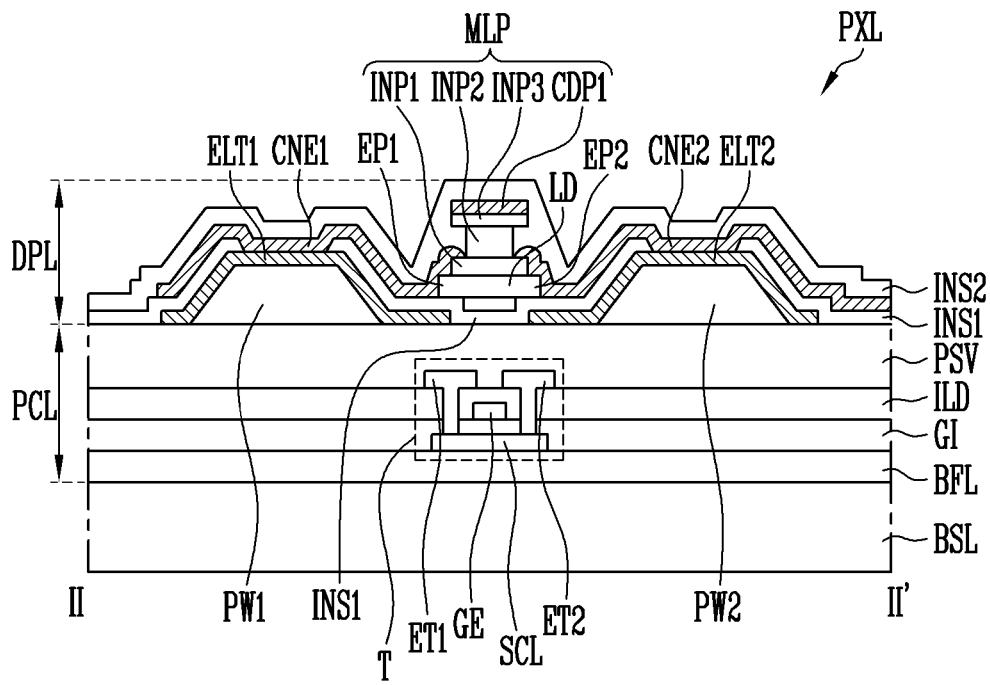
FIGS. 16 and 17 each are a cross-sectional view schematically illustrating a pixel in accordance with an embodiment of the disclosure, and for example illustrate different embodiments of a cross-section of the pixel corresponding to line II-IF of FIG. 9.
Figure 17:
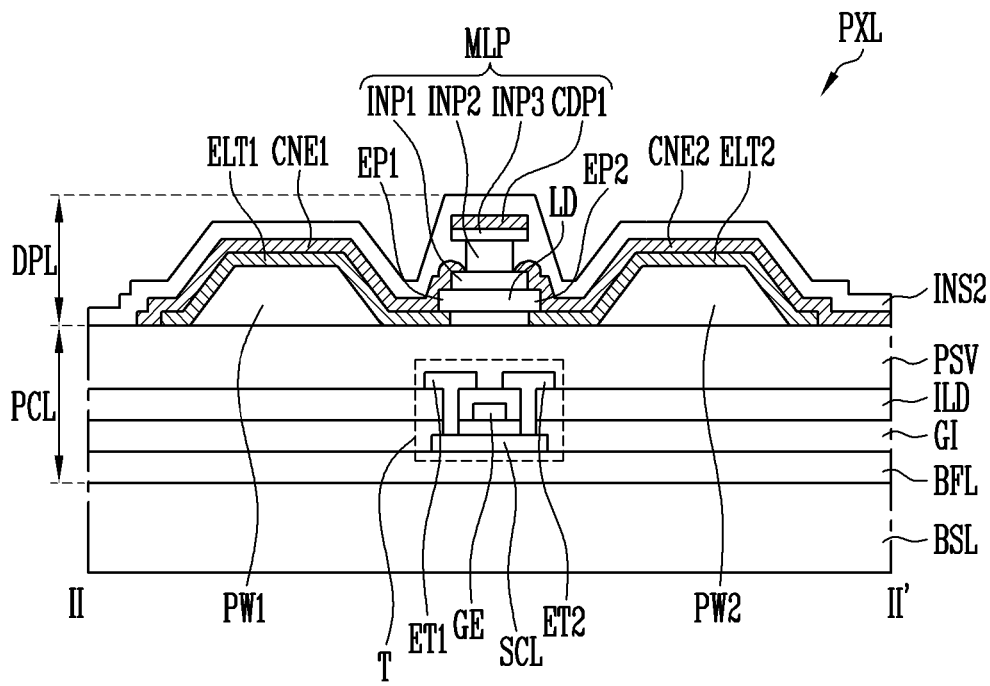

FIGS. 16 and 17 each are a schematic cross-sectional view illustrating a pixel PXL in accordance with an embodiment, and for example, illustrate different embodiments of a cross-section of the pixel PXL corresponding to line II-IF of FIG. 9. In the description of the embodiment of FIGS. 16 and 17, like reference numerals will be used to designate components similar or identicald to those of the previous embodiments, and detailed descriptions thereof will be omitted.

Referring to FIG. 16, each light emitting element LD may be disposed to overlap an end of the first and/or second electrode ELT1 and/or ELT2. For example, the first end EP1 of the light emitting element LD may be disposed over an end of the adjacent first electrode ELT1. The second end EP2 of the light emitting element LD may be disposed over an end of the adjacent second electrode ELT2.

In an embodiment, in case that the first insulating layer INS1 is an inorganic layer, the first insulating layer INS1 may include a groove between the first and second electrodes ELT1 and ELT2. Space formed by the groove may be filled with insulating material drawn into space under the light emitting elements LD during a process of forming the first insulating pattern INP1, or the like. Therefore, the light emitting elements LD may be more stably supported.

Referring to FIG. 17, the first insulating layer INS1 disclosed in the embodiment of FIG. 16 may be omitted, and each light emitting element LD may be directly disposed on the ends of the adjacent first and second electrodes ELT1 and ELT2. The first end EP1 of the light emitting element LD may be electrically connected to the first electrode ELT1 and the first contact electrode CNE1 by directly contacting the first electrode ELT1 and the first contact electrode CNE1. The second end EP2 of the light emitting element LD may be electrically connected to the second electrode ELT2 and the second contact electrode CNE2 by directly contacting the second electrode ELT2 and the second contact electrode CNE2. In an embodiment, in case that a space is present between the light emitting element LD and the passivation layer PSV, the space may be filled with insulating material drawn into the space under the light emitting element LD during a process of forming the first insulating pattern INP1, or the like.

FIGS. 18A to 18J are sectional views sequentially illustrating a method of fabricating a display device in accordance with an embodiment, and for example, illustrate an embodiment of a method of fabricating a display device including the pixel PXL according to the embodiment of FIG. 10 or 15.

Figure 18A:
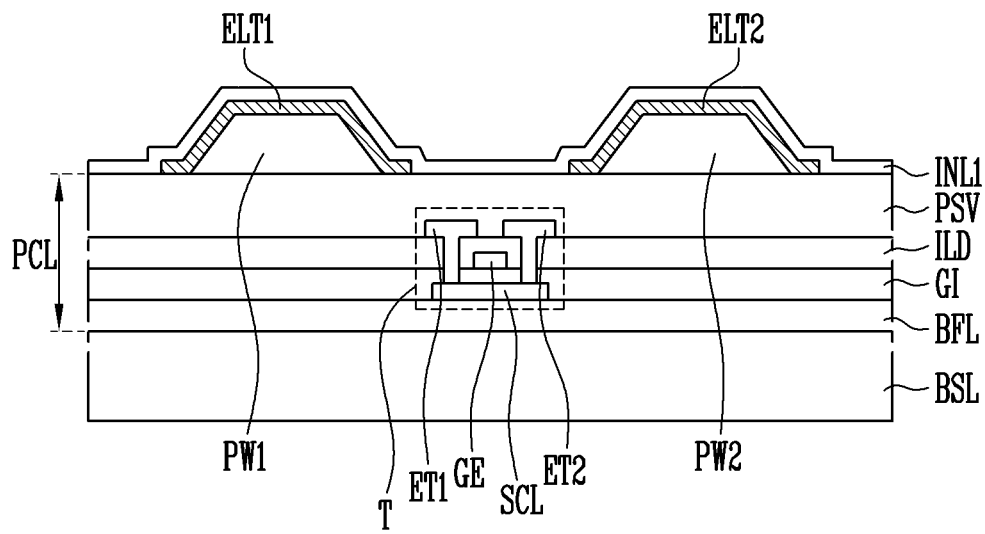
FIGS. 18A to 18J are cross-sectional views schematically and sequentially illustrating a method of fabricating a display device in accordance with an embodiment of the disclosure.

Referring to FIG. 18A, the first and second partition walls PW1 and PW2 may be formed on a surface of the base layer BSL at positions spaced apart from each other, and the first and second electrodes ELT1 and ELT2 may be respectively formed on the first and second partition walls PW1 and PW2. Furthermore, after the first and second partition walls PW1 and PW2 and the first and second electrodes ELT1 and ELT2 are formed, a first insulating material layer INL1 may be formed to cover or overlap the first and second partition walls PW1 and PW2 and the first and second electrodes ELT1 and ELT2.

The first and second partition walls PW1 and PW2 may be selectively formed. In some embodiments, the step of forming the first and second partition walls PW1 and PW2 may be omitted. In some embodiments, the pixel circuit layer PCL may be formed on the base layer BSL before the first and second partition walls PW1 and PW2 are formed. The first and second partition walls PW1 and PW2 may be formed on a surface of the base layer BSL on which the pixel circuit layer PCL is formed.

In an embodiment, the first and second partition walls PW1 and PW2 may be formed by a process of forming an insulating layer including inorganic material and/or organic material or a patterning process (e.g., a mask process) and may be formed by various types of processes. In an embodiment, the first and second partition walls PW1 and PW2 may be simultaneously formed on the same layer (or the same plane) on the base layer BSL, using a same material, but the disclosure is not limited thereto.

The first and second electrodes ELT1 and ELT2 may be formed at positions spaced apart from each other on the base layer BSL on which the first and second partition walls PW1 and PW2 are formed. In an embodiment, the first and second electrodes ELT1 and ELT2 may be formed by a process of forming a conductive layer including at least one conductive material and/or a patterning process and may be formed by various types of processes. In an embodiment, at the step of forming the first and second electrodes ELT1 and ELT2, the first and second connection electrodes CNL1 and CNL2 may be formed to be integral with the first and second electrodes ELT1 and ELT2, respectively.

In an embodiment, each of the first and second electrodes ELT1 and ELT2 may have a single-layer or multi-layer structure. For example, each of the first and second electrodes ELT1 and ELT2 may have a multi-layer structure including a reflective electrode layer and a conductive capping layer. The step of forming the first and second electrodes ELT1 and ELT2 may include the step of forming respective reflective electrodes on the first and second partition walls PW1 and PW2, and the step of forming respective conductive capping layers on the reflective electrodes.

The first and second electrodes ELT1 and ELT2 may be simultaneously formed on the same layer on the base layer BSL, but the disclosure is not limited thereto. In case that the first and second electrodes ELT1 and ELT2 are simultaneously formed, the number of mask processes to be used to fabricate the display device may be reduced or minimized.

In an embodiment, the first insulating material layer INL1 may be formed by a deposition process of an insulating layer including inorganic insulating material and/or organic insulating material and may be formed by various types of processes. For example, the first insulating material layer INL1 may be formed by a deposition process of an insulating layer including at least one inorganic insulating material.

In an embodiment, the first insulating material layer INL1 may be formed of a single layer or multiple layers. In case that the first insulating material layer INL1 is formed of multiple layers, insulating material layers that form (or constitute) the first insulating material layer INL1 may be successively formed.

Figure 18B:
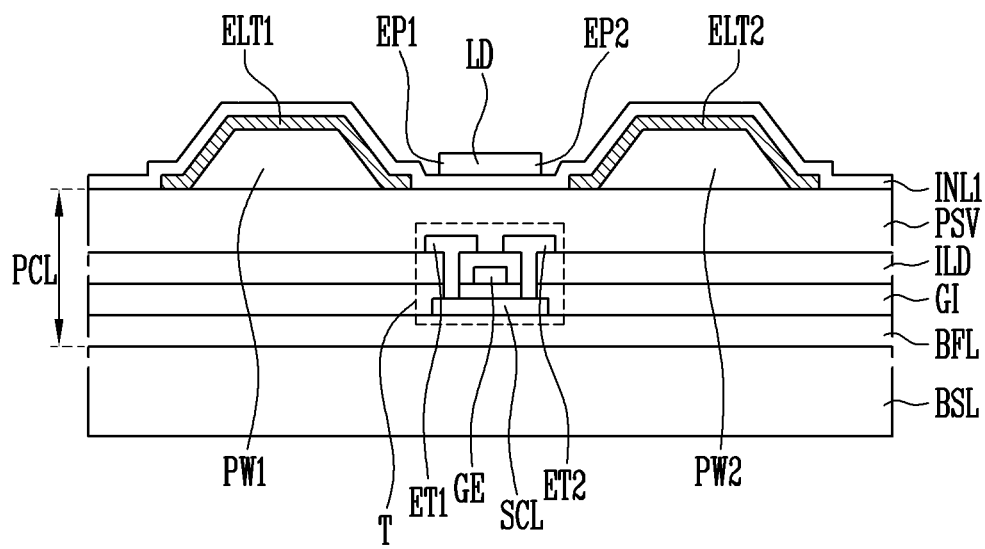

Referring to FIG. 18B, light emitting elements LD may be supplied on the base layer BSL on which the first insulating material layer INL1 is formed. The light emitting elements LD may be aligned between the first and second electrodes ELT1 and ELT2 such that the first and second ends EP1 and EP2 of at least some of the light emitting elements LD are adjacent to the respective first and second electrodes ELT1 and ELT2. In an embodiment, the light emitting elements LD may be supplied to each pixel area of the base layer BSL by various methods including an inkjet method or the like. For example, at least one light emitting element LD (e.g., light emitting elements LD) may be supplied to each pixel area of the base layer BSL. As predetermined alignment voltages (or alignment signals) are applied to the first and second electrodes ELT1 and ELT2 disposed in each pixel area, the light emitting elements LD may be aligned between the first and second electrodes ELT1 and ELT2. In an embodiment, the alignment voltages may be applied to the first and second electrodes ELT1 and ELT2 simultaneously with the supply of the light emitting elements LD or may be applied to the first and second electrodes ELT1 and ELT2 after the supply of the light emitting elements LD.

Figure 18C:
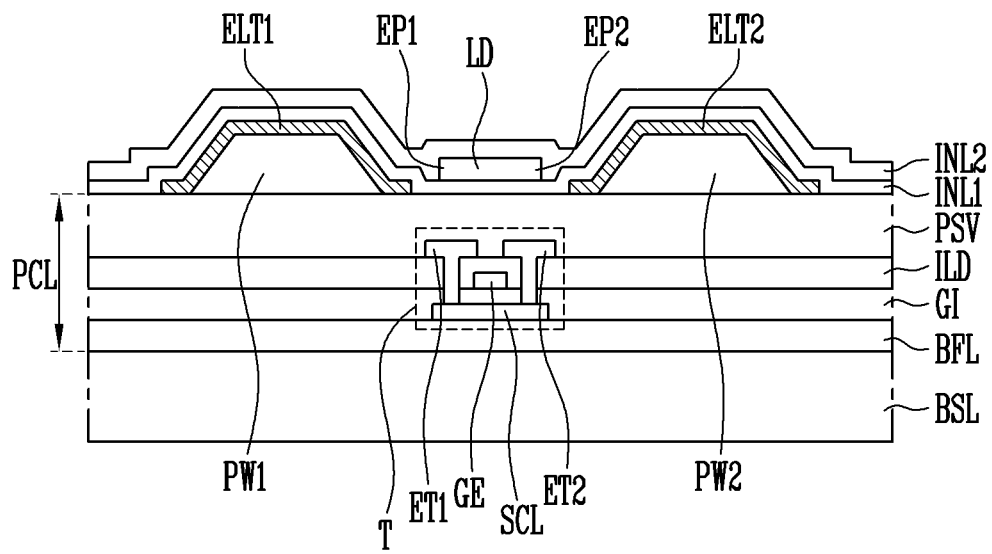

Referring to FIG. 18C, a second insulating material layer INL2 may be formed on the base layer BSL on which the first and second electrodes ELT1 and ELT2, the light emitting elements LD, or the like are disposed. In an embodiment, the second insulating material layer INL2 may be formed by a process of depositing an insulating layer including inorganic material and/or organic material and may be formed by various types of processes. For example, the second insulating material layer INL2 may be formed by a deposition process of an insulating layer including at least one inorganic insulating material.

Figure 18D:
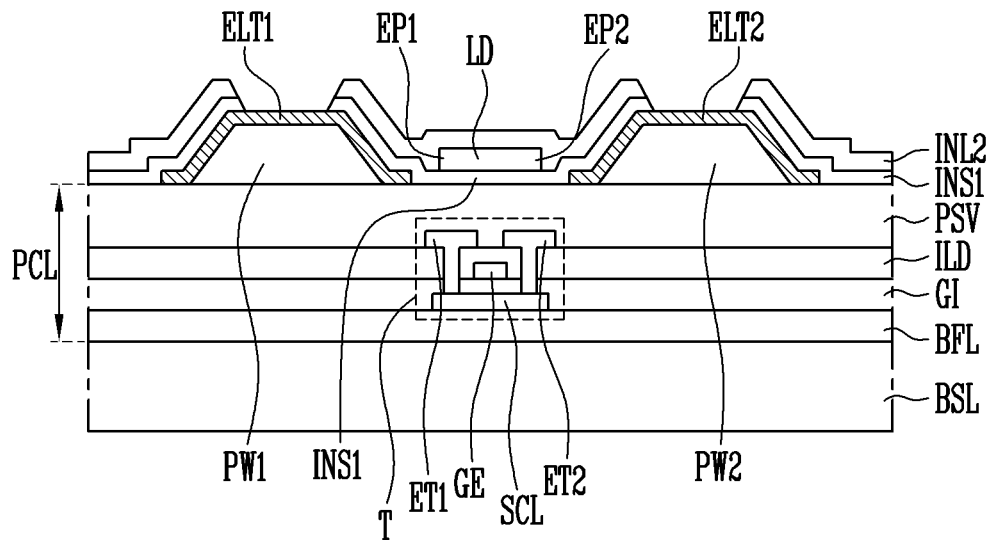

Referring to FIG. 18D, the first and second insulating material layers INL1 and INL2 may be etched by a patterning process using a mask such that an area of each of the first and second electrodes ELT1 and ELT2 is exposed. For example, the first and second insulating material layers INL1 and INL2 are etched by a photolithography process such that an area of each of the first and second electrodes ELT1 and ELT2 is exposed. Therefore, the patterned first insulating material layer INL1 may form the first insulating layer INS1.

Figure 18E:
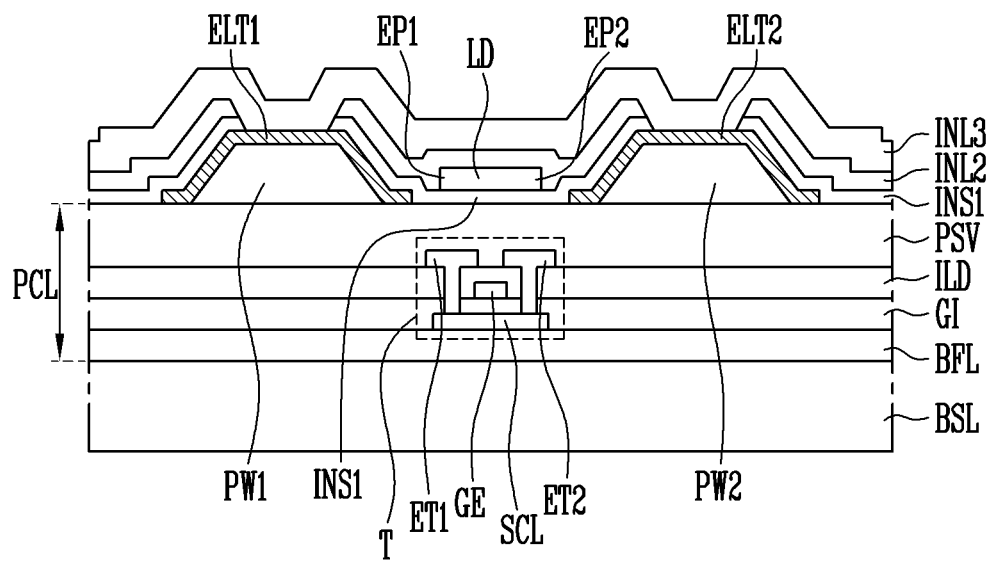

Referring to FIG. 18E, a third insulating material layer INL3 may be formed on the base layer BSL on which the first and second electrodes ELT1 and ELT2, the light emitting elements LD, the second insulating material layer INL2 are disposed. In an embodiment, the third insulating material layer INL3 may be formed by a deposition process of an insulating layer including inorganic material and/or organic material and may be formed by various types of processes. For example, the third insulating material layer INL3 may be formed by depositing at least one organic layer including at least one organic insulating material and/or a photoresist layer to have a thickness greater than that of the second insulating material layer INL2.

Figure 18F:
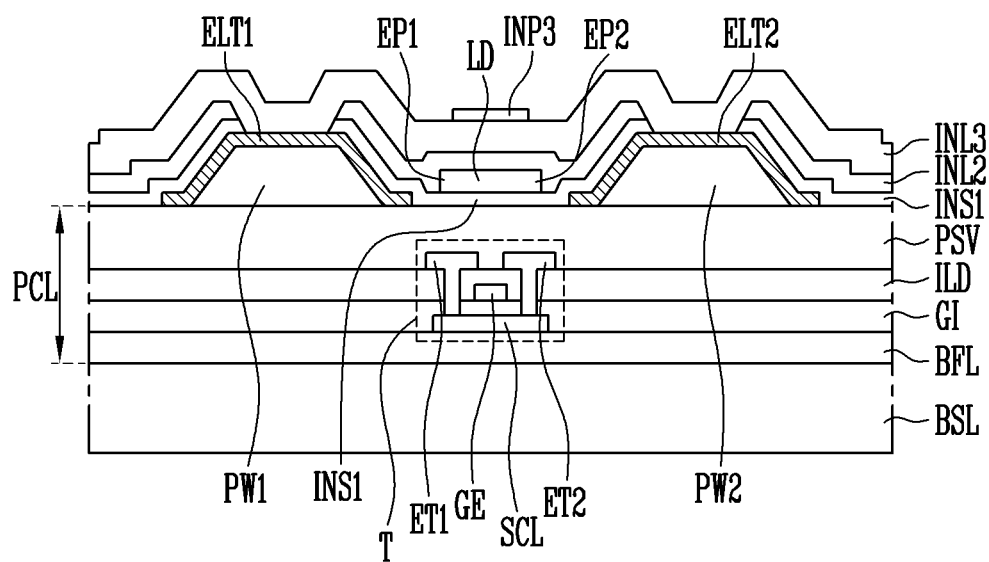

Referring to FIG. 18F, the third insulating pattern INP3 may be formed on the base layer BSL on which the first and second electrodes ELT1 and ELT2, the light emitting elements LD, the second and third insulating material layers INL2 and INL3 are disposed. In an embodiment, the third insulating pattern INP3 may be formed by a deposition process of an insulating layer including inorganic material and/or organic material and a patterning process thereof. In an embodiment, the third insulating pattern INP3 may be formed on the third insulating material layer INL3 to overlap the respective predetermined areas of light emitting elements LD (e.g., valid light emitting elements validly aligned between the first and second electrodes ELT1 and ELT2 of each pixel area), other than the respective first and second ends EP1 and EP2 of the light emitting elements LD.

Figure 18G:
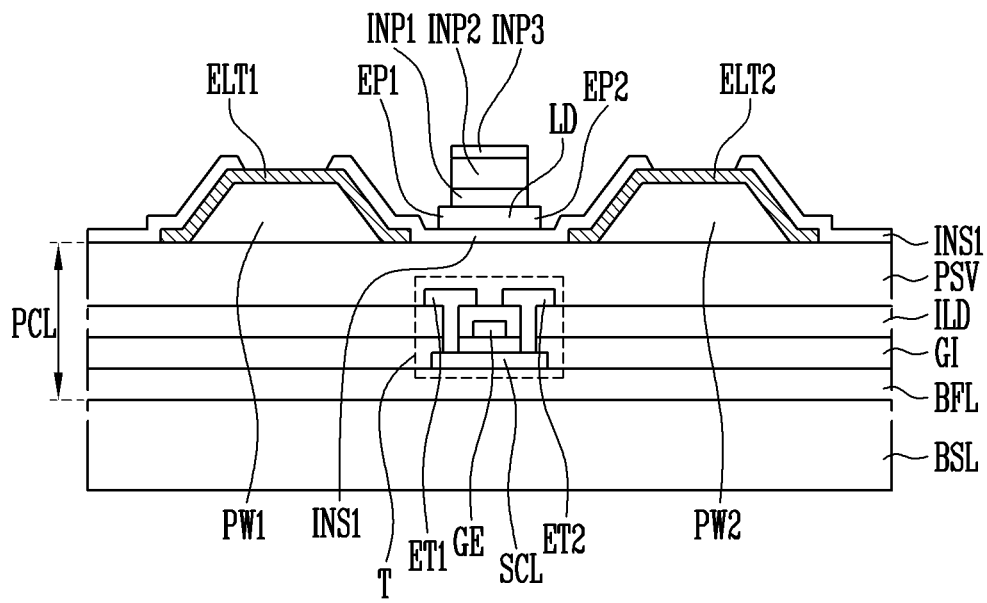

Referring to FIG. 18G, the first and second insulating patterns INP1 and INP2 may be formed between each light emitting element LD and the third insulating pattern INP3 corresponding thereto by etching the second and third insulating material layers INL2 and INL3 using the third insulating pattern INP3 as a mask. For example, the first and second insulating patterns INP1 and INP2 may be formed by a dry etching process using the third insulating pattern INP3 as a mask. Therefore, the first and second ends EP1 and EP2 of each of the light emitting elements LD may be exposed.

Figure 18H:
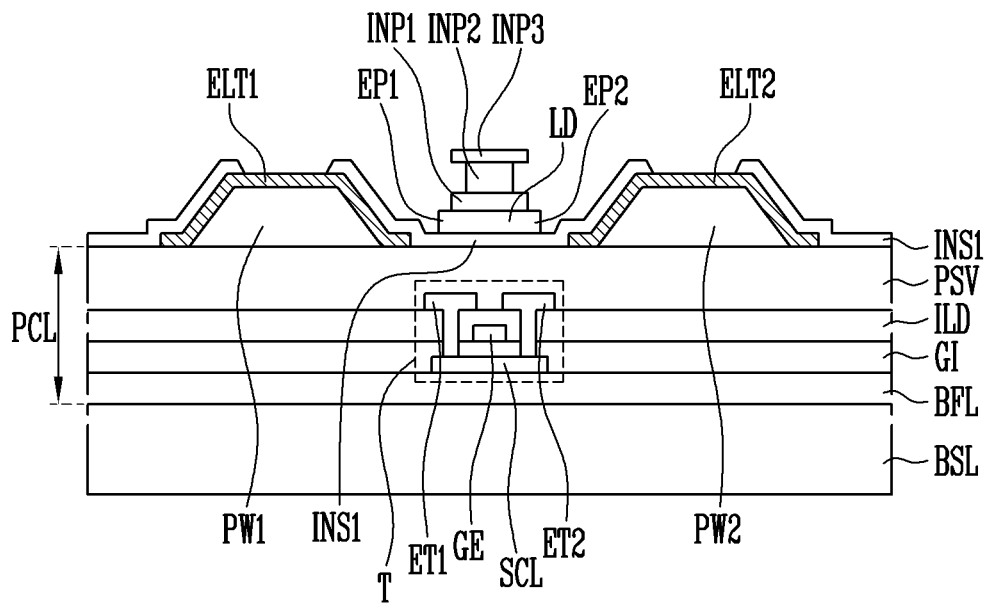

Referring to FIG. 18H, a process of additionally etching a portion (e.g., a sidewall) of the second insulating pattern INP2 may be performed so that the width of the second insulating pattern INP2 is less than that of the first and third insulating patterns INP1 and INP3. For example, an exposed portion of the second insulating pattern INP2 may be selectively etched by an additional ashing process using oxygen ($O_2$) gas or the like. In an embodiment, the width of the second insulating pattern INP2 may be adjusted by controlling the concentration of etching gas and/or the time it takes to perform the etching process. For example, at a subsequent step of applying conductive material to form the first and second contact electrodes CNE1 and CNE2, the portion of the second insulating pattern INP2 may be selectively etched to a degree at which a conductive layer formed by the application of the conductive material may be naturally cut off on the ends of the second insulating pattern INP2.

Figure 18I:
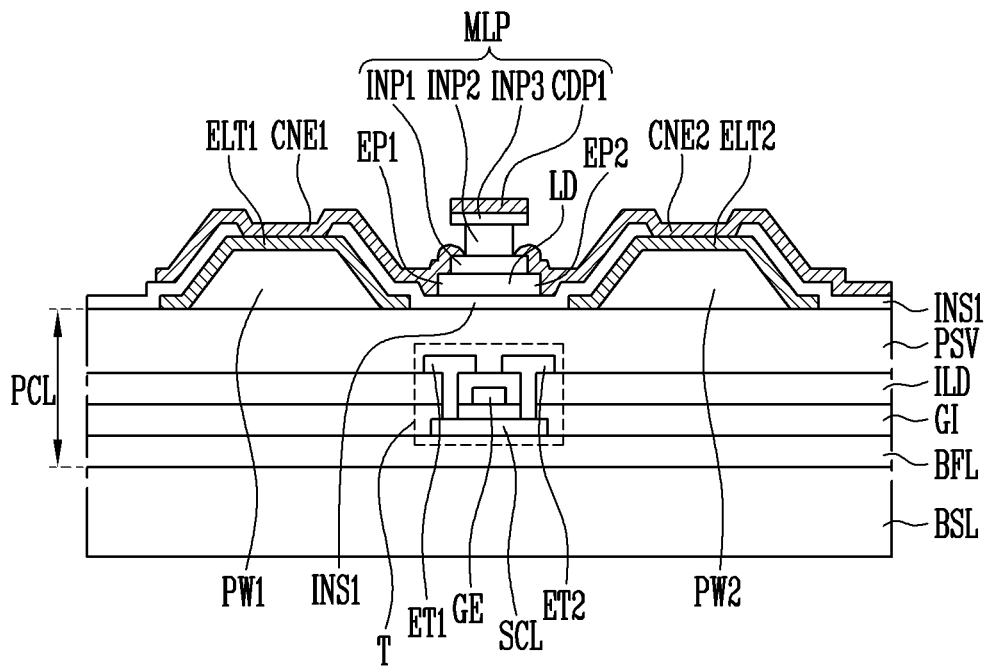

Referring to FIG. 18I, the first and second contact electrodes CNE1 and CNE2 may be formed by applying conductive material onto the base layer BSL on which the first and second electrodes ELT1 and ELT2, the light emitting elements LD, the first to third insulating patterns INP1, INP2, and INP3 are disposed. During the foregoing process, the first conductive pattern CDP1 may be formed over the third insulating pattern INP3. For example, the first and second contact electrodes CNE1 and CNE2 and the first conductive pattern CDP1 may be formed by depositing and/or patterning, by a sputtering method or the like, a conductive layer on the base layer BSL on which the first and second electrodes ELT1 and ELT2, the light emitting elements LD, the first to third insulating patterns INP1, INP2, and INP3 are disposed. In an embodiment, the first conductive pattern CDP1, along with the first to third insulating patterns INP1, INP2, and INP3 provided therebelow, may form the multilayer pattern MLP over the light emitting elements LD. In an embodiment, the first conductive pattern CDP1 and the multilayer pattern MLP may be regarded as separate components. The first conductive pattern CDP1 may be regarded as being disposed over the multilayer pattern MLP.

In an embodiment, the conductive layer may be directly formed on the first and second ends EP1 and EP2 of each of the light emitting elements LD that are not overlapped by the multi-layer pattern MLP. The conductive layer may also be directly formed on an area of each of the first and second electrodes ELT1 and ELT2 that is not covered or overlapped by the first insulating layer INS1. Therefore, the conductive layer may be formed to electrically contact the first and second ends EP1 and EP2 of each of the light emitting elements LD and the first and second electrodes ELT1 and ELT2, and the first and second contact electrodes CNE1 and CNE2 may be formed to electrically connect the first and second ends EP1 and EP2 to the first and second electrodes ELT1 and ELT2, respectively.

The conductive layer may be cut off on the ends of the second insulating pattern INP2. Therefore, the first conductive pattern CDP1 may be electrically disconnected from the first and second contact electrodes CNE1 and CNE2 and formed in a floating pattern.

In an embodiment, after the conductive layer is formed, a mask process may be selectively further performed to remove an area of the conductive layer in each pixel area. For example, an additional mask process may be performed to remove the conductive layer from a perimeter area of each pixel area.

Thereafter, the second insulating layer INS2 may be formed over the first and second contact electrodes CNE1 and CNE2 and the multilayer pattern MLP. As a result, the pixel PXL according to the embodiment of FIG. 10 and the display device including the pixel PXL may be fabricated.

Figure 18J:
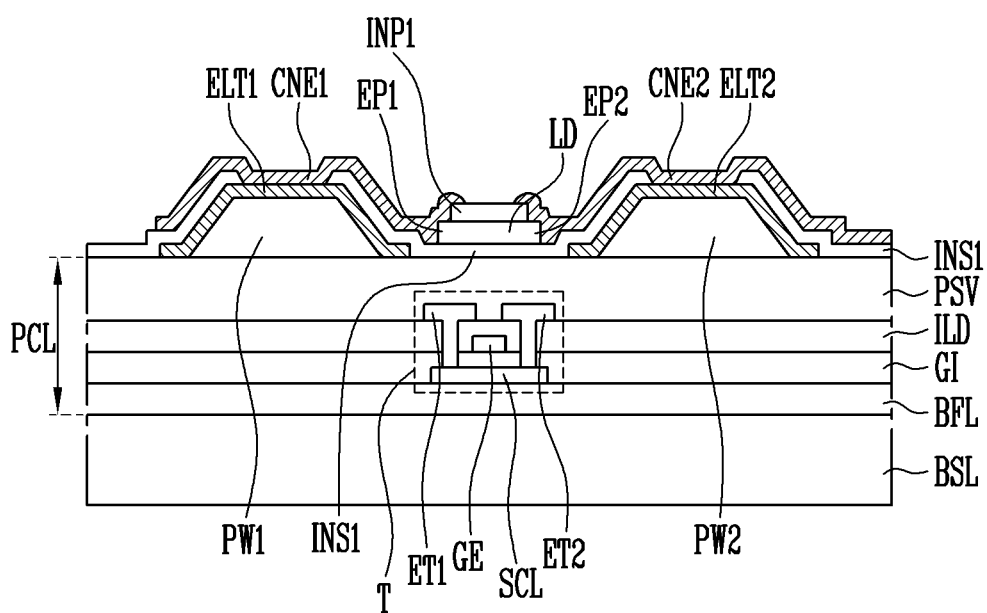

In an embodiment, as illustrated in FIG. 18J, after the first and second contact electrodes CNE1 and CNE2 are formed, an additional peel-off process for removing at least a portion of the multilayer pattern MLP may be performed. For example, after the first and second contact electrodes CNE1 and CNE2 and the first conductive pattern CDP1 are formed, an additional process of removing the second and third insulating patterns INP2 and INP3 and the first conductive pattern CDP1 may be performed.

Thereafter, the second insulating layer INS2 may be formed over the first and second contact electrodes CNE1 and CNE2. As a result, the pixel PXL according to the embodiment of FIG. 15 and the display device including the pixel PXL may be fabricated.

In accordance with the foregoing embodiment, the first and second contact electrodes CNE1 and CNE2 may be simultaneously formed on the same layer on the base layer BSL. Furthermore, in case that the conductive layer is deposited by a sputtering method or the like, a natural disconnection of the conductive layer on the ends of the second insulating pattern INP2 may be guided. Since there is no need to pattern the first and second contact electrodes CNE1 and CNE2 around the light emitting elements LD by a wet etching process, a phenomenon in which lower portions of the light emitting elements LD are etched by etchant drawn into the space under the light emitting elements LD may be prevented. Therefore, a contact defect may be prevented from occurring between the light emitting elements LD and the first and/or second contact electrodes CNE1 and CNE2.

In other words, according to the foregoing embodiment, the light emitting elements LD may be reliably and electrically connected between the first and second electrodes ELT1 and ELT2, and the number of mask processes to be used to fabricate the display device may be reduced.

Figure 19:
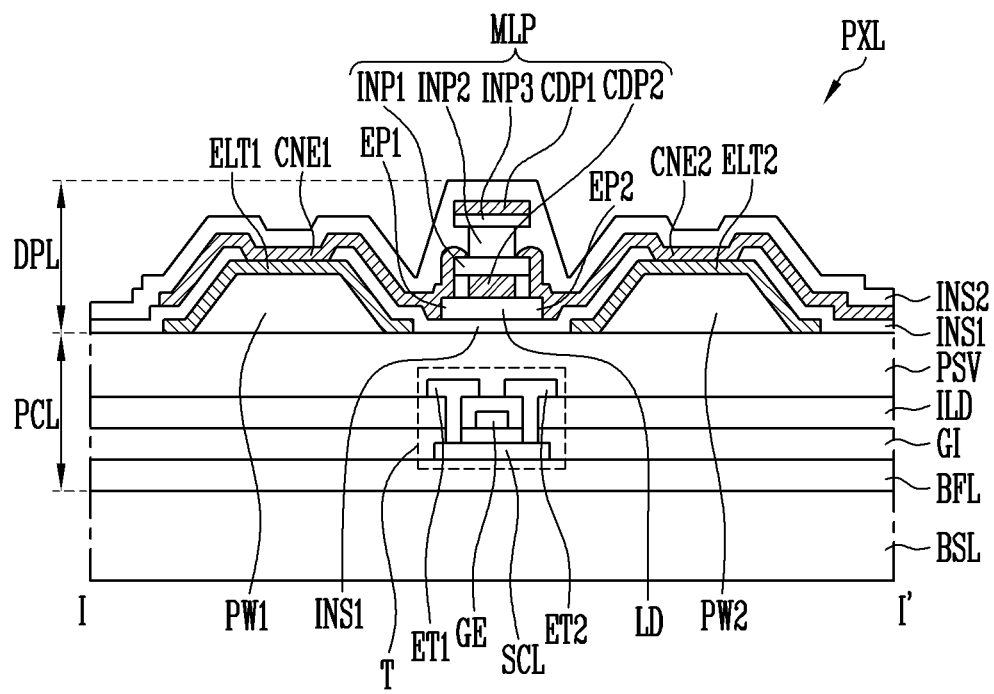
FIGS. 19 and 20 each are a cross-sectional view schematically illustrating a pixel in accordance with an embodiment of the disclosure, and for example illustrate different embodiments of a cross-section of the pixel corresponding to line I-I' of FIG. 8.
Figure 20:
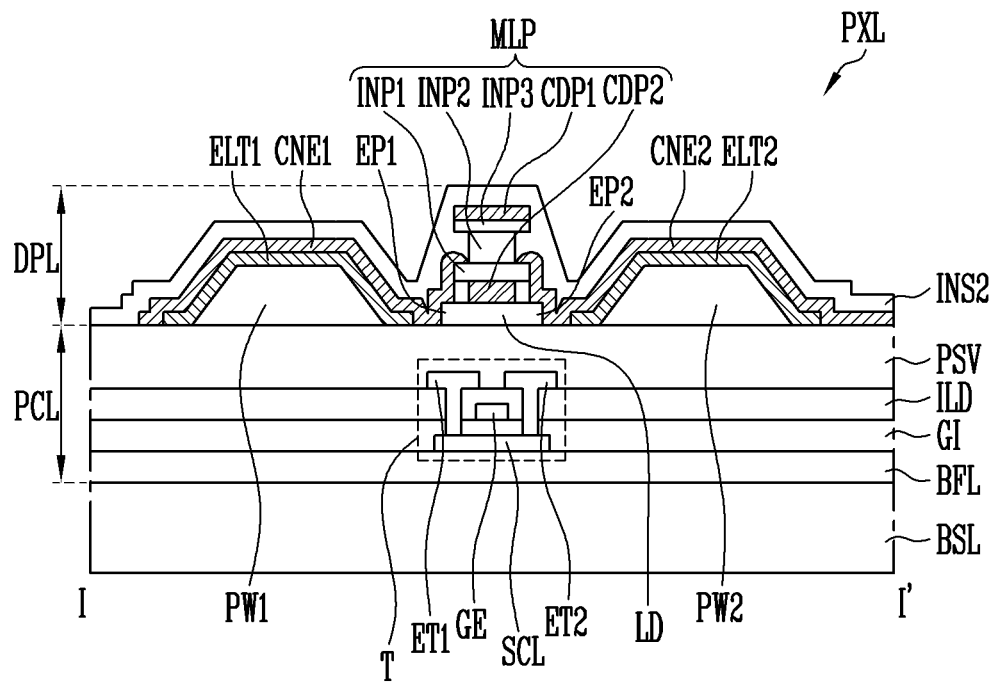
Figure 21:
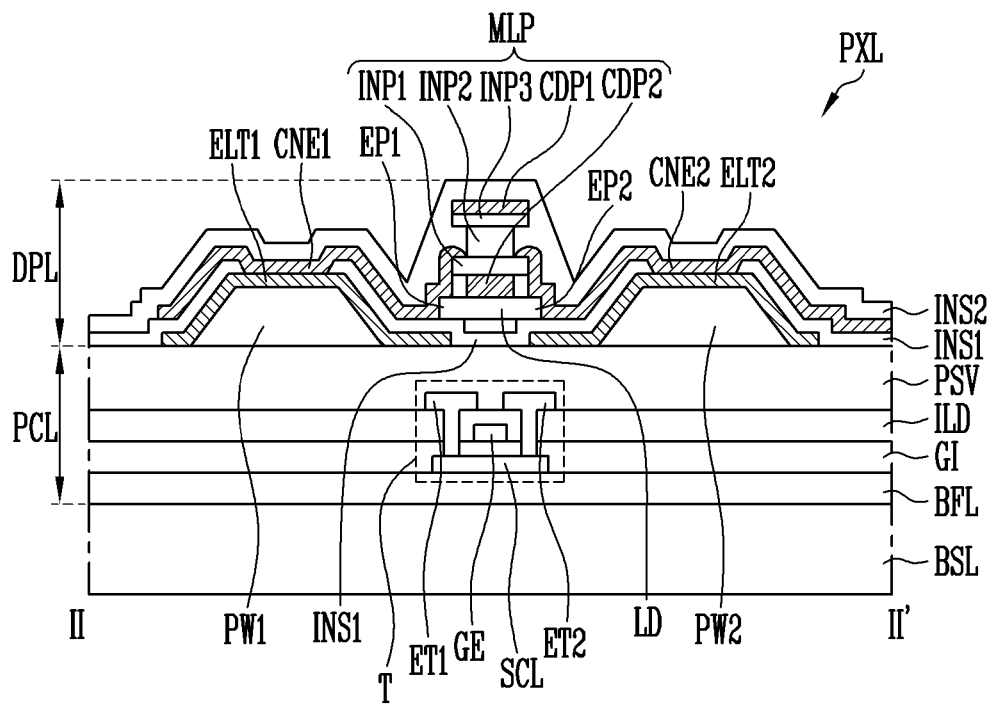
FIGS. 21 and 22 each are a cross-sectional view schematically illustrating a pixel in accordance with an embodiment of the disclosure, and for example illustrate different embodiments of a cross-section of the pixel corresponding to line II-IF of FIG. 9.
Figure 22:
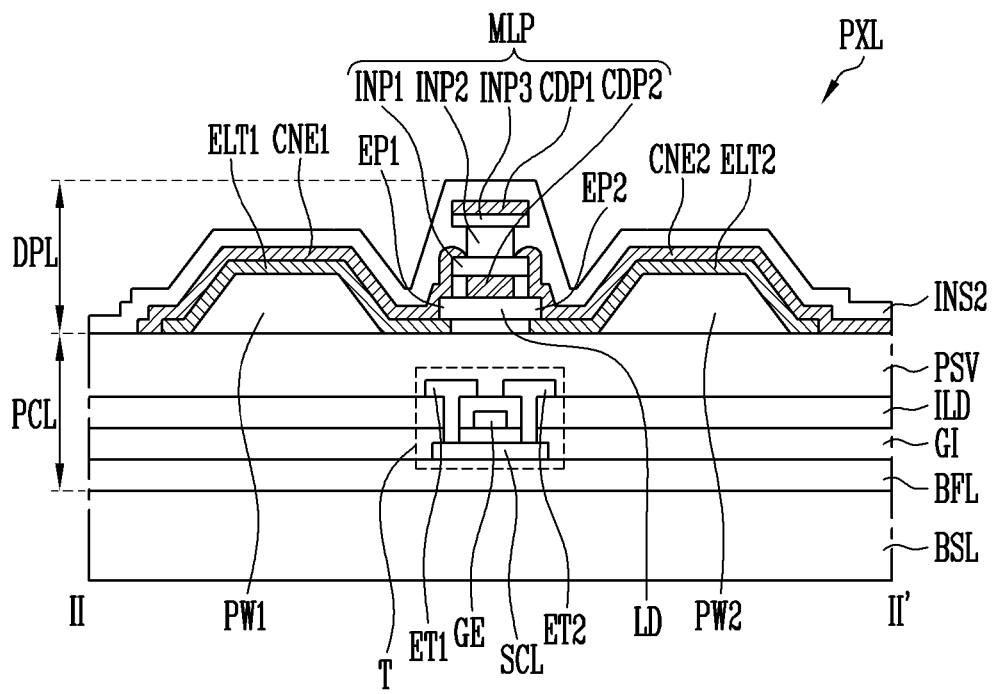

FIGS. 19 and 20 each are a schematic sectional view illustrating a pixel PXL in accordance with an embodiment, and for example, illustrate different embodiments of a cross-section of the pixel PXL corresponding to line I-I' of FIG. 8. FIGS. 21 and 22 each are a schematic sectional view illustrating a pixel PXL in accordance with an embodiment, and for example, illustrate different embodiments of a cross-section of the pixel PXL corresponding to line II-IF of FIG. 9.

The embodiments of FIGS. 19 and 20 each may further include a second conductive pattern CDP2 compared to the embodiments of FIGS. 10 and 14. The embodiments of FIGS. 21 and 22 each may further include a second conductive pattern CDP2 compared to the embodiments of FIGS. 16 and 17. In the description of the embodiments of FIGS. 19 to 22, like reference numerals will be used to designate components similar or identical to those of the previous embodiments, and detailed descriptions thereof will be omitted.

Referring to FIGS. 19 to 22, each pixel PXL may further include a second conductive pattern CDP2 disposed between each light emitting element LD and the first insulating pattern INP1. For example, each pixel PXL may include a multilayer pattern MLP disposed on areas of the light emitting elements LD such that the first and second ends EP1 and EP2 of the light emitting elements LD are exposed. The multilayer pattern MLP may include a second conductive pattern CDP2, first to third insulating patterns INP1, INP2, and INP3, and a first conductive pattern CDP1 which are successively disposed from the bottom to the top.

The second conductive pattern CDP2 may have a width less than that of the first insulating pattern INP1. For example, in a plan view, the second conductive pattern CDP2 may have a width less than that of the first insulating pattern INP1 and be disposed inside the first insulating pattern INP1, and thus be separated (or electrically disconnected) from the first and second contact electrodes CNE1 and CNE2.

In an embodiment, the second conductive pattern CDP2 may include conductive material which is removed by a wet etching process. For example, the second conductive pattern CDP2 may include transparent conductive material which may be patterned by the wet etching process. For example, the second conductive pattern CDP2 may include transparent conductive oxide such as IZO or ITO and further include at least one of various conductive materials capable of being wet-etched.

As described in the foregoing embodiments, if the second conductive pattern CDP2 is formed on each light emitting element LD, the first and second ends EP1 and EP2 of the light emitting element LD may be exposed by the wet etching process in case that a process of exposing the first and second ends EP1 and EP2 to electrically connect the light emitting element LD to the first and second contact electrodes CNE1 and CNE2 is performed. Damage to the light emitting element LD which may occur in case that a dry etching process is performed to expose the first and second ends EP1 and EP2 of the light emitting element LD (e.g., damage to the insulating film (INF of FIGS. 1A to 3B) which may be caused during a dry etching process) may be prevented. Therefore, a short-circuit defect or the like may be fundamentally prevented from occurring due to damage to the light emitting element LD.

FIGS. 23A to 23J are schematic cross-sectional views sequentially illustrating a method of fabricating a display device in accordance with an embodiment, and for example illustrate an embodiment of a method of fabricating a display device including the pixel PXL according to the embodiment of FIG. 19. In the description of the embodiment of the fabricating method to be described with reference to FIGS. 23A to 23J, like reference numerals are used to designate components similar or identical to those of the above-described embodiments, e.g., the embodiment of the fabricating method described with reference to FIGS. 18A to 18J, and detailed descriptions thereof will be omitted.

Figure 23A:
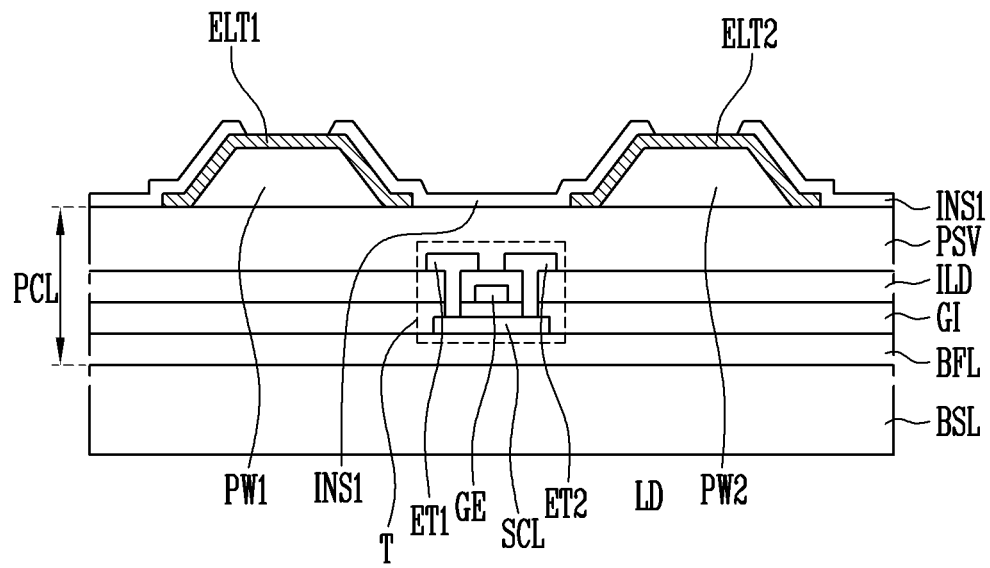
FIGS. 23A to 23J are cross-sectional views schematically and sequentially illustrating a method of fabricating a display device in accordance with an embodiment of the disclosure.

Referring to FIG. 23A, the first and second partition walls PW1 and PW2 may be formed on a surface of the base layer BSL to be spaced apart from each other, and the first and second electrodes ELT1 and ELT2 may be respectively formed on the first and second partition walls PW1 and PW2. Furthermore, the first insulating layer INS1 may be formed on the first and second electrodes ELT1 and ELT2 such that predetermined areas of the first and second electrodes ELT1 and ELT2 are exposed.

Figure 23B:
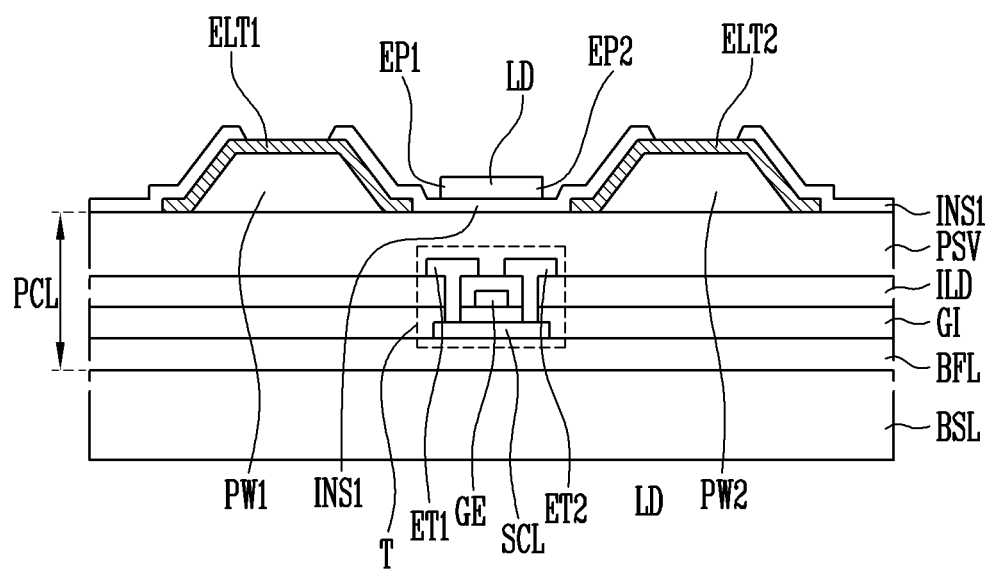

Referring to FIG. 23B, light emitting elements LD may be supplied onto the base layer BSL on which the first and second electrodes ELT1 and ELT2 and the first insulating layer INS1 are formed. The light emitting elements LD may be aligned between the first and second electrodes ELT1 and ELT2.

Figure 23C:
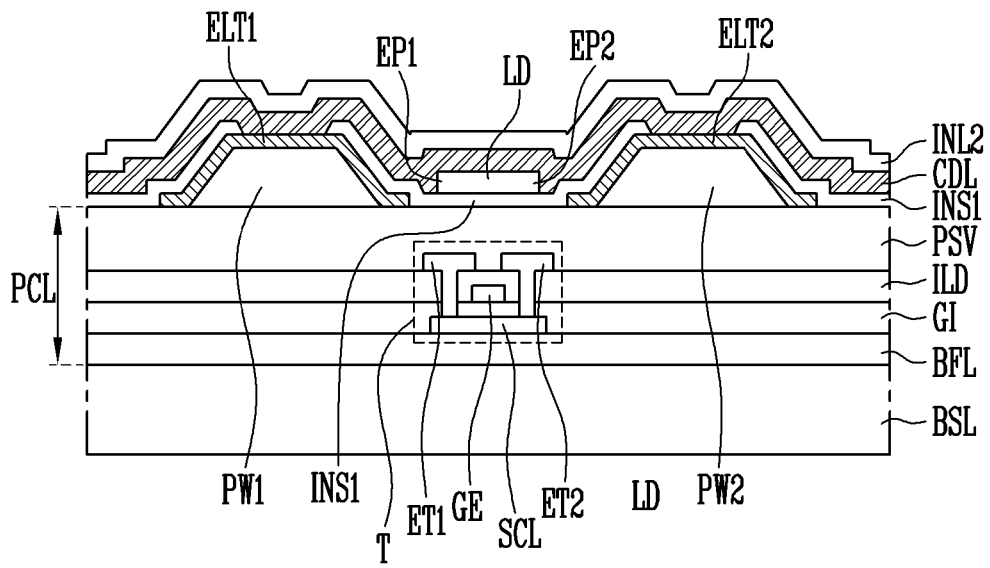

Referring to FIG. 23C, a conductive material layer CDL and the second insulating material layer INL2 may be successively formed on the base layer BSL on which the first and second electrodes ELT1 and ELT2, the light emitting elements LD are disposed. In an embodiment, the conductive material layer CDL may be formed by a deposition process of a conductive layer including at least one conductive material and may be formed by various methods. For example, the conductive material layer CDL may be formed by a deposition process of a conductive layer including at least one transparent conductive material such as IZO or ITO. In an embodiment, the second insulating material layer INL2 may be formed by a deposition process of an insulating layer including at least one inorganic insulating material.

Figure 23D:
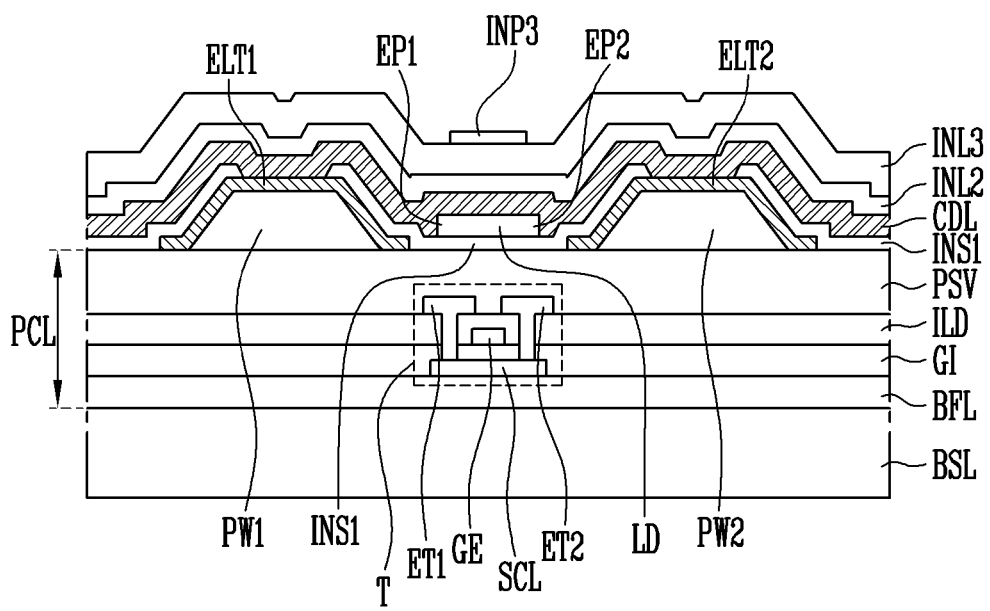

Referring to FIG. 23D, the third insulating material layer INL3 and the third insulating pattern INP3 may be successively formed on the base layer BSL on which the first and second electrodes ELT1 and ELT2, the light emitting elements LD, the conductive material layer CDL, and the second insulating material layer INL2 are disposed. In an embodiment, the third insulating material layer INL3 may be formed by a deposition process of an insulating layer including at least one organic insulating material and/or photoresist material. In an embodiment, the third insulating pattern INP3 may be formed by a deposition process of an insulating layer including at least one inorganic insulating material and a patterning process thereof.

Figure 23E:
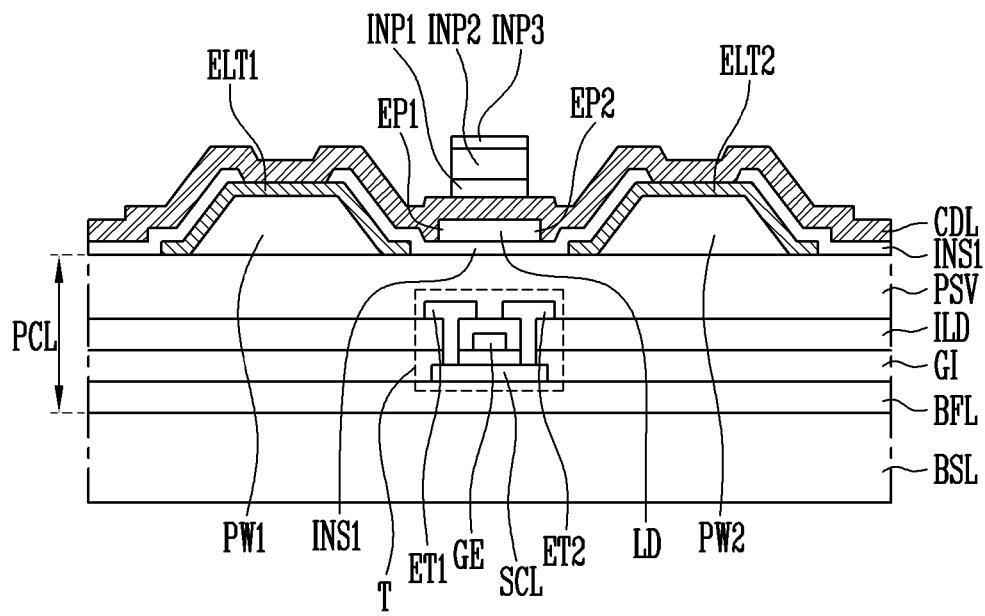

Referring to FIG. 23E, the first and second insulating patterns INP1 and INP2 may be formed by etching the second and third insulating material layers INL2 and INL3 using the third insulating pattern INP3 as a mask. For example, the first and second insulating patterns INP1 and INP2 may be formed by a dry etching process using the third insulating pattern INP3 as a mask.

Figure 23F:
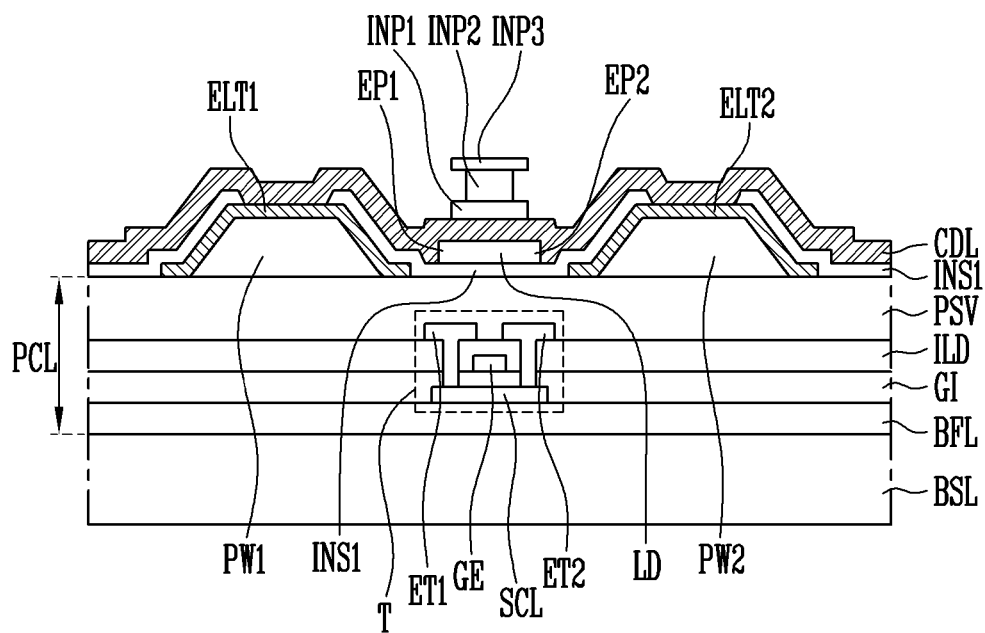

Referring to FIG. 23F, a portion (e.g., a sidewall) of the second insulating pattern INP2 may be additionally etched so that the width of the second insulating pattern INP2 is less than that of the first and third insulating patterns INP1 and INP3. For example, an exposed portion of the second insulating pattern INP2 may be selectively etched by an additional ashing process using oxygen ($O_2$) gas or the like.

Figure 23G:
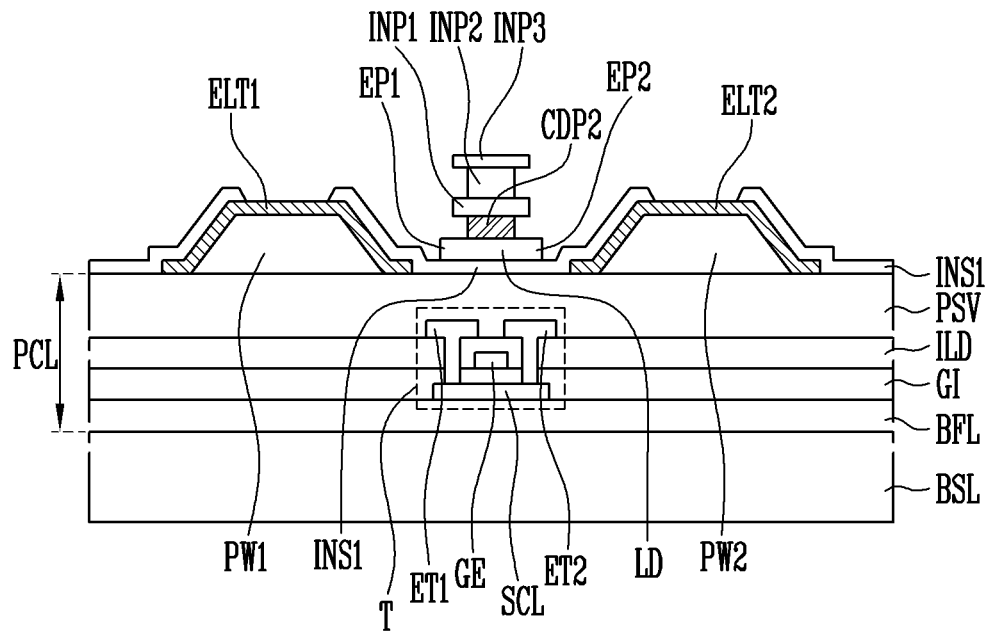

Referring to FIG. 23G, the second conductive pattern CDP2 may be formed by etching the conductive material layer CDL by a wet etching process using the first to third insulating patterns INP1, INP2, and INP3 as a mask. In an embodiment, the conductive material layer CDL may be etched by adjusting a selective etch ratio such that the second conductive pattern CDP2 has a width less than that of the first insulating pattern INP1 disposed thereover. For example, during a subsequent process of forming a conductive layer to form the first and second contact electrodes CNE1 and CNE2, the second conductive pattern CDP2 may be over-etched such that the second conductive pattern CDP2 may be spaced apart from the first and second contact electrodes CNE1 and CNE2 by sufficient distances.

As the second conductive pattern CDP2 is formed by etching the conductive material layer CDL, the first and second ends EP1 and EP2 of the light emitting elements LD may be exposed. In other words, in the embodiment, the first and second ends EP1 and EP2 of the light emitting elements LD may be exposed by a wet etching process. Therefore, damage to the light emitting element LD which may occur when a dry etching process is performed to expose the first and second ends EP1 and EP2 of the light emitting elements LD may be prevented.

Figure 23H:
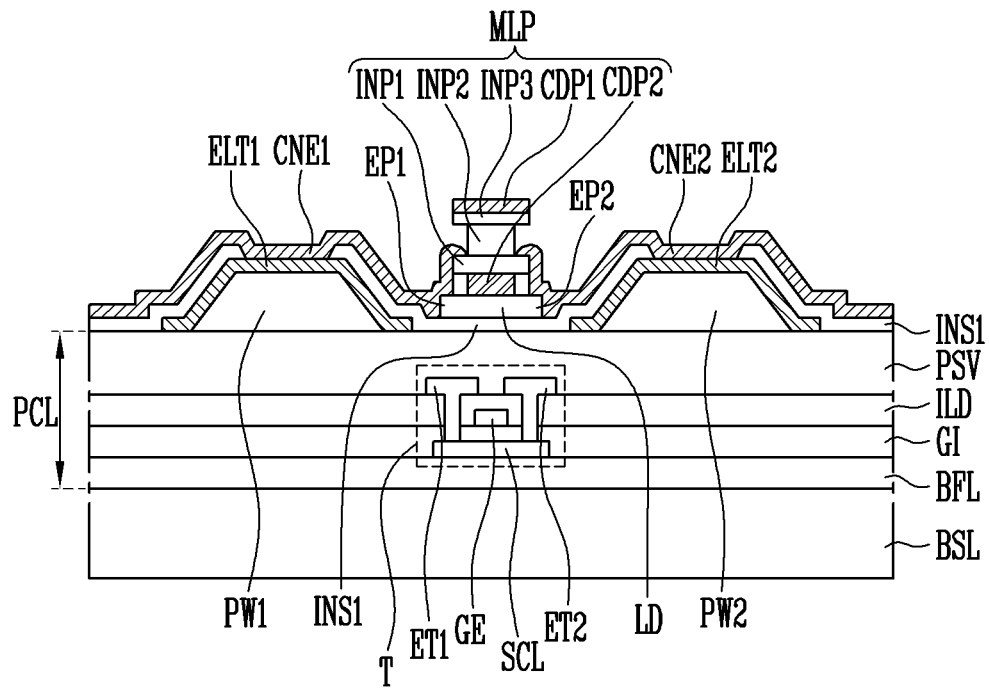

Referring to FIG. 23H, the first and second contact electrodes CNE1 and CNE2 and the first conductive pattern CDP1 may be formed by applying conductive material onto the base layer BSL on which the first and second electrodes ELT1 and ELT2, the light emitting elements LD, the second conductive pattern CDP2, the first to third insulating patterns INP1, INP2, and INP3 are disposed.

Figure 23I:
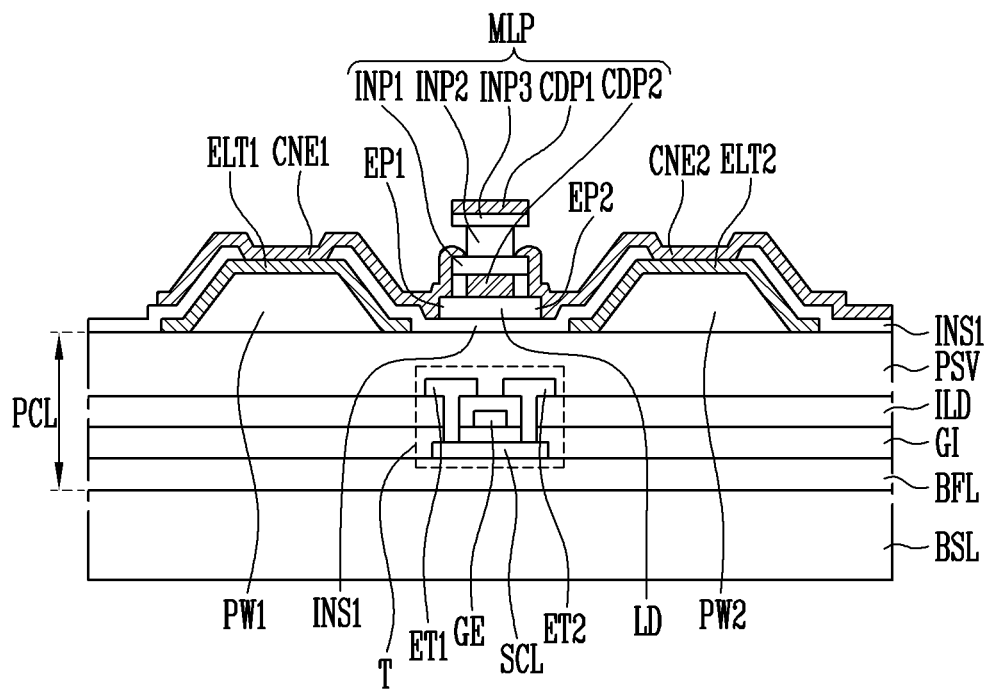

Referring to FIG. 23I, after a conductive layer for forming the first and second contact electrodes CNE1 and CNE2 is deposited, a mask process for forming the first and/or second contact electrodes CNE1 and/or CNE2 with predetermined shapes and/or sizes at desired positions may be further performed. For example, as described in the embodiments of FIGS. 6 to 9, in case that two first electrodes ELT1 are disposed on the sides of each pixel area, a mask process for removing the conductive layer applied to a peripheral area of the first electrodes ELT1 may be selectively performed. Therefore, each first contact electrode CNE1 may be formed to have a desired shape and/or size.

Thereafter, the second insulating layer INS2 may be formed over the first and second contact electrodes CNE1 and CNE2 and the multilayer pattern MLP. As a result, the pixel PXL according to the embodiment of FIG. 19 and the display device including the pixel PXL may be fabricated.

Figure 23J:
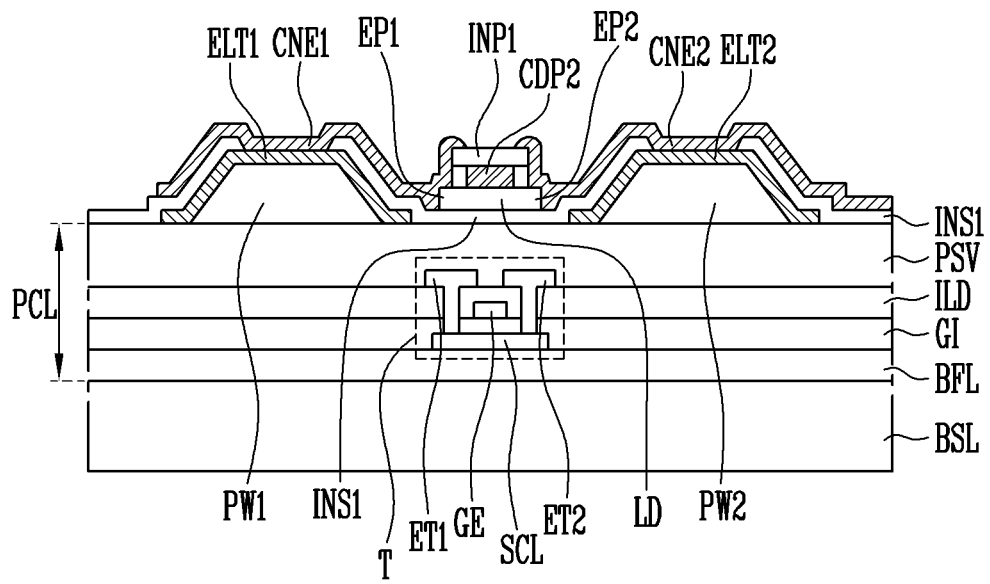

In an embodiment, as illustrated in FIG. 23J, after the first and second contact electrodes CNE1 and CNE2 are formed, an additional peel-off process for removing at least a portion of the multilayer pattern MLP may be performed. For example, after the first and second contact electrodes CNE1 and CNE2 and the first conductive pattern CDP1 are formed, an additional process of removing the second and third insulating patterns INP2 and INP3 and the first conductive pattern CDP1 may be performed. Thereafter, a passivation layer may be formed by forming the second insulating layer INS2 on the first and second contact electrodes CNE1 and CNE2.

FIGS. 24A to 24J are schematic cross-sectional views sequentially illustrating a method of fabricating a display device in accordance with an embodiment, and for example illustrate an embodiment of a method of fabricating a display device including the pixel PXL according to the embodiment of FIG. 22.

In the description of the embodiment of the fabricating method of FIGS. 24A to 24J, like reference numerals will be used to designate components similar or identical to those of the previous embodiments, and detailed descriptions thereof will be omitted.

Figure 24A:
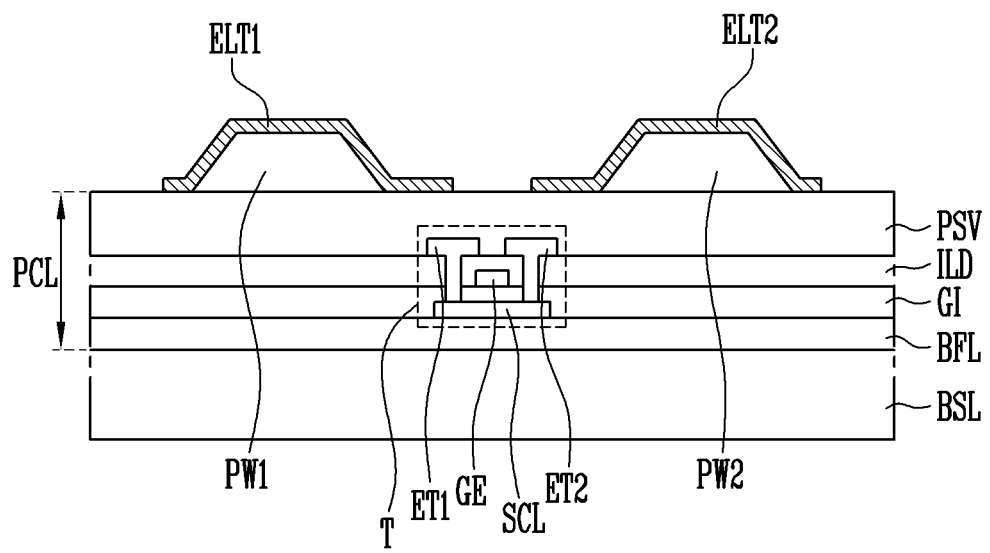
FIGS. 24A to 24J are cross-sectional views schematically and sequentially illustrating a method of fabricating a display device in accordance with an embodiment of the disclosure.

Referring to FIG. 24A, the first and second partition walls PW1 and PW2 may be formed on a surface of the base layer BSL at positions spaced apart from each other, and the first and second electrodes ELT1 and ELT2 may be respectively formed on the first and second partition walls PW1 and PW2.

Figure 24B:
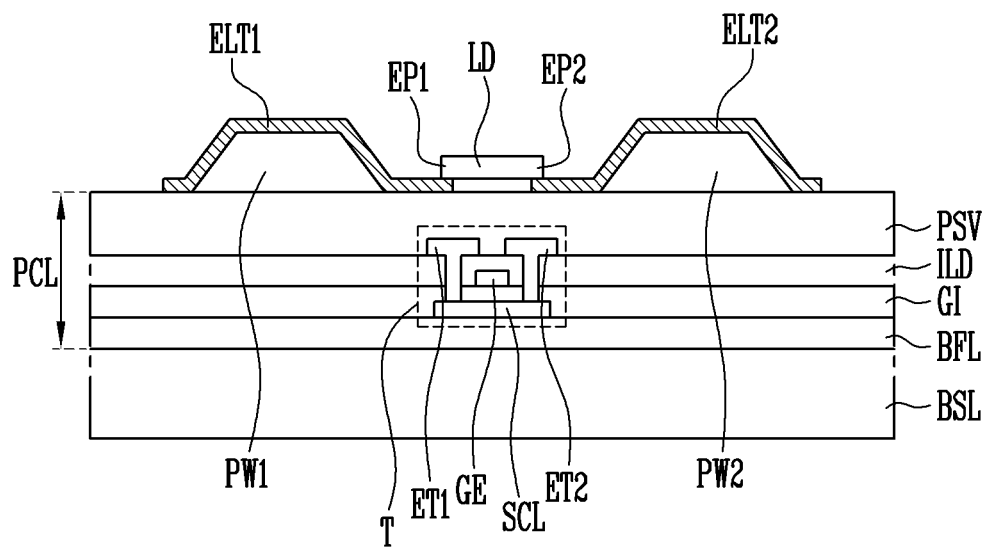

Referring to FIG. 24B, light emitting elements LD may be supplied onto the base layer BSL on which the first and second electrodes ELT1 and ELT2 are formed. The light emitting elements LD may be aligned between the first and second electrodes ELT1 and ELT2.

Figure 24C:
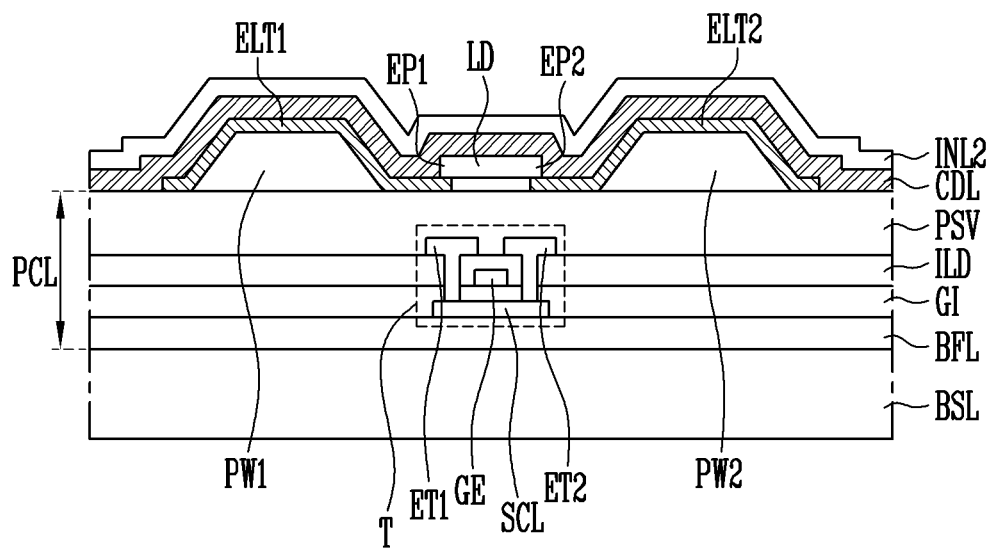

Referring to FIG. 24C, the conductive material layer CDL and the second insulating material layer INL2 may be successively formed on the base layer BSL on which the first and second electrodes ELT1 and ELT2, the light emitting elements LD are disposed.

Figure 24D:
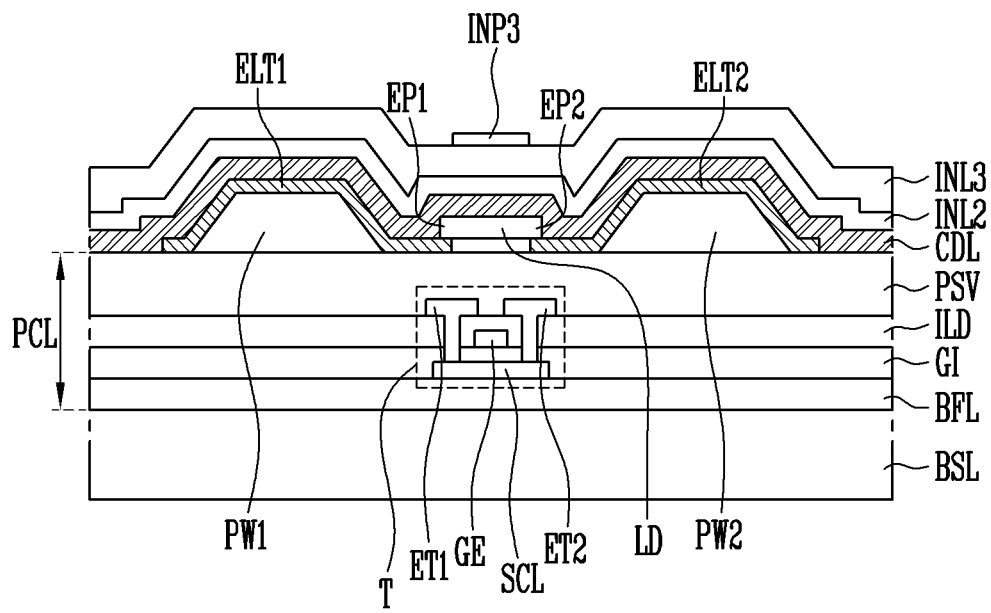

Referring to FIG. 24D, the third insulating material layer INL3 and the third insulating pattern INP3 may be successively formed on the base layer BSL on which the first and second electrodes ELT1 and ELT2, the light emitting elements LD, the conductive material layer CDL, and the second insulating material layer INL2 are disposed.

Figure 24E:
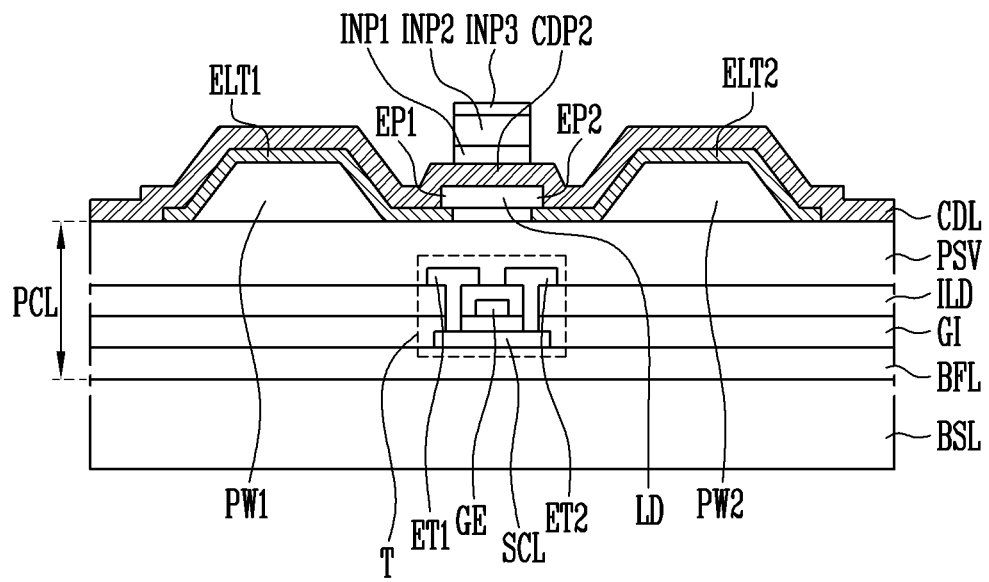

Referring to FIG. 24E, the first and second insulating patterns INP1 and INP2 may be formed by etching the second and third insulating material layers INL2 and INL3 using the third insulating pattern INP3 as a mask. For example, the first and second insulating patterns INP1 and INP2 may be formed by a dry etching process using the third insulating pattern INP3 as a mask.

Figure 24F:
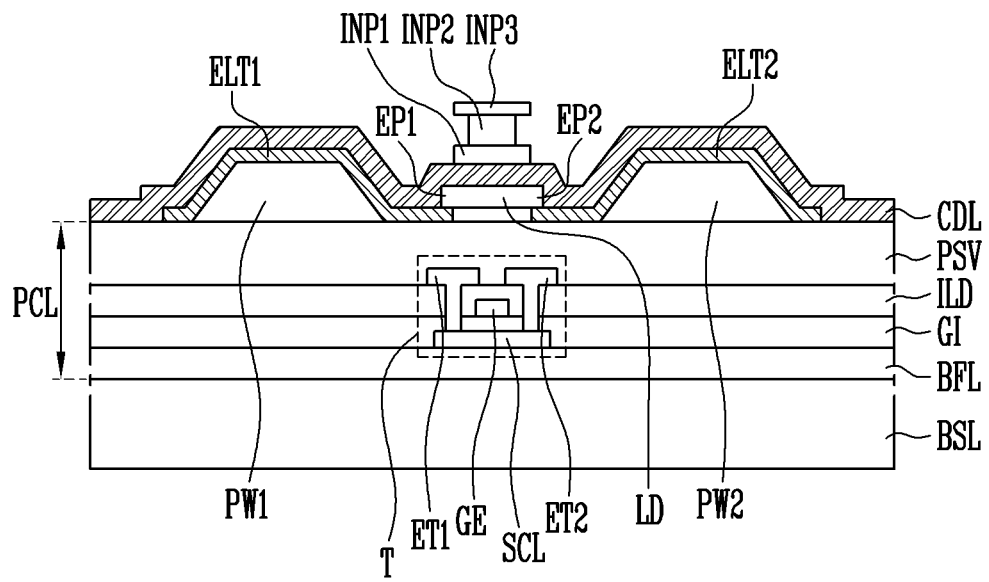

Referring to FIG. 24F, a portion (e.g., a sidewall) of the second insulating pattern INP2 may be additionally etched so that the width of the second insulating pattern INP2 is less than that of the first and third insulating patterns INP1 and INP3.

Figure 24G:
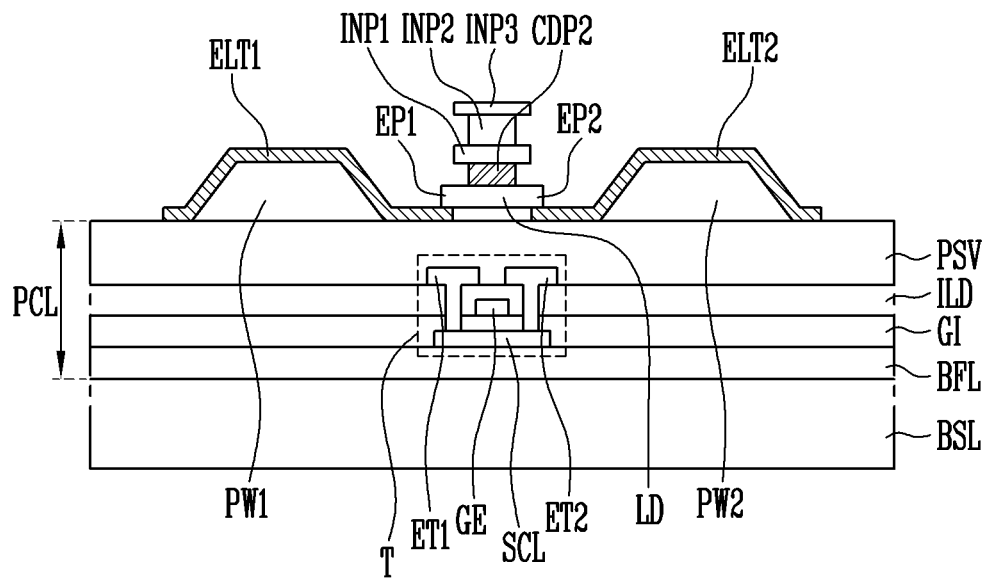

Referring to FIG. 24G, the second conductive pattern CDP2 may be formed by etching the conductive material layer CDL by a wet etching process using the first to third insulating patterns INP1, INP2, and INP3 as a mask. In an embodiment, the second conductive pattern CDP2 may be over-etched such that the second conductive pattern CDP2 may be spaced apart by sufficient distances from the first and second contact electrodes CNE1 and CNE2 to be formed by a subsequent process. For example, the second conductive pattern CDP2 may be over-etched such that the second conductive pattern CDP2 has a width less than that of the first insulating pattern INP1 provided thereover.

Figure 24H:
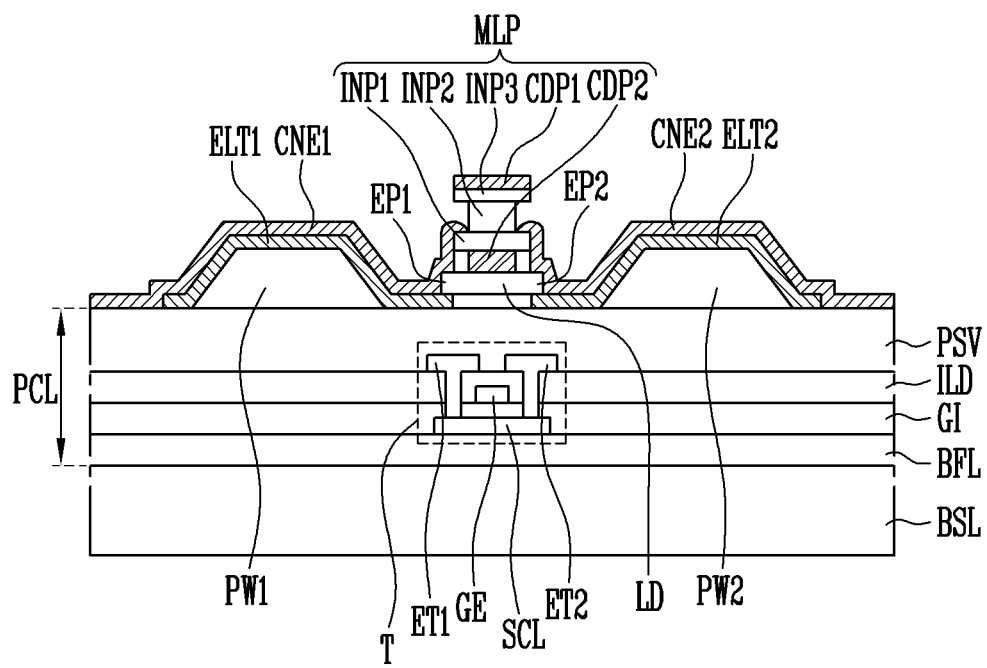

Referring to FIG. 24H, the first and second contact electrodes CNE1 and CNE2 and the first conductive pattern CDP1 may be formed by applying conductive material onto the base layer BSL on which the first and second electrodes ELT1 and ELT2, the light emitting elements LD, the second conductive pattern CDP2, the first to third insulating patterns INP1, INP2, and INP3 are disposed.

Figure 24I:
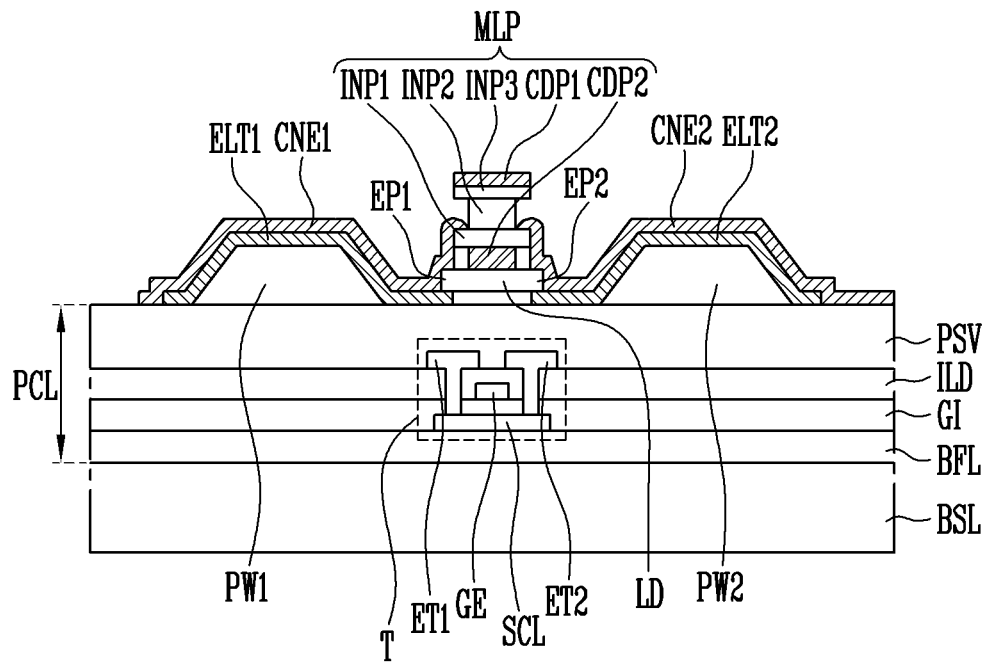

Referring to FIG. 24I, after a conductive layer for forming the first and second contact electrodes CNE1 and CNE2 is deposited, a mask process for forming the first and/or second contact electrodes CNE1 and/or CNE2 with predetermined shapes and/or sizes at desired positions may be further performed.

Thereafter, the second insulating layer INS2 may be formed over the first and second contact electrodes CNE1 and CNE2 and the multilayer pattern MLP. As a result, the pixel PXL according to the embodiment of FIG. 22 and the display device including the pixel PXL may be fabricated.

Figure 24J:
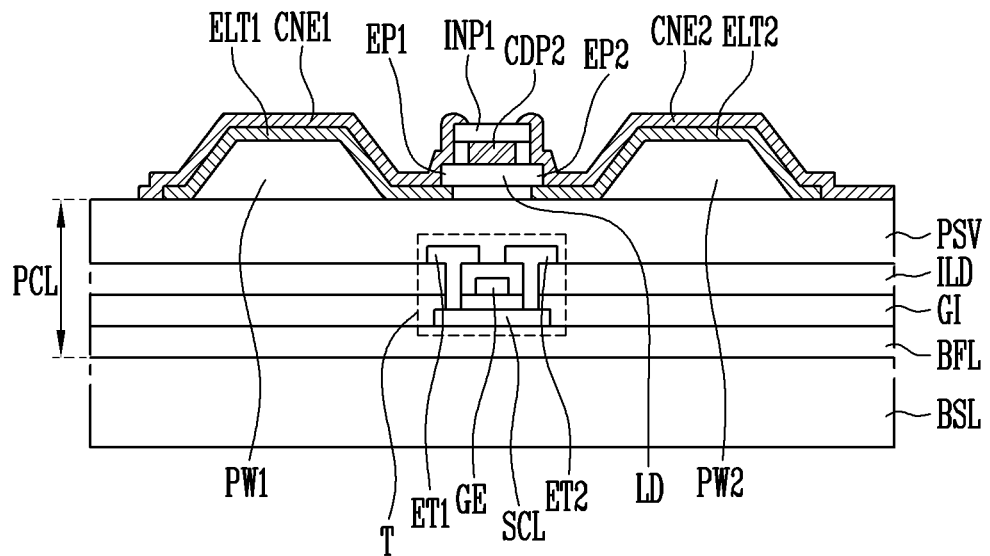

In an embodiment, as illustrated in FIG. 24J, after the first and second contact electrodes CNE1 and CNE2 are formed, an additional peel-off process for removing the second and third insulating patterns INP2 and INP3 and/or the first conductive pattern CDP1 may be performed. Thereafter, the second insulating layer INS2 may be formed over the first and second contact electrodes CNE1 and CNE2.

While the scope of the disclosure is described by detailed embodiments, it should be noted that the above-described embodiments are merely descriptive and should not be considered limiting. It should be understood by those skilled in the art that various changes, substitutions, and alternations may be made herein without departing from the scope of the claimed invention as defined by the following claims.

The scope of the claimed invention is not limited by detailed descriptions of the specification and should be defined by the accompanying claims. Furthermore, all changes or modifications of the claimed invention derived from the meanings and scope of the claims, and equivalents thereof should be construed as being included in the scope of the disclosure.

What is claimed is:
1. A display device comprising:
a pixel disposed in a display area,
wherein the pixel comprises:
  a first electrode and a second electrode spaced apart from each other;
  a light emitting element disposed between the first electrode and the second electrode;
  a first insulating pattern disposed on the light emitting element such that a first end and a second end of the light emitting element are exposed;
  a second insulating pattern having a width less than a width of the first insulating pattern, and disposed on the first insulating pattern such that ends of the first insulating pattern are exposed;
  a third insulating pattern having a width greater than the width of the second insulating pattern, disposed on the second insulating pattern, and overlapping ends of the second insulating pattern in a plan view;
  a first contact electrode disposed on the first end of the light emitting element, and electrically connecting the first end of the light emitting element to the first electrode; and a second contact electrode disposed on the second end of the light emitting element, and electrically connecting the second end of the light emitting element to the second electrode.

2. The display device according to claim 1, wherein the pixel comprises a first conductive pattern disposed on the third insulating pattern and separated from the first and the second contact electrodes.

3. The display device according to claim 2, wherein the first conductive pattern includes a material identical to a material included in the first and the second contact electrodes.

4. The display device according to claim 1, wherein
the first and the second contact electrodes include ends, respectively, that are respectively disposed on different ends of the first insulating pattern,
the second insulating pattern is disposed between the ends of the first and the second contact electrodes, and
the ends of the first and the second contact electrodes have thicknesses that gradually increase toward the first and the second electrodes, repectively, on the first insulating pattern.

5. The display device according to claim 1,
wherein
the first contact electrode is disposed on the first end of the light emitting element and at least a portion of the first electrode,
the second contact electrode is disposed on the second end of the light emitting element and at least a portion of the second electrode, and
the first and the second contact electrodes are disposed on a same layer.

6. The display device according to claim 1, wherein
each of the first and the third insulating patterns includes at least one inorganic insulating layer, and
the second insulating pattern includes at least one organic insulating layer.

7. The display device according to claim 6, wherein the second insulating pattern has a thickness greater than a thickness of each of the first and the third insulating patterns.

8. The display device according to claim 1, wherein, in a plan view, the ends of the second insulating pattern are respectively spaced apart from the ends of the first insulating pattern by a distance greater than two times a thickness of the first contact electrode or a thickness of the second contact electrode.

9. The display device according to claim 1, wherein
the light emitting element has a length greater than a width of each of the first to the third insulating patterns,
the light emitting element is horizontally disposed between the first and the second electrodes, and
the first and the second ends of the light emitting element are respectively disposed on ends of the light emitting element in a longitudinal direction of the light emitting element.

10. The display device according to claim 1,
wherein
the pixel comprises a second conductive pattern disposed between the light emitting element and the first insulating pattern, and
in a plan view, the second conductive pattern has a width less than a width of the first insulating pattern, is disposed inside the first insulating pattern, and is separated from the first and the second contact electrodes.

11. The display device according to claim 10, wherein the second conductive pattern includes a conductive material which is removed by a wet-etching process.

12. The display device according to claim 10, wherein the second conductive pattern includes a transparent conductive material.

13. A display device comprising:
a pixel disposed in a display area, wherein
the pixel comprises:
a first electrode and a second electrode spaced apart from each other;
a light emitting element disposed between the first electrode and the second electrode;
a first insulating pattern disposed on the light emitting element such that a first end and a second end of the light emitting element are exposed;
a first contact electrode disposed on the first end of the light emitting element, and electrically connecting the first end of the light emitting element to the first electrode; and
a second contact electrode disposed on the second end of the light emitting element, and electrically connecting the second end of the light emitting element to the second electrode,
the first and the second contact electrodes include ends, respectively, that are respectively disposed on different ends of the first insulating pattern and spaced apart from each other, and
the ends of the first and the second contact electrodes have thicknesses that gradually increase toward the first and the second electrodes, respectively, on the first insulating pattern.

14. The display device according to claim 13, wherein
the first and the second contact electrodes are disposed on a same layer and face each other, and
the light emitting element is disposed between the first and the second contact electrodes.

15. The display device according to claim 13, wherein
the pixel comprises a conductive pattern disposed between the light emitting element and the first insulating pattern, and
in a plan view, the conductive pattern has a width less than a width of the first insulating pattern, is disposed inside the first insulating pattern, and is separated from the first and the second contact electrodes.

16. The display device according to claim 15, wherein the conductive pattern includes a conductive material which is removed by a wet etching process.

17. The display device according to claim 15, wherein the conductive pattern includes a transparent conductive material.

18. A method of fabricating a display device, comprising:
forming first and second electrodes spaced apart from each other on a base layer;
supplying a light emitting element onto the base layer;
aligning the light emitting element between the first and the second electrodes;
forming a plurality of insulating material layers on the base layer on which the first and the second electrodes and the light emitting element are disposed;
forming a third insulating pattern on the plurality of insulating material layers such that the third insulating pattern overlaps the light emitting element other than first and second ends of the light emitting element;
forming first and second insulating patterns between the light emitting element and the third insulating pattern by etching the plurality of insulating material layers using the third insulating pattern as a mask;

etching a portion of the second insulating pattern such that the second insulating pattern has a width less than a width of each of the first and third insulating patterns; and forming a first contact electrode and a second contact electrode by applying a conductive material onto the base layer on which the first and the second electrodes, the light emitting element, and the first to the third insulating patterns are disposed, the first and second contact electrodes electrically connecting the first and the second ends of the light emitting element to the first and the second electrodes, respectively.

19. The method according to claim 18, further comprising:

before the forming of the plurality of insulating material layers, forming a conductive material layer on the base layer on which the first and the second electrodes and the light emitting element are disposed; and after the forming of the first to the third insulating patterns, forming a conductive pattern having a width less than the width of the first insulating pattern by wet-etching the conductive material layer using the first to the third insulating patterns as a mask.

20. The method according to claim 18, further comprising, after the forming of the first and the second contact electrodes, removing the second and the third insulating patterns.

\* \* \* \* \*